(12) United States Patent
Anryu et al.

(10) Patent No.: US 8,922,109 B2
(45) Date of Patent: Dec. 30, 2014

(54) LIGHT EMITTING MATERIAL, INK COMPOSITION, THIN FILM, LIGHT EMITTING DEVICE AND METHOD FOR MANUFACTURING LIGHT EMITTING DEVICE

(75) Inventors: Makoto Anryu, Tsukuba (JP); Kohei Asada, Tsukuba (JP); Shigeru Sasaki, Tsukuba (JP); Takeshi Yamada, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 291 days.

(21) Appl. No.: 13/575,860

(22) PCT Filed: Jan. 28, 2011

(86) PCT No.: PCT/JP2011/051779
§ 371 (c)(1),
(2), (4) Date: Oct. 19, 2012

(87) PCT Pub. No.: WO2011/093460
PCT Pub. Date: Aug. 4, 2011

(65) Prior Publication Data
US 2013/0049571 A1 Feb. 28, 2013

(30) Foreign Application Priority Data

Jan. 29, 2010 (JP) .................................. 2010-017653

(51) Int. Cl.
*H01L 51/50* (2006.01)
(Continued)

(52) U.S. Cl.
CPC .... *H01L 51/0043* (2013.01); *C08G 2261/5222* (2013.01); *C09K 11/06* (2013.01);
(Continued)

(58) Field of Classification Search
None
See application file for complete search history.

(56) References Cited

U.S. PATENT DOCUMENTS

| 4,769,292 A | 9/1988 | Tang et al. |
| 5,597,890 A * | 1/1997 | Jenekhe .................. 528/377 |

(Continued)

FOREIGN PATENT DOCUMENTS

| CN | 101402648 A | 4/2009 |
| CN | 101595080 A | 12/2009 |

(Continued)

OTHER PUBLICATIONS

International Search Report of PCT/JP2011/051779 dated Apr. 26, 2011.

(Continued)

*Primary Examiner* — Ashok Patel
(74) *Attorney, Agent, or Firm* — Sughrue Mion, PLLC

(57) ABSTRACT

A light emitting material included in a light emitting device. The light emitting material includes a conjugated polymer having a conjugated part and a blue light emitting compound having a blue light emitting part and satisfies the following formula $y \geq \log_{10}(5.1 \times x^{0.2}+1)$, wherein y represents the amount of light emitted by the blue light emitting compound where the total amount of light emitted by the conjugated polymer and the blue light emitting compound in the light emitting material due to excitation caused by light having a wavelength of 370 nm is 1, and provided that the gram light absorption coefficient of the conjugated polymer and the blue light emitting compound in the light emitting material are expressed by $\epsilon_1$ and $\epsilon_2$, and further the content of the blue light emitting compound is expressed by $P_2$ (parts by mass) where the total content of the conjugated polymer and the blue light emitting compound in the light emitting material is 100 parts by mass, x is defined by the formula: $X=(\epsilon_2/\epsilon_1) \times P_2$ corresponds to x.

14 Claims, 1 Drawing Sheet

(51) Int. Cl.
*H01J 9/00* (2006.01)
*C09K 11/06* (2006.01)
*C09D 11/00* (2014.01)
*C08G 61/12* (2006.01)
*H01L 51/00* (2006.01)
*C08L 65/00* (2006.01)
*H05B 33/14* (2006.01)

(52) U.S. Cl.
CPC ............. C09D 11/00 (2013.01); *H01L 51/5012* (2013.01); *C08G 2261/5242* (2013.01); C08G 61/12 (2013.01); *C08G 2261/3142* (2013.01); H01L 51/0058 (2013.01); *C08G 2261/411* (2013.01); *H01L 51/0039* (2013.01); *C08G 2261/3162* (2013.01); C08L 65/00 (2013.01); H05B 33/14 (2013.01); H01L 51/0055 (2013.01); *Y10S 428/917* (2013.01)
USPC ...... 313/498; 252/301.16; 428/917; 428/690; 313/504; 445/23

(56) References Cited

U.S. PATENT DOCUMENTS

| | | | |
|---|---|---|---|
| 5,814,833 A * | 9/1998 | Jenekhe | 257/40 |
| 6,355,773 B1 | 3/2002 | Weinfurtner et al. | |
| 2004/0079924 A1 | 4/2004 | Kwag et al. | |
| 2007/0111027 A1 * | 5/2007 | Chen et al. | 428/690 |
| 2009/0015144 A1 | 1/2009 | Takashima et al. | |
| 2009/0302748 A1 | 12/2009 | Nakatani et al. | |

FOREIGN PATENT DOCUMENTS

| | | |
|---|---|---|
| JP | 05-029078 A | 2/1993 |
| JP | 06-342690 A | 12/1994 |
| JP | 2004143426 A | 5/2004 |
| JP | 2008-056909 A | 3/2008 |
| TW | 384295 B | 3/2000 |
| TW | 200813111 A | 3/2008 |
| TW | 200838976 A | 10/2008 |
| WO | 99/54385 A1 | 10/1999 |
| WO | 2008/059713 A1 | 5/2008 |

OTHER PUBLICATIONS

First Office Action issued Sep. 4, 2014 in corresponding Chinese Patent Application No. 201180007537.5 with English translation.

Office Action issued Sep. 19, 2014 in corresponding Taiwanese Patent Application No. 100103575 with English translation.

Notification of Reason(s) for Refusal issued Sep. 30, 2014 in corresponding Japanese Patent Application No. 2011-016773 with English translation.

* cited by examiner

LIGHT EMITTING MATERIAL, INK COMPOSITION, THIN FILM, LIGHT EMITTING DEVICE AND METHOD FOR MANUFACTURING LIGHT EMITTING DEVICE

CROSS REFERENCE TO RELATED APPLICATIONS

This application is a National Stage of International Application No. PCT/JP2011/051779 filed Jan. 28, 2011, claiming priority based on Japanese Patent Application No. 2010-017653 filed Jan. 29, 2010, the contents of all of which are incorporated herein by reference in their entirety.

TECHNICAL FIELD

The present invention relates to a light emitting material, an ink composition, a thin film, a light emitting device and a method for manufacturing a light emitting device.

BACKGROUND ART

In recent years, an organic EL display using an organic electroluminescence (EL) device has been attracting attention as a next-generation display. This organic EL device has organic layers such as a light emitting layer and a charge transport layer. The organic EL device may be made of a small molecule organic material, a polymeric organic material, or a composition containing both the organic materials. The use of the polymeric organic material as a principal material is advantageous when producing a large display or the like because a homogenous film can be formed when a coating method such as ink-jetting, spin coating or the like is used (Patent Document 1 and Patent Document 2).

BACKGROUND ART DOCUMENTS

Patent Documents

Patent Document 1: Japanese Patent Laid-open Publication No. 2008-56909
Patent Document 2: International Patent Publication WO 99/54385

SUMMARY OF THE INVENTION

Problems to be Solved by the Invention

However, when a conventional polymer material, particularly a material emitting light in blue, is used for a light emitting device or the like, the light emitting device does not have an adequate luminous lifetime.

Thus, it is an object of the present invention to provide a light emitting material that can improve the luminous lifetime of a light emitting device (e.g. an organic electroluminescence device) by being included in a light emitting layer of the light emitting device. It is another object of the present invention to provide an ink composition containing the light emitting material, a thin film made of the light emitting material, and a light emitting device having a light emitting layer made of the thin film. It is still another object of the present invention to provide a method for manufacturing a light emitting device, the luminous lifetime of which is improved.

Means for Solving the Problems

That is, the present invention provides a light emitting material characterized in that the material comprises a conjugated polymer having a conjugated part and a blue light emitting compound having a blue light emitting part and satisfies the following formula (1):

[Mathematical Formula 1]

$$y \geq \log_{10}(5.1 \times x^{0.2} + 1) \quad (1)$$

wherein y represents the amount of light emitted by the blue light emitting compound where the total amount of light emitted by the conjugated polymer and the blue light emitting compound in the light emitting material due to excitation caused by light having a wavelength of 370 nm is 1, and provided that the gram light absorption coefficient of the conjugated polymer and the blue light emitting compound in the light emitting material are expressed by $\epsilon_1$ and $\epsilon_2$, and further the content of the blue light emitting compound is expressed by $P_2$ (parts by mass) where the total content of the conjugated polymer and the blue light emitting compound in the light emitting material is 100 parts by mass, x is defined by the formula:

[Mathematical Formula 2]

$$x = (\epsilon_2/\epsilon_1) \times P_2.$$

The light emitting material according to the present invention comprises a conjugated part as a part engaged in charge transportation and binding of electrons and holes and a blue light emitting part as a part engaged in light emission. With the light emitting material according to the present invention, by having the above-mentioned configuration, the blue light emitting part can efficiently receive excitation energy formed by holes and electrons bound in the conjugated part. Thus, a light emitting device comprising a light emitting layer containing the light emitting material has an improved luminous lifetime.

The present invention further provides a light emitting material characterized in that the material comprises a conjugated polymer having a conjugated part and a blue light emitting part and satisfies the following formula (1):

[Mathematical Formula 3]

$$y \geq \log_{10}(5.1 \times x^{0.2} + 1) \quad (1)$$

wherein y represents the amount of light emitted by the blue light emitting part where the total amount of light emitted by the conjugated part and the blue light emitting part in the light emitting material due to excitation caused by light having a wavelength of 370 nm is 1, and provided that the gram light absorption coefficient of the conjugated part and the blue light emitting part in the light emitting material are expressed by $\epsilon_1$ and $\epsilon_2$, and further the content of the blue light emitting part is expressed by $P_2$ (parts by mass) where the total content of the conjugated part and the blue light emitting part in the light emitting material is 100 parts by mass, x is defined by the formula:

[Mathematical Formula 4]

$$x = (\epsilon_2/\epsilon^1) \times P_2.$$

In the light emitting material according to the present invention, y is preferably 0.7 or more. Such a light emitting material has a reduced amount of light emission from the conjugated part and is excellent in color tone of blue light emission.

Also, in the light emitting material according to the present invention, x is preferably 1.0 or less. With such a light emitting material, blue light emission can be induced in high light emitting efficiency with a small blue light emitting part.

Also, in the light emitting material according to the present invention, the conjugated part is preferably a bivalent aromatic amine residue. Such a light emitting material is more suitable as a material constituting the light emitting layer of the light emitting device, and by including the light emitting material in the light emitting layer, the light emitting efficiency and luminous lifetime of the light emitting device can be further improved.

Also, in the light emitting material according to the present invention, the conjugated part is preferably a fluorenediyl group. The light emitting material having such a conjugated part is excellent in light emitting efficiency, and therefore, with the light emitting material, a light emitting device further excellent in light emitting efficiency can be obtained.

In the light emitting material according to the present invention, the blue light emitting compound may have a molecular weight of 5000 or less.

Also, in the light emitting material according to the present invention, the blue light emitting part preferably has a fused polycyclic aromatic hydrocarbon structure. Such a blue light emitting part is excellent in light emitting efficiency, and therefore, with the light emitting material including the blue light emitting part, a light emitting device excellent in light emitting efficiency can be obtained.

Also, in the light emitting material according to the present invention, the content ratio of the blue light emitting part to the total content of the conjugated part and the blue light emitting part is preferably 0.1 to 10% by mass. Such a light emitting material easily suppresses concentration quenching of light emitted from the blue light emitting part.

Further, in the light emitting material according to the present invention, the relationship between the peak wavelength ($\lambda_1$) of a light emission peak at the shortest wavelength side among light emission peaks in a wavelength range of 350 nm to 500 nm in the blue light emitting compound and the peak wavelength ($\lambda_2$) of a light emission peak at the shortest wavelength side among light emission peaks in a wavelength range of 350 nm to 500 nm in the conjugated polymer preferably meets $\lambda_2 - \lambda_1 \leq 50$ nm. With such a light emitting material, the blue light emitting part can further efficiently receive excitation energy formed by holes and electrons bound in the conjugated part. Thus, a light emitting device comprising a light emitting layer containing the light emitting material is further excellent in light emitting efficiency and luminous lifetime.

The present invention also provides an ink composition containing the light emitting material. The ink composition according to the present invention can be applied in a desired form by, for example, an inkjet printing method or the like. Thus, with the ink composition according to the present invention, a thin film comprising the light emitting material can be easily manufactured in a desired form.

The present invention also provides a thin film made of the light emitting material. The thin film according to the present invention is made of the light emitting material, and therefore is suitable as a light emitting layer of a light emitting device, and a light emitting device comprising the thin film according to the present invention as a light emitting layer has an improved luminous lifetime.

The present invention also provides a light emitting device that is a white light emitting device in which a plurality of light emitting layers including a blue light emitting layer are laminated, wherein the device comprises as the blue light emitting layer a light emitting layer made of the thin film. Such a light emitting device comprises as a light emitting layer a thin film made of the light emitting material, and therefore is excellent in light emitting efficiency and luminous lifetime. Examples of such a light emitting device include an organic electroluminescence device.

The present invention further provides a method for manufacturing a light emitting device with an improved luminous lifetime, wherein the method comprises making a light emitting layer in the light emitting device to contain a light emitting material that comprises a conjugated polymer having a conjugated part and a blue light emitting compound having a blue light emitting part and satisfies the following formula (1):

[Mathematical Formula 5]

$$y \geq \log_{10}(5.1 \times x^{0.2} + 1) \tag{1}$$

wherein y represents the amount of light emitted by the blue light emitting compound where the total amount of light emitted by the conjugated polymer and the blue light emitting compound in the light emitting material due to excitation caused by light having a wavelength of 370 nm is 1, and provided that the gram light absorption coefficient of the conjugated polymer and the blue light emitting compound in the light emitting material are expressed by $\epsilon_1$ and $\epsilon_2$, and further the content of the blue light emitting compound is expressed by $P_2$ (parts by mass) where the total content of the conjugated polymer and the blue light emitting compound in the light emitting material is 100 parts by mass, x is defined by the formula:

[Mathematical Formula 6]

$$x = (\epsilon_2/\epsilon_1) \times P_2.$$

Further, the aspect of the invention can also be understood as a method for improving the luminous lifetime of a light emitting device, characterized by including in a light emitting layer in the light emitting device a light emitting material comprising a conjugated polymer having a conjugated part and a blue light emitting compound having a blue light emitting part and satisfying the formula (1).

The aspect of the invention can also be understood as a method for selecting a light emitting material for obtaining a light emitting device excellent in luminous lifetime, wherein a light emitting material comprising a conjugated polymer having a conjugated part and a blue light emitting compound having a blue light emitting part and satisfying the formula (1) is selected as a light emitting material.

Effects of the Invention

According to the present invention, there can be provided a light emitting material that can be included in a light emitting layer of a light emitting device (e.g. an organic electroluminescence device) to improve the luminous lifetime of the light emitting device. Also, according to the present invention, there can be provided an ink composition containing the light emitting material, a thin film made of the light emitting material, and a light emitting device comprising a light emitting layer made of the thin film. Further, according to the present invention, there can be provided a method for manufacturing a light emitting device, the luminous lifetime of which is improved.

EMBODIMENTS OF THE INVENTION

Figure 1:
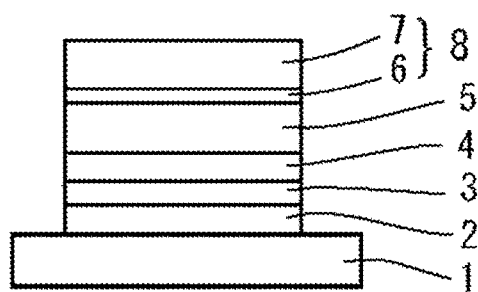
FIG. 1 is a schematic cross-sectional view showing a structure of an organic electroluminescence device (organic EL device) that is one embodiment of the present invention.

Hereinbelow, preferred embodiments of the present invention will be described in detail. Further, in the description below, a tert-butyl group is described as "t-Bu", and a phenyl group is described as "Ph" in some cases.

<Description of Terms>

Hereinbelow, terms that are used in common in the present description will be described with reference to specific examples as required.

Examples of a halogen atom include a fluorine atom, a chlorine atom, a bromine atom and an iodine atom.

The term "$C_x$-$C_y$" (x and y are integers satisfying x<y) means that the number of carbon atoms of a partial substructure corresponding to a functional group name described just after the term is x to y. That is, the term means that when an organic group described just after "$C_x$-$C_y$" is an organic group named in combination of a plurality of functional group names (e.g. a $C_x$-$C_y$ alkoxyphenyl group), the number of carbon atoms of a partial substructure corresponding to a functional group name (e.g. alkoxy) described just after "$C_x$-$C_y$" among the plurality of functional group names is x to y. For example, a "$C_1$-$C_{12}$ alkyl group" means an alkyl group having 1 to 12 carbon atoms, and a "$C_1$-$C_{12}$ alkoxyphenyl group" means a phenyl group having an "alkoxy group having 1 to 12 carbon atoms".

An alkyl group may have a substituent, and may be any of a linear alkyl group, a branched alkyl group and a cyclic alkyl group (cycloalkyl group). As the alkyl group, a linear alkyl group and a cyclic alkyl group are preferable, and an unsubstituted alkyl group and an alkyl group substituted with a halogen atom or the like are preferable.

Examples of the substituents include an alkyl group, an alkoxy group, an alkylthio group, an aryl group, an aryloxy group, an arylthio group, an alkenyl group, an alkynyl group, an amino group, a silyl group, a halogen atom, an acyl group, an acyloxy group, a monovalent heterocyclic group, a heterocyclic thio group, an imine residue, an amide group, an acid imide group, a carboxyl group, a nitro group, and a cyano group, and some or all of hydrogen atoms included in these groups may be substituted with fluorine atoms (hereinafter, when a "substituent" is mentioned, these are provided as examples thereof unless otherwise specified).

Examples of the alkyl group that may have a substituent include a methyl group, an ethyl group, a propyl group, an isopropyl group, a butyl group, an isobutyl group, a sec-butyl group, a tert-butyl group, a pentyl group, an isoamyl group, a hexyl group, a cyclohexyl group, a heptyl group, an octyl group, a 2-ethylhexyl group, a nonyl group, a decyl group, a 3,7-dimethyloctyl group, a dodecyl group, a trifluoromethyl group, a pentafluoroethyl group, a perfluorobutyl group, a perfluorohexyl group, and a perfluorooctyl group.

The number of carbon atoms of the alkyl group is preferably 1 to 20, more preferably 1 to 15, further preferably 1 to 12. Examples of the $C_1$-$C_{12}$ alkyl group include a methyl group, an ethyl group, a propyl group, an isopropyl group, a butyl group, an isobutyl group, a sec-butyl group, a tert-butyl group, a pentyl group, an isoamyl group, a hexyl group, a cyclohexyl group, a heptyl group, an octyl group, a nonyl group, a decyl group, and a dodecyl group.

An alkoxy group may have a substituent, and may be any of a linear alkoxy group, a branched alkoxy group and a cyclic alkoxy group (cycloalkoxy group). As the alkoxy group, a linear alkoxy group and a cyclic alkoxy group are preferable, and an unsubstituted alkoxy group and an alkoxy group substituted with a halogen atom, an alkoxy group or the like are preferable.

Examples of the alkoxy group that may have a substituent include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a dodecyloxy group, a trifluoromethoxy group, a pentafluoroethoxy group, a perfluorobutoxy group, a perfluorohexyloxy group, a perfluorooctyloxy group, a methoxymethyloxy group, and a 2-methoxyethyloxy group.

The number of carbon atoms of the alkoxy group is preferably 1 to 20, more preferably 1 to 15, further preferably 1 to 12. Examples of the $C_1$-$C_{12}$ alkoxy group include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, and a dodecyloxy group.

An alkylthio group may have a substituent, and may be any of a linear alkylthio group, a branched alkylthio group and a cyclic alkylthio group (cycloalkylthio group). As the alkylthio group, a linear alkylthio group and a cyclic alkylthio group are preferable, and an unsubstituted alkylthio group and an alkylthio group substituted with a halogen atom or the like are preferable.

Examples of the alkylthio group that may have a substituent include a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, a dodecylthio group, and a trifluoromethylthio group.

The number of carbon atoms of the alkylthio group is preferably 1 to 20, more preferably 1 to 15, further preferably 1 to 12. Examples of the $C_1$-$C_{12}$ alkylthio group include a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, and a dodecylthio group.

An aryl group is an atom group left after removing one of hydrogen atoms bound to carbon atoms constituting an aromatic ring from an aromatic hydrocarbon, and may have a substituent. As the aryl group, an unsubstituted aryl group and an aryl group substituted with a halogen atom, an alkoxy group, an alkyl group or the like are preferable. Examples of the aryl group include those having a benzene ring, those having a fused ring, and those with two or more of benzene rings and/or fused rings bound via a single bond or a bivalent organic group (e.g. an alkylene group such as a vinylene group). The number of carbon atoms of the aryl group is preferably 6 to 60, more preferably 6 to 48, further preferably 6 to 30.

Examples of the aryl group that may have a substituent include a phenyl group, a $C_1$-$C_{12}$ alkoxyphenyl group, a $C_1$-$C_{12}$ alkylphenyl group, a 1-naphthyl group, a 2-naphthyl group, a 1-anthracenyl group, a 2-anthracenyl group, a 9-anthracenyl group, a 2-fluorenyl group, a pentafluorophenyl group, a biphenylyl group, a $C_1$-$C_{12}$ alkoxybiphenylyl group, and a $C_1$-$C_{12}$ alkylbiphenylyl group, and particularly a phenyl group, a $C_1$-$C_{12}$ alkoxyphenyl group, a $C_1$-$C_{12}$ alkylphenyl group, a biphenylyl group, a $C_1$-$C_{12}$ alkoxybiphenylyl group and a $C_1$-$C_{12}$ alkylbiphenylyl group are preferable.

Examples of the $C_1$-$C_{12}$ alkoxyphenyl group include a methoxyphenyl group, an ethoxyphenyl group, a propyloxyphenyl group, an isopropyloxyphenyl group, a butyloxyphenyl group, an isobutyloxyphenyl group, a tert-butyloxyphenyl group, a pentyloxyphenyl group, a hexyloxyphenyl group, and an octyloxyphenyl group.

Examples of the $C_1$-$C_{12}$ alkylphenyl group include a methylphenyl group, an ethylphenyl group, a dimethylphenyl group, a propylphenyl group, a mesityl group, an isopropylphenyl group, a butylphenyl group, an isobutylphenyl group, a tert-butylphenyl group, a pentylphenyl group, an isoamylphenyl group, a hexylphenyl group, a heptylphenyl group, an octylphenyl group, a nonylphenyl group, a decylphenyl group, and a dodecylphenyl group.

An aryloxy group may have a substituent, and preferable are an unsubstituted aryloxy group and an aryloxy group substituted with a halogen atom, an alkoxy group, an alkyl group or the like. The number of carbon atoms of the aryloxy group is preferably 6 to 60, more preferably 6 to 48, further preferably 6 to 30.

Examples of the aryloxy group that may have a substituent include a phenoxy group, a $C_1$-$C_{12}$ alkoxyphenoxy group, a $C_1$-$C_{12}$ alkylphenoxy group, a 1-naphthyloxy group, a 2-naphthyloxy group, and a pentafluorophenyloxy group, and particularly a $C_1$-$C_{12}$ alkoxyphenoxy group and a $C_1$-$C_{12}$ alkylphenoxy group are preferable.

Examples of the $C_1$-$C_{12}$ alkoxyphenoxy group include a methoxyphenoxy group, an ethoxyphenoxy group, a propyloxyphenoxy group, an isopropyloxyphenoxy group, a butyloxyphenoxy group, an isobutyloxyphenoxy group, a tert-butyloxyphenoxy group, a pentyloxyphenoxy group, a hexyloxyphenoxy group, and an octyloxyphenoxy group.

Examples of the $C_1$-$C_{12}$ alkylphenoxy group include a methylphenoxy group, an ethylphenoxy group, a dimethylphenoxy group, a propylphenoxy group, a 1,3,5-trimethylphenoxy group, a methylethylphenoxy group, an isopropylphenoxy group, a butylphenoxy group, an isobutylphenoxy group, a sec-butylphenoxy group, a tert-butylphenoxy group, a pentylphenoxy group, an isoamylphenoxy group, a hexylphenoxy group, a heptylphenoxy group, an octylphenoxy group, a nonylphenoxy group, a decylphenoxy group, and a dodecylphenoxy group.

An arylthio group may have a substituent, and preferable are an unsubstituted arylthio group and an arylthio group substituted with a halogen atom, an alkoxy group, an alkyl group or the like. The number of carbon atoms of the arylthio group is preferably 6 to 60, more preferably 6 to 48, further preferably 6 to 30. Examples of the arylthio group that may have a substituent include a phenylthio group, a $C_1$-$C_{12}$ alkoxyphenylthio group, a $C_1$-$C_{12}$ alkylphenylthio group, a 1-naphthylthio group, a 2-naphthylthio group, and a pentafluorophenylthio group.

An arylalkyl group may have a substituent, and preferable are an unsubstituted arylalkyl group and an arylalkyl group substituted with a halogen atom, an alkoxy group, an alkyl group or the like. The number of carbon atoms of the arylalkyl group is preferably 7 to 60, more preferably 7 to 48, further preferably 7 to 30. Examples of the arylalkyl group that may have a substituent include a phenyl-$C_1$-$C_{12}$ alkyl group, a $C_1$-$C_{12}$ alkoxyphenyl-$C_1$-$C_{12}$ alkyl group, a $C_1$-$C_{12}$ alkylphenyl-$C_1$-$C_{12}$ alkyl group, a 1-naphthyl-$C_1$-$C_{12}$ alkyl group, and a 2-naphthyl-$C_1$-$C_{12}$ alkyl group.

An arylalkoxy group may have a substituent, and preferable are an unsubstituted arylalkoxy group and an arylalkoxy group substituted with a halogen atom, an alkoxy group, an alkyl group or the like. The number of carbon atoms of the arylalkoxy group is preferably 7 to 60, more preferably 7 to 48, further preferably 7 to 30. Examples of the arylalkoxy group that may have a substituent include a phenyl-$C_1$-$C_{12}$ alkoxy group, a $C_1$-$C_{12}$ alkoxyphenyl-$C_1$-$C_{12}$ alkoxy group, a $C_1$-$C_{12}$ alkylphenyl-$C_1$-$C_{12}$ alkoxy group, a 1-naphthyl-$C_1$-$C_{12}$ alkoxy group, and a 2-naphthyl-$C_1$-$C_{12}$ alkoxy group.

An arylalkylthio group may have a substituent, and preferable are an unsubstituted arylalkylthio group and an arylalkylthio group substituted with a halogen atom, an alkoxy group, an alkyl group or the like. The number of carbon atoms of the arylalkylthio group is preferably 7 to 60, more preferably 7 to 48, further preferably 7 to 30. Examples of the arylalkylthio group that may have a substituent include a phenyl-$C_1$-$C_{12}$ alkylthio group, a $C_1$-$C_{12}$ alkoxyphenyl-$C_1$-$C_{12}$ alkylthio group, a $C_1$-$C_{12}$ alkylphenyl-$C_1$-$C_{12}$ alkylthio group, a 1-naphthyl-$C_1$-$C_{12}$ alkylthio group, and a 2-naphthyl-$C_1$-$C_{12}$ alkylthio group.

An alkenyl group may have a substituent, and may be any of a linear alkenyl group, a branched alkenyl group and a cyclic alkenyl group. The number of carbon atoms of the alkenyl group is preferably 2 to 20, more preferably 2 to 15, further preferably 2 to 10. Examples of the alkenyl group include a vinyl group, a 1-propenyl group, a 2-propenyl group, a 1-butenyl group, a 2-butenyl group, a 1-pentenyl group, a 2-pentenyl group, a 1-hexenyl group, a 2-hexenyl group, and a 1-octenyl group.

An arylalkenyl group may have a substituent, and preferable are an unsubstituted arylalkenyl group and an arylalkenyl group substituted with a halogen atom, an alkoxy group, an alkyl group or the like. The number of carbon atoms of the arylalkenyl group is preferably 8 to 60, more preferably 8 to 48, further preferably 8 to 30. Examples of the arylalkenyl group that may have a substituent include a phenyl-$C_2$-$C_{12}$ alkenyl group, a $C_1$-$C_{12}$ alkoxyphenyl-$C_2$-$C_{12}$ alkenyl group, a $C_1$-$C_{12}$ alkylphenyl-$C_2$-$C_{12}$ alkenyl group, a 1-naphthyl-$C_2$-$C_{12}$ alkenyl group, and a 2-naphthyl-$C_2$-$C_{12}$ alkenyl group, and particularly a $C_1$-$C_{12}$ alkoxyphenyl-$C_2$-$C_{12}$ alkenyl group and a $C_1$-$C_{12}$ alkylphenyl-$C_2$-$C_{12}$ alkenyl group are preferable. Examples of the $C_2$-$C_{12}$ alkenyl group include a vinyl group, a 1-propenyl group, a 2-propenyl group, a 1-butenyl group, a 2-butenyl group, a 1-pentenyl group, a 2-pentenyl group, a 1-hexenyl group, a 2-hexenyl group, and a 1-octenyl group.

An alkynyl group may have a substituent, and may be any of a linear alkynyl group, a branched alkynyl group and a cyclic alkynyl group. The number of carbon atoms of the alkynyl group is preferably 2 to 20, more preferably 2 to 15, further preferably 2 to 10. Examples of the alkynyl group include an ethynyl group, a 1-propynyl group, a 2-propynyl group, a 1-butynyl group, a 2-butynyl group, a 1-pentynyl group, a 2-pentynyl group, a 1-hexynyl group, a 2-hexynyl group, and a 1-octynyl group.

An arylalkynyl group may have a substituent, and preferable are an unsubstituted arylalkynyl group and an arylalkynyl group substituted with a halogen atom, an alkoxy group, an alkyl group or the like. The number of carbon atoms of the arylalkynyl group is preferably 8 to 60, more preferably 8 to 48, further preferably 8 to 30. Examples of the arylalkynyl group that may have a substituent include a phenyl-$C_2$-$C_{12}$ alkynyl group, a $C_1$-$C_{12}$ alkoxyphenyl-$C_2$-$C_{12}$ alkynyl group, a $C_1$-$C_{12}$ alkylphenyl-$C_2$-$C_{12}$ alkynyl group, a 1-naphthyl- $C_2$-$C_{12}$ alkynyl group, and a 2-naphthyl-$C_2$-$C_{12}$ alkynyl group, and particularly a $C_1$-$C_{12}$ alkoxyphenyl-$C_2$-$C_{12}$ alkynyl group and a $C_1$-$C_{12}$ alkylphenyl-$C_2$-$C_{12}$ alkynyl group are preferable. Examples of the $C_2$-$C_{12}$ alkynyl group include an ethynyl group, a 1-propynyl group, a 2-propynyl group, a 1-butynyl group, a 2-butynyl group, a 1-pentynyl group, a 2-pentynyl group, a 1-hexynyl group, a 2-hexynyl group, and a 1-octynyl group.

A monovalent heterocyclic group is an atom group left after removing one of hydrogen atoms from a heterocyclic compound, and may have a substituent. As the monovalent heterocyclic group, an unsubstituted monovalent heterocyclic group and a monovalent heterocyclic group substituted with a substituent such as an alkyl group or the like are preferable. The number of carbon atoms of the monovalent heterocyclic group is preferably 4 to 60, more preferably 4 to 30, further preferably 4 to 20 without including the number of carbon atoms of the substituent. The heterocyclic compound refers to an organic compound having a ring structure and containing not only carbon atoms but also heteroatoms, such as an oxygen atom, a sulfur atom, a nitrogen atom, a phosphorus atom, a boron atom, a silicon atom, a selenium atom, a tellurium atom, and an arsenic atom, as elements constituting the ring. Examples of the monovalent heterocyclic group that may have a substituent include a thienyl group, a $C_1$-$C_{12}$ alkylthienyl group, a pyrrolyl group, a furyl group, a pyridyl group, a $C_1$-$C_{12}$ alkylpyridyl group, a pyridazinyl group, a pyrimidinyl group, a pyrazinyl group, a triazinyl group, a pyrrolidyl group, a piperidyl group, a quinolyl group, and an isoquinolyl group, and particularly a thienyl group, a $C_1$-$C_{12}$ alkylthienyl group, a pyridyl group and a $C_1$-$C_{12}$ alkylpyridyl group are preferable. Further, as the monovalent heterocyclic group, a monovalent aromatic heterocyclic group is preferable.

A heterocyclic thio group is a group with the hydrogen atom of a mercapto group having been substituted with a monovalent heterocyclic group, and may have a substituent. Examples of the heterocyclic thio group include heteroarylthio groups, such as a pyridylthio group, a pyridazinylthio group, a pyrimidinylthio group, a pyrazinylthio group, and a triazinylthio group.

An amino group may have a substituent, and preferable are an unsubstituted amino group and an amino group substituted with one or two substituents selected from an alkyl group, an aryl group, an arylalkyl group and a monovalent heterocyclic group (hereinafter, referred to as a "substituted amino group"). The substituent may further have a substituent (hereinafter, a substituent possessed by a substituent possessed by an organic group is referred to as a "secondary substituent" in some cases). The number of carbon atoms of the substituted amino group is preferably 1 to 60, more preferably 2 to 48, further preferably 2 to 40 without including the number of carbon atoms of the secondary substituent.

Examples of the substituted amino group include a methylamino group, a dimethylamino group, an ethylamino group, a diethylamino group, a propylamino group, a dipropylamino group, an isopropylamino group, a diisopropylamino group, a butylamino group, an isobutylamino group, a sec-butylamino group, a tert-butylamino group, a pentylamino group, a hexylamino group, a heptylamino group, an octylamino group, a 2-ethylhexylamino group, a nonylamino group, a decylamino group, a 3,7-dimethyloctylamino group, a dodecylamino group, a cyclopentylamino group, a dicyclopentylamino group, a cyclohexylamino group, a dicyclohexylamino group, a ditrifluoromethylamino group, a phenylamino group, a diphenylamino group, a $C_1$-$C_{12}$ alkoxyphenylamino group, a bis($C_1$-$C_{12}$ alkoxyphenyl)amino group, a $C_1$-$C_{12}$ alkylphenylamino group, a bis($C_1$-$C_{12}$ alkylphenyl)amino group, a 1-naphthylamino group, a 2-naphthylamino group, a pentafluorophenylamino group, a pyridylamino group, a pyridazinylamino group, a pyrimidinylamino group, a pyrazinylamino group, a triazinylamino group, a phenyl-$C_1$-$C_{12}$ alkylamino group, a $C_1$-$C_{12}$ alkoxyphenyl-$C_1$-$C_{12}$ alkylamino group, a di($C_1$-$C_{12}$ alkoxyphenyl-$C_1$-$C_{12}$ alkyl)amino group, a $C_1$-$C_{12}$ alkylphenyl-$C_1$-$C_{12}$ alkylamino group, a di($C_1$-$C_{12}$ alkylphenyl-$C_1$-$C_{12}$ alkyl)amino group, a 1-naphthyl-$C_1$-$C_{12}$ alkylamino group, and a 2-naphthyl-$C_1$-$C_{12}$ alkylamino group.

A silyl group may have a substituent, and preferable are an unsubstituted silyl group and a silyl group substituted with 1 to 3 substituents selected from an alkyl group, an aryl group, an arylalkyl group and a monovalent heterocyclic group (hereinafter, referred to as a "substituted silyl group"). The substituent may have a secondary substituent. The number of carbon atoms of the substituted silyl group is preferably 1 to 60, more preferably 3 to 48, further preferably 3 to 40 without including the number of carbon atoms of the secondary substituent.

Examples of the substituted silyl group include a trimethylsilyl group, a triethylsilyl group, a tripropylsilyl group, a tri-isopropylsilyl group, a dimethyl-isopropylsilyl group, a diethyl-isopropylsilyl group, a tert-butyldimethylsilyl group, a pentyldimethylsilyl group, a hexyldimethylsilyl group, a heptyldimethylsilyl group, an octyldimethylsilyl group, a 2-ethylhexyl-dimethylsilyl group, a nonyldimethylsilyl group, a decyldimethylsilyl group, a 3,7-dimethyloctyl-dimethylsilyl group, a dodecyldimethylsilyl group, a phenyl-$C_1$-$C_{12}$ alkylsilyl group, a $C_1$-$C_{12}$ alkoxyphenyl-$C_1$-$C_{12}$ alkylsilyl group, a $C_1$-$C_{12}$ alkylphenyl-$C_1$-$C_{12}$ alkylsilyl group, a 1-naphthyl-$C_1$-$C_{12}$ alkylsilyl group, a 2-naphthyl-$C_1$-$C_{12}$ alkylsilyl group, a phenyl-$C_1$-$C_{12}$ alkyldimethylsilyl group, a triphenylsilyl group, a tri-p-xylylsilyl group, a tribenzylsilyl group, a diphenylmethylsilyl group, a tert-butyldiphenylsilyl group, and a dimethylphenylsilyl group.

An acyl group may have a substituent, and preferable are an unsubstituted acyl group and an acyl group substituted with a halogen atom or the like. The number of carbon atoms of the acyl group is preferably 2 to 20, more preferably 2 to 18, further preferably 2 to 16. Examples of the acyl group include an acetyl group, a propionyl group, a butylyl group, an isobutylyl group, a pivaloyl group, a benzoyl group, a trifluoroacetyl group, and a pentafluorobenzoyl group.

An acyloxy group may have a substituent, and preferable are an unsubstituted acyloxy group and an acyloxy group substituted with a halogen atom or the like. The number of carbon atoms of the acyloxy group is preferably 2 to 20, more preferably 2 to 18, further preferably 2 to 16. Examples of the acyloxy group include an acetoxy group, a propyonyloxy group, a butylyloxy group, an isobutylyloxy group, a pivaloyloxy group, a benzoyloxy group, a trifluoroacetyloxy group, and a pentafluorobenzoyloxy group.

An imine residue means a residue left after removing, from an imine compound having a structure represented by at least one of formula: H—N=C< and formula: —N=CH—, one of the hydrogen atoms in the structure. Examples of such imine compound include compounds in which a hydrogen atom bound to aldimine, ketimine or a nitrogen atom in aldimine has been substituted with an alkyl group, an aryl group, an arylalkyl group, an arylalkenyl group, an arylalkynyl group or the like. The number of carbon atoms of the imine residue is preferably 2 to 20, more preferably 2 to 18, further preferably 2 to 16.

Examples of the imine residue include residues represented by general formula: —$CR^X$=N—$R^Y$ or general formula: $-N=C(R^Y)_2$ wherein $R^X$ represents a hydrogen atom, an alkyl group, an aryl group, an arylalkyl group, an arylalkenyl group or an arylalkynyl group, and $R^Y$ represents an alkyl group, an aryl group, an arylalkyl group, an arylalkenyl group or an arylalkynyl group, where, in the event that two $R^Y$s are present, they may be same or different, and two $R^Y$s may be bound together and integrated to form a ring as a bivalent group, for example, an alkylene group having 2 to 18 carbon atoms, such as an ethylene group, a trimethylene group, a tetramethylene group, a pentamethylene group, a hexamethylene group or the like. Specific examples of the imine residue include groups represented by the following structural formulae.

An amide group may have a substituent, and preferable are an unsubstituted amide group and an amide group substituted with a halogen atom or the like. The number of carbon atoms of the amide group is preferably 2 to 20, more preferably 2 to 18, further preferably 2 to 16. Examples of the amide group include a formamide group, an acetamide group, a propioamide group, a butyroamide group, a benzamide group, a trifluoroacetamide group, a pentafluorobenzamide group, a diformamide group, a diacetamide group, a dipropioamide group, a dibutyroamide group, a dibenzamide group, a ditrifluoroacetamide group, and a dipentafluorobenzamide group.

An acid imide group means a residue obtained by removing from an acid imide one of hydrogen atoms bound to nitrogen atoms of the acid imide. The number of carbon atoms of the acid imide group is preferably 4 to 20, more preferably 4 to 18, further preferably 4 to 16. Examples of the acid imide group include the groups shown below.

[Chemical Formula 1]

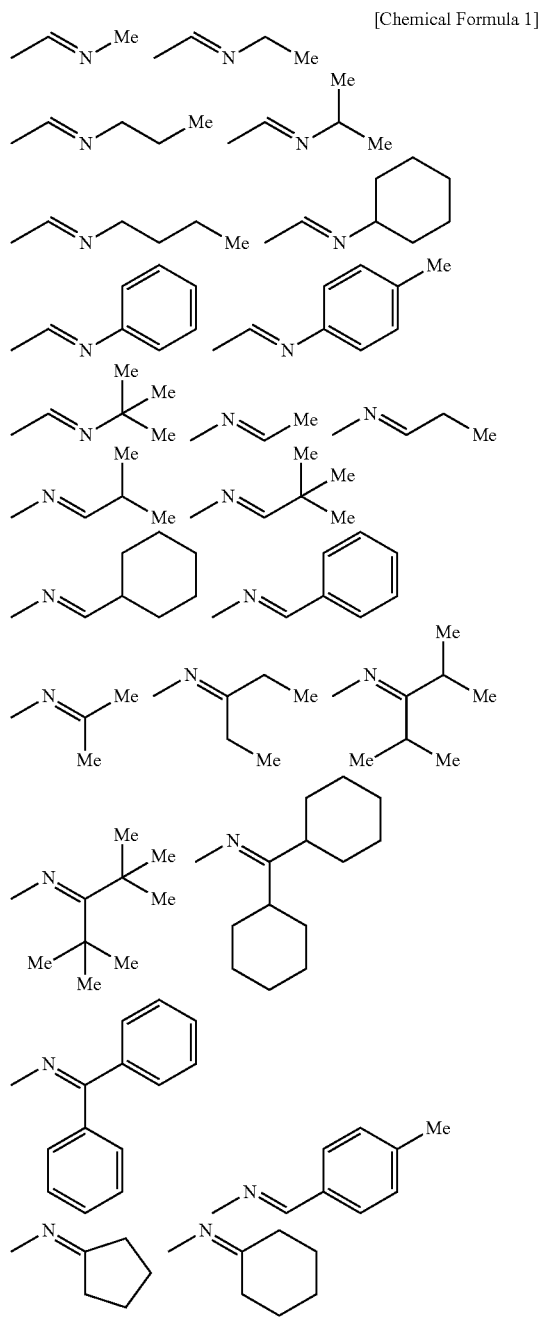

[Chemical Formula 2]

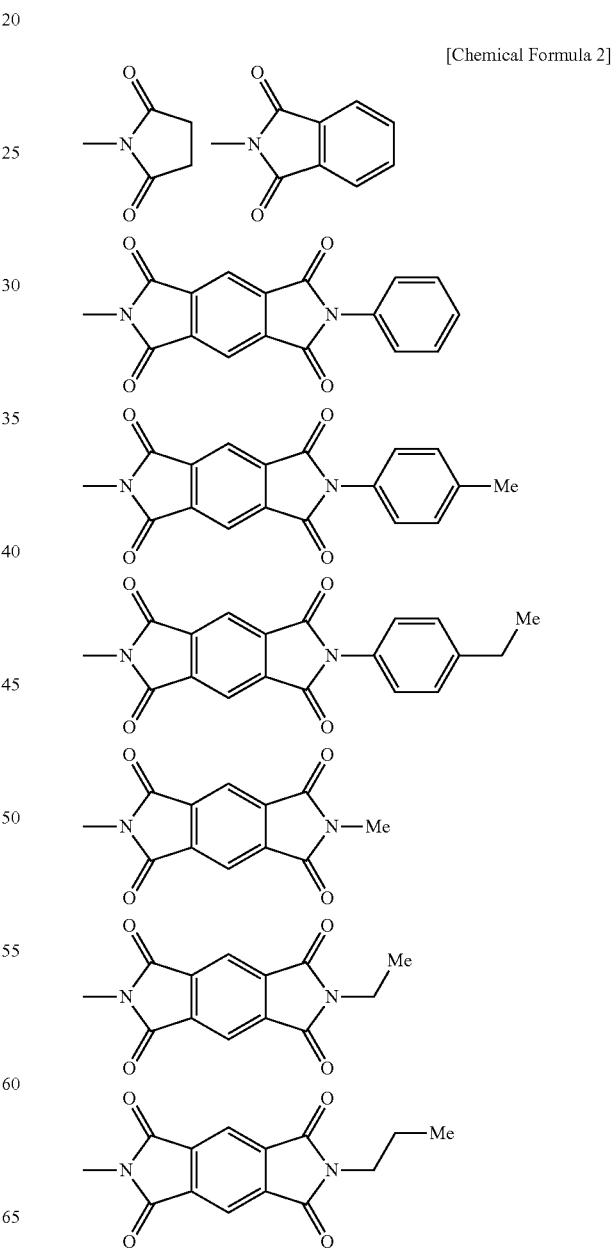

-continued

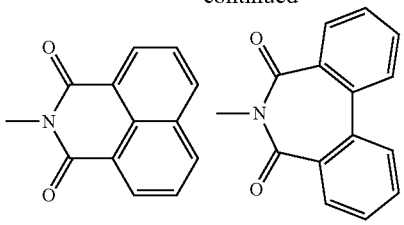

An arylene group means an atom group constituted by removing 2 hydrogen atoms from an aromatic hydrocarbon, and include those having an independent benzene ring or fused ring. The number of carbon atoms of the arylene group is preferably 6 to 60, more preferably 6 to 48, further preferably 6 to 30, especially preferably 6 to 18. The number of carbon atoms does not include the number of carbon atoms of a substituent. Examples of the arylene group include phenylene groups, such as a 1,4-phenylene group, a 1,3-phenylene group, and a 1,2-phenylene group; biphenylylene groups, such as a 2,7-biphenylylene group, and a 3,6-biphenylylene group; naphthalenediyl groups, such as a 1,4-naphthalenediyl group, a 1,5-naphthalenediyl group, and a 2,6-naphthalenediyl group; anthracenediyl groups, such as a 1,4-anthracenediyl group, a 1,5-anthracenediyl group, a 2,6-anthracenediyl group, and a 9,10-anthracenediyl group; phenanthrenediyl groups, such as a 2,7-phenanthrenediyl group; naphthacenediyl groups, such as a 1,7-naphthacenediyl group, a 2,8-naphthacenediyl group, and a 5,12-naphthacenediyl group; fluorenediyl groups, such as a 2,7-fluorenediyl group, and a 3,6-fluorenediyl group; pyrenediyl groups, such as a 1,6-pyrenediyl group, a 1,8-pyrenediyl group, a 2,7-pyrenediyl group, and a 4,9-pyrenediyl group; perylenediyl groups, such as a 3,9-perylenediyl group, and a 3,10-perylenediyl group; and they may have a substituent. Among them, preferable are an unsubstituted or substituted phenylene group and an unsubstituted or substituted fluorenediyl group.

A bivalent heterocyclic group refers to an atom group left after removing two of hydrogen atoms from a heterocyclic compound, and may have a substituent. As the bivalent heterocyclic group, an unsubstituted bivalent heterocyclic group and a bivalent heterocyclic group substituted with an alkyl group or the like are preferable. The number of carbon atoms of the bivalent heterocyclic group is preferably 4 to 60, more preferably 4 to 30, further preferably 4 to 12 without including the number of carbon atoms of the substituent.

Examples of the bivalent heterocyclic group include pyridinediyl groups, such as a 2,5-pyridinediyl group, and a 2,6-pyridinediyl group; thiophenediyl groups, such as a 2,5-thiophenediyl group; furandiyl groups, such as a 2,5-furandiyl group; quinolinediyl groups, such as a 2,6-quinolinediyl group; isoquinolinediyl groups, such as a 1,4-isoquinolinediyl group, and a 1,5-isoquinolinediyl group; quinoxalinediyl groups, such as a 5,8-quinoxalinediyl group; 2,1,3-benzothiadiazole groups, such as a 2,1,3-benzothiadiazole-4,7-diyl group; benzothiazolediyl groups, such as a 4,7-benzothiazolediyl group; carbazolediyl groups, such as a 2,7-carbazolediyl group, and a 3,6-carbazolediyl group; phenoxazinediyl groups, such as a 3,7-phenoxazinediyl group; phenothiazinediyl groups, such as a 3,7-phenothiazinediyl group; dibenzosilolediyl groups, such as a 2,7-dibenzosilolediyl group; and they may have a substituent. Among them, preferable are an unsubstituted or substituted 2,1,3-benzothiadiazole-4,7-diyl group, an unsubstituted or substituted phenoxazinediyl group and an unsubstituted or substituted phenothiazinediyl group. Further, as the bivalent heterocyclic group, a bivalent group of an aromatic heterocycle is preferable.

<Light Emitting Material>

A first aspect of a light emitting material according to this embodiment (hereinafter, referred to as a first light emitting material in some cases) is characterized in that the material comprises a conjugated polymer having a conjugated part and a blue light emitting compound having a blue light emitting part and satisfies the following formula (1):

[Mathematical Formula 7]

$$y \geq \log_{10}(5.1 \times x^{0.2} + 1) \qquad (1)$$

wherein y represents the amount of light emitted by the blue light emitting compound where the total amount of light emitted by the conjugated polymer and the blue light emitting compound in the light emitting material due to excitation caused by light having a wavelength of 370 nm is 1, and provided that the gram light absorption coefficient of the conjugated polymer and the blue light emitting compound in the light emitting material are expressed by $\epsilon_1$ and $\epsilon_2$, and further the content of the blue light emitting compound is expressed by $P_2$ (parts by mass) where the total content of the conjugated polymer and the blue light emitting compound in the light emitting material is 100 parts by mass, x is defined by the formula:

[Mathematical Formula 8]

$$x = (\epsilon_2/\epsilon_1) \times P_2.$$

Also, a second aspect of a light emitting material according to this embodiment (hereinafter, referred to as a second light emitting material in some cases) is characterized in that the material comprises a conjugated polymer having a conjugated part and a blue light emitting part and satisfies the following formula (1):

[Mathematical Formula 9]

$$y \geq \log_{10}(5.1 \times x^{0.2} + 1) \qquad (1)$$

wherein y represents the amount of light emitted by the blue light emitting part where the total amount of light emitted by the conjugated part and the blue light emitting part in the light emitting material due to excitation caused by light having a wavelength of 370 nm is 1, and provided that the gram light absorption coefficient of the conjugated part and the blue light emitting part in the light emitting material are expressed by $\epsilon_1$ and $\epsilon_2$, and further the content of the blue light emitting part is expressed by $P_2$ (parts by mass) where the total content of the conjugated part and the blue light emitting part in the light emitting material is 100 parts by mass, x is defined by the formula:

[Mathematical Formula 10]

$$x = (\epsilon_2/\epsilon_1) \times P_2.$$

The light emitting material according to this embodiment contains a conjugated part as a part engaged in charge transportation and binding of electrons and holes and contains a blue light emitting part as a part engaged in blue light emission. With the light emitting material according to this embodiment, by having the above-mentioned configuration, the blue light emitting part can efficiently receive excitation energy formed by holes and electrons bound in the conjugated part. Thus, a light emitting device comprising a light emitting layer containing the light emitting material is excellent in light emitting efficiency. Thus, the light emitting device contains the light emitting material according to this embodiment and its luminous lifetime is thereby improved. The reason why the luminous lifetime of the light emitting device is improved is not necessarily evident, but it is considered that by separating functions between the conjugated part engaged in charge transportation and binding and the blue light emitting part engaged in light emission, the conjugated part is easily inhibited from being chemically degraded from an excited state, and/or the blue light emitting part is easily inhibited from being chemically degraded from a cation radical state and/or an anion radical state.

The light emitting material according to this embodiment more preferably satisfies the following formula (2). With the light emitting material satisfying the following formula (2), the luminous lifetime of the light emitting device can be further improved. Further, the light emitting material satisfying the formula (2) satisfies the formula (1):

[Mathematical Formula 11]

$$y \geq \log_{10}(5.5 \times x^{0.3} + 1) \quad (2)$$

wherein y and x are same as y and x in the formula (1).

In the light emitting material according to this embodiment, y is preferably 0.7 or more, more preferably 0.75 or more, further preferably 0.8 or more. Such a light emitting material has a reduced amount of light emission from the conjugated part and is excellent in color tone of blue light emission.

Also, x is preferably 10 or less, more preferably 7 or less, further preferably 4 or less, especially preferably 1.0 or less. Such a light emitting material can induce blue light emission in high light emitting efficiency with a small blue light emitting part.

y in the first light emitting material according to this embodiment can be determined by measuring each of a light emitting spectrum of the conjugated polymer, a light emitting spectrum of the blue light emitting compound and a light emitting spectrum of the first light emitting material. In addition, the light emitting spectra each are a spectrum obtained by excitation with light having a wavelength of 370 nm.

y is obtained by analyzing the light emitting spectrum of the above-mentioned composition as a linear bond of patterns of the light emitting spectra of the conjugated polymer and the blue light emitting compound, and calculating a ratio of light emitting intensity of the blue light emitting compound to total light emitting intensity of the light emitting spectra of the conjugated polymer and the blue light emitting compound. That is, a factor $k_1$ and a factor $k_2$ are determined by making an analysis so that a light emitting spectrum obtained by multiplying the light emitting spectra of the conjugated polymer and the blue light emitting compound by the factor $k_1$ and the factor $k_2$, respectively, and adding the resulting products together is coincident with the light emitting spectrum of the above-mentioned mixture. A value represented by $k_2/(k_1+k_2)$ using the factor $k_1$ and factor $k_2$ is y.

x in the first light emitting material according to this embodiment is determined by measuring a UV-VIS absorption spectrum of the conjugated polymer and a UV-VIS absorption spectrum of the blue light emitting compound. A gram light absorption coefficient $\epsilon_1$ of the conjugated polymer in a wavelength of 370 nm is calculated from the UV-VIS absorption spectrum of the conjugated polymer, and a gram light absorption factor $\epsilon_2$ of the blue light emitting compound is calculated from the UV-VIS absorption spectrum of the blue light emitting compound. A value represented by $(\epsilon_2/\epsilon_1) \times P_2$ using the gram light absorption coefficient $\epsilon_1$, the gram light absorption coefficient $\epsilon_2$, the content $P_2$ (parts by mass) of the blue light emitting compound where the total content of the conjugated polymer and the blue light emitting compound in the light emitting material is 100 parts by mass is x.

y in the second light emitting material according to this embodiment can be determined by measuring each of a light emitting spectrum of the conjugated part, a light emitting spectrum of the blue light emitting part and a light emitting spectrum of a composition having the conjugated part and the blue light emitting part at a content ratio same as the content ratio in the light emitting material. Further, if the light emitting material does not have a part that induces light emission by excitation with light having a wavelength of 370 nm, other than the conjugated part and the blue light emitting part, the light emitting spectrum of the light emitting material may be used as the light emitting spectrum of the composition. In addition, the light emitting spectra each are a spectrum obtained by excitation with light having a wavelength of 370 nm.

y is obtained by analyzing the light emitting spectrum of the above-mentioned composition as a linear bond of patterns of the light emitting spectra of the conjugated part and the blue light emitting part, and calculating a ratio of light emitting intensity of the blue light emitting part to total light emitting intensity of the light emitting spectra of the conjugated part and the blue light emitting part. That is, a factor $k_1$ and a factor $k_2$ are determined by making an analysis so that a light emitting spectrum obtained by multiplying the light emitting spectra of the conjugated part and the blue light emitting part by the factor $k_1$ and the factor $k_2$, respectively, and adding the resulting products together is coincident with the light emitting spectrum of the above-mentioned mixture. A value represented by $k_2/(k_1+k_2)$ using the factor $k_1$ and factor $k_2$ is y.

In addition, x in the second light emitting material according to this embodiment is determined by measuring a UV-VIS absorption spectrum of the conjugated part and a UV-VIS absorption spectrum of the blue light emitting part. A gram light absorption coefficient $\epsilon_1$ of the conjugated part in a wavelength of 370 nm is calculated from the UV-VIS absorption spectrum of the conjugated part, and a gram light absorption coefficient $\epsilon_2$ of the blue light emitting part is calculated from the UV-VIS absorption spectrum of the blue light emitting part. A value represented by $(\epsilon_2/\epsilon_1) \times P_2$ using the gram light absorption coefficient $\epsilon_1$, the gram light absorption coefficient $\epsilon_2$, the content $P_2$ (parts by mass) of the blue light emitting compound where the total content of the conjugated part and the blue light emitting part in the light emitting material is 100 parts by mass is x.

A preferred aspect of the first light emitting material according to this embodiment is a light emitting material characterized by comprising a conjugated polymer and a blue light emitting compound having a molecular weight of 5000 or less, and satisfying the following formula (1'):

[Mathematical Formula 12]

$$y_1 \geq \log_{10}(5.1 \times x_1^{0.2} + 1) \quad (1')$$

wherein $y_1$ represents an amount of light emission of the blue light emitting compound where the total amount of light emission of the conjugated polymer and the blue light emitting compound in the light emitting material by excitation with light having a wavelength of 370 nm is 1, and $x_1$ represents an amount of light absorption in the blue light emitting compound where the amount of absorption of light having a wavelength of 370 nm by the conjugated polymer in the light emitting material is 100.

In the preferred aspect of the first light emitting material, $y_1$ can be determined by measuring each of a light emitting spectrum of the conjugated polymer, a light emitting spectrum of the blue light emitting compound and a light emitting spectrum of a mixture of the conjugated polymer and the blue light emitting compound at a content ratio same as the content ratio in the light emitting material. Further, if the light emitting material does not have a compound that induces light emission by excitation with light having a wavelength of 370 nm, other than the conjugated polymer and the blue light emitting compound, the light emitting spectrum of the light emitting material may be used as the light emitting spectrum of the mixture. In addition, the light emitting spectra each are a spectrum obtained by excitation with light having a wavelength of 370 nm.

$y_1$ in the preferred aspect of the first light emitting material is obtained by analyzing the light emitting spectrum of the above-mentioned mixture as a linear bond of patterns of the light emitting spectra of the conjugated polymer and the blue light emitting compound, and calculating a ratio of light emitting intensity of the blue light emitting compound to total light emitting intensity of the light emitting spectra of the conjugated polymer and the blue light emitting compound. That is, a factor $k_3$ and a factor $k_4$ are determined by making an analysis so that a light emitting spectrum obtained by multiplying the light emitting spectra of the conjugated polymer and the blue light emitting compound by the factor $k_3$ and the factor $k_4$, respectively, and adding the resulting products together is coincident with the light emitting spectrum of the above-mentioned mixture. A value represented by $k_4/(k_3+k_4)$ using the factor $k_3$ and factor $k_4$ is $y_1$.

In the preferred aspect of the first light emitting material, $x_1$ is determined by measuring a UV-VIS absorption spectrum of the conjugated polymer and a UV-VIS absorption spectrum of the blue light emitting compound. A gram light absorption coefficient $\epsilon_3$ of the conjugated polymer in a wavelength of 370 nm is calculated from the UV-VIS absorption spectrum of the conjugated polymer, and a gram light absorption coefficient $\epsilon_4$ of the blue light emitting compound is calculated from the UV-VIS absorption spectrum of the blue light emitting compound. A value represented by $(\epsilon_4/\epsilon_3)\times P_4$ using the gram light absorption coefficient 83, and the gram light absorption coefficient $\epsilon_4$, the content $P_4$ (parts by mass) of the blue light emitting compound where the total content of the conjugated polymer and the blue light emitting compound in the light emitting material is 100 parts by mass is $x_1$.

(First Light Emitting Material)

A first light emitting material comprises a conjugated polymer having a conjugated part and a blue light emitting compound having a blue light emitting part.

(Conjugated Polymer)

In the first light emitting material, the conjugated polymer may be a conjugated polymer having in a main chain as a repeating unit an arylene group that may have a substituent or a bivalent aromatic heterocyclic group that may have a substituent. Preferably 50% or more, more preferably 70% or more, further preferably 80% or more of the repeating units are linked by direct bonds, nitrogen atoms and bivalent groups of vinylene or acetylene.

Examples of the conjugated polymer include conjugated polymers described in, for example, "Dodensei Kobunshi Zairyo" (CMC Publishing CO., LTD.), "Dodensei Kobunshi no Saishin Oyo Gijutsu" (CMC Publishing CO., LTD.), "Dodensei Kobunshi no Kiso to Oyo" (Industrial Publishing & Consulting, Inc.; edited and written by Katsumi Yoshino), "Dodensei Polymer" (edited by Society of Polymer Science; written by Shinichi Yoshimura), "Kobunshi EL Zairyo" (edited by Society of Polymer Science; written by Toshihiro Onishi and Akemi Ogawa), and so on.

The conjugated polymer has a number average molecular weight in terms of polystyrene of preferably $1\times10^3$ to $1\times10^7$, more preferably $1\times10^4$ to $5\times10^6$. In addition, the conjugated polymer has a weight average molecular weight in terms of polystyrene of preferably $1\times10^4$ to $5\times10^7$, more preferably $5\times10^4$ to $1\times10^7$. Resistance to charge transfer easily decreases and film-forming property is easily improved when the number average molecular weight and the weight average molecular weight are higher than the lower limits described above, and processability for forming a film by wet coating is easily improved when the number average molecular weight and the weight average molecular weight are lower than the upper limits described above.

The conjugated polymer preferably contains at least one repeating unit selected from the group consisting of a repeating unit represented by the following general formula (A) (hereinafter, referred to as a "repeating unit A"), a repeating unit represented by the following general formula (B) (hereinafter, referred to as a "repeating unit B") and a repeating unit represented by the following general formula (C) (hereinafter, referred to as a "repeating unit C") from the viewpoint of improvement of charge transportation/injection and luminous lifetime:

[Chemical Formula 3]

(A)

wherein $Ar^1$ represents an arylene group that may have a substituent or a bivalent aromatic heterocyclic group that may have a substituent;

[Chemical Formula 4]

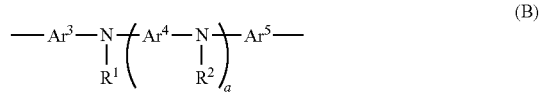

(B)

wherein $Ar^3$, $Ar^4$ and $Ar^5$ each independently represent an arylene group that may have a substituent or a bivalent aromatic heterocyclic group that may have a substituent, $R^1$ and $R^2$ each independently represent a hydrogen atom, an alkyl group that may have a substituent, an aryl group that may have a substituent, a monovalent heterocyclic group that may have a substituent or an arylalkyl group that may have a substituent, and a represents 0 or 1; when a is 1, $Ar^3$ and $Ar^4$, and $Ar^4$ and $Ar^5$ may each be bound together to form a ring; and when a is 0, $Ar^3$ and $Ar^5$ may be bound together to form a ring; and

[Chemical Formula 5]

(C)

wherein $Ar^6$ represents an arylene group that may have a substituent or a bivalent aromatic heterocyclic group that may have a substituent, and $X^1$ represents a group represented by $-CR^3=CR^4-$ or a group represented by $-C\equiv C-$; and $R^3$ and $R^4$ each independently represent a hydrogen atom, an alkyl group that may have a substituent, an aryl group that may have a substituent, a monovalent heterocyclic group that may have a substituent, a carboxyl group or a cyano group.

The conjugated polymer preferably contains a bivalent aromatic amine residue from the viewpoint of hole injection/transportation, and the bivalent aromatic amine residue is preferably a repeating unit B.

In addition, the conjugated polymer preferably contains a repeating unit A or a repeating unit B from the viewpoint of electron injection/transportation, and preferably contains at least a repeating unit A.

The conjugated polymer is preferably a conjugated polymer including a repeating unit A and a repeating unit B, a conjugated polymer including a repeating unit B and a repeating unit C or a conjugated polymer including a repeating unit A, a repeating unit B and a repeating unit C from the viewpoint of injection of holes and electrons, transportation of holes and electrons and efficient formation of excitation energy by binding of holes and electrons. Among them, preferable is a conjugated polymer including a repeating unit A and a repeating unit B.

The repeating unit A, the repeating unit B and the repeating unit C may be present in the same polymer chain or present in different conjugated polymers, but are more preferably present in the same polymer chain.

If the conjugated polymer includes a bivalent aromatic amine residue, the content ratio of the aromatic amine residue in the conjugated polymer is preferably 1 to 40% by mass, more preferably 3 to 30% by mass, further preferably 5 to 20% by mass.

In addition, if the conjugated polymer is a conjugated polymer including a repeating unit B, a repeating unit A and/or a repeating unit C, a preferable content ratio (molar ratio) of the repeating unit B to the other repeating units is 1:99 to 40:60, more preferably 3:97 to 30:70, further preferably 5:95 to 20:80.

[Repeating Unit A]

In the general formula (A), $Ar^1$ and $Ar^2$ each independently represent an arylene group that may have a substituent or a bivalent aromatic heterocyclic group that may have a substituent. Here, examples of the substituent include an alkyl group, an alkoxy group, an aryl group, an aryloxy group, an arylalkyl group, an arylalkoxy group, an arylalkenyl group, an arylalkynyl group, an amino group, a substituted amino group, a halogen atom, an acyl group, an acyloxy group, a monovalent heterocyclic group, a carboxyl group, a nitro group, and a cyano group, preferable are an alkyl group, an alkoxy group, an aryl group, an aryloxy group, a substituted amino group and a monovalent heterocyclic group, and more preferable are an alkyl group, an alkoxy group and an aryl group.

In the general formula (A), examples of the arylene group include a 1,4-phenylene group, a 1,3-phenylene group, a 2,7-biphenylylene group, a 1,4-naphthalenediyl group, a 1,5-naphthalenediyl group, a 2,6-naphthalenediyl group, a 2,7-fluorenediyl group, and a 3,6-fluorenediyl group, preferable are a 1,4-phenylene group, a 2,7-biphenylylene group, a 1,4-naphthalenediyl group, a 1,5-naphthalenediyl group, a 2,6-naphthalenediyl group and a 2,7-fluorenediyl group, more preferable are a 1,4-phenylene group, a 1,4-naphthalenediyl group, a 1,5-naphthalenediyl group, a 2,6-naphthalenediyl group and a 2,7-fluorenediyl group, and especially preferable are a 1,4-phenylene group and a 2,7-fluorenediyl group. Most preferable is a 2,7-fluorenediyl group.

In the general formula (A), examples of the bivalent aromatic heterocyclic group include a 2,1,3-benzothiadiazole-4,7-diyl group, a 2,6-quinolinediyl group, a 1,4-isoquinolinediyl group, a 1,5-isoquinolinediyl group and a 5,8-quinoxalinediyl group, and preferable examples thereof include a 2,1,3-benzothiadiazole-4,7-diyl group and a 5,8-quinoxalinediyl group.

As the repeating unit (A), preferable are a fluorenediyl group that may have a substituent, a phenylene group that may have a substituent, and a combination thereof.

As $Ar^1$ and $Ar^2$ in the general formula (A), preferable is a group represented by the following general formula (A-1), (A-2) or (A-3):

[Chemical Formula 6]

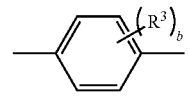

(A-1)

wherein $R^3$ represents an alkyl group, an alkoxy group, an aryl group, an aryloxy group, an arylalkyl group, an arylalkoxy group, an arylalkenyl group, an arylalkynyl group, an amino group, a substituted amino group, a halogen atom, an acyl group, an acyloxy group, a monovalent heterocyclic group, a carboxyl group, a nitro group or a cyano group, and b represents an integer of 0 to 4; some or all of hydrogen atoms included in these groups may be substituted with fluorine atoms; when b is 2 or greater, $R^3$ present in a plural number may be same or different;

$R^3$ is preferably an alkyl group, an alkoxy group, an aryl group, an aryloxy group, an arylalkyl group, an arylalkoxy group, an arylalkenyl group, an arylalkynyl group, a substituted amino group, an acyl group or a monovalent heterocyclic group, more preferably an alkyl group, an alkoxy group, an aryl group, an aryloxy group, a substituted amino group, an acyl group or a monovalent heterocyclic group, further preferably an alkyl group, an alkoxy group, an aryl group or a monovalent heterocyclic group, especially preferably an alkyl group, an alkoxy group or an aryl group; and f is preferably an integer of 0 to 2;

[Chemical Formula 7]

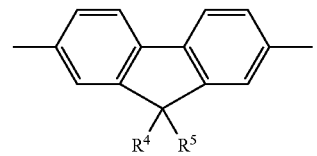

(A-2)

wherein $R^4$ and $R^5$ each independently represent a hydrogen atom, an alkyl group, an aryl group, an arylalkyl group or a monovalent heterocyclic group; these substituents may further have a substituent; and $R^4$ and $R^5$ are each preferably an alkyl group, an aryl group or a monovalent heterocyclic group, more preferably an alkyl group or an aryl group; or

[Chemical Formula 8]

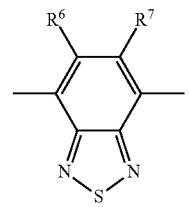

(A-3)

wherein $R^6$ and $R^7$ each independently represent a hydrogen atom, an alkyl group, an alkoxy group, an aryl group, an aryloxy group, an arylalkyl group, an arylalkoxy group, an arylalkenyl group, an arylalkynyl group, an amino group, a substituted amino group, a halogen atom, an acyl group, an acyloxy group, a monovalent heterocyclic group, a carboxyl group, a nitro group or a cyano group; some or all of hydrogen atoms included in these groups may be substituted with fluorine atoms;

$R^6$ and $R^7$ are each preferably a hydrogen atom, an alkyl group, an alkoxy group, an aryl group, an aryloxy group, an arylalkyl group, an arylalkoxy group, a substituted amino group, an acyl group or a monovalent heterocyclic group, more preferably a hydrogen atom, an alkyl group, an alkoxy group, an aryl group, an aryloxy group or a monovalent heterocyclic group, further preferably a hydrogen atom or an alkyl group, especially preferably a hydrogen atom.

[Repeating Unit B]

In the general formula (B), $Ar^3$, $Ar^4$ and $Ar^5$ each independently represent an arylene group that may have a substituent or a bivalent aromatic heterocyclic group that may have a substituent. Here, examples of the substituent include an alkyl group, an alkoxy group, an aryl group, an aryloxy group, an arylalkyl group, an arylalkoxy group, an arylalkenyl group, an arylalkynyl group, an amino group, a substituted amino group, a halogen atom, an acyl group, an acyloxy group, a monovalent heterocyclic group, a carboxyl group, a nitro group and a cyano group, preferable are an alkyl group, an alkoxy group, an aryl group, an aryloxy group, an arylalkyl group, an arylalkoxy group, a substituted amino group, an acyl group and a cyano group, and more preferable are an alkyl group, an alkoxy group and an aryl group.

In the general formula (B), examples of the arylene group include a 1,3-phenylene group, a 1,4-phenylene group, a 2,7-biphenylylene group, a 1,4-naphthalenediyl group, a 2,6-naphthalenediyl group, and a 2,7-fluorenediyl group.

In the general formula (B), examples of the bivalent aromatic heterocyclic group include a 2,5-thiophenylenediyl group, an N-methyl-2,5-pyrrolediyl group, a 2,5-furandiyl group, a 4,7-benzo[2,1,3]thiadiazolediyl group, a 2,5-pyridinediyl group, and a 2,5-pyrimidinediyl group.

$Ar^3$ and $Ar^5$ are each independently preferably an arylene group that may have a substituent, more preferably a 1,3-phenylene group that may have a substituent, a 1,4-phenylene group that may have a substituent, a 2,7-biphenylylene group that may have a substituent, a 1,4-naphthalenediyl group that may have a substituent or a 2,6-naphthalenediyl group that may have a substituent, further preferably a 1,4-phenylene group that may have a substituent, a 2,7-biphenylylene group that may have a substituent or a 1,4-naphthalenediyl group that may have a substituent, especially preferably a 1,4-phenylene group that may have a substituent.

$Ar^4$ is preferably a 1,3-phenylene group that may have a substituent, a 1,4-phenylene group that may have a substituent, a 2,7-biphenylylene group that may have a substituent, a 1,4-naphthalenediyl group that may have a substituent, a 2,7-fluorenediyl group that may have a substituent or a 4,7-benzo[2,1,3]thiadiazolediyl group that may have a substituent, more preferably a 1,4-phenylene group that may have a substituent, a 2,7-biphenylylene group that may have a substituent, a 1,4-naphthalenediyl group that may have a substituent or a 2,7-fluorenediyl group that may have a substituent, further preferably a 1,4-phenylene group that may have a substituent or a 2,7-biphenylylene group that may have a substituent.

$R^4$ and $R^5$ are each independently preferably an alkyl group, an aryl group or a monovalent heterocyclic group, more preferably an alkyl group or an aryl group, further preferably an aryl group.

Examples of the repeating unit B include repeating units represented by the following formulae (B-1), (B-2), (B-3), (B-4) and (B-5). In the following formulae, $R^a$ represents a hydrogen atom, an alkyl group, an alkoxy group, an aryl group, an aryloxy group, an arylalkyl group, an arylalkoxy group, an arylalkenyl group, an arylalkynyl group, an amino group, a substituted amino group, a halogen atom, an acyl group, an acyloxy group, a monovalent heterocyclic group, a carboxyl group, a nitro group or a cyano group. $R^a$ present in a plural number may be same or different.

[Chemical Formula 9]

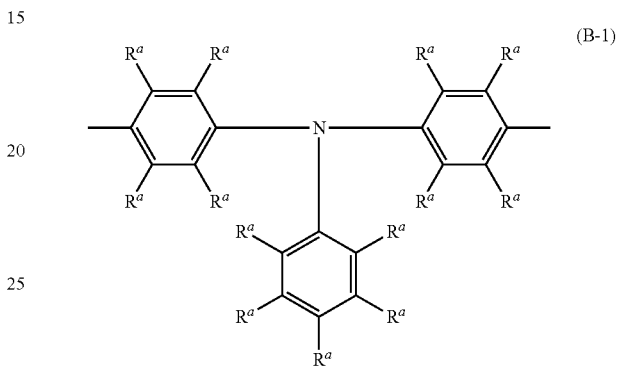
(B-1)

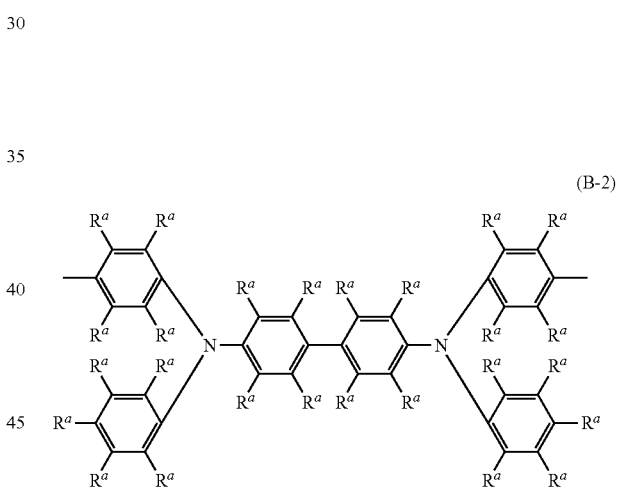
(B-2)

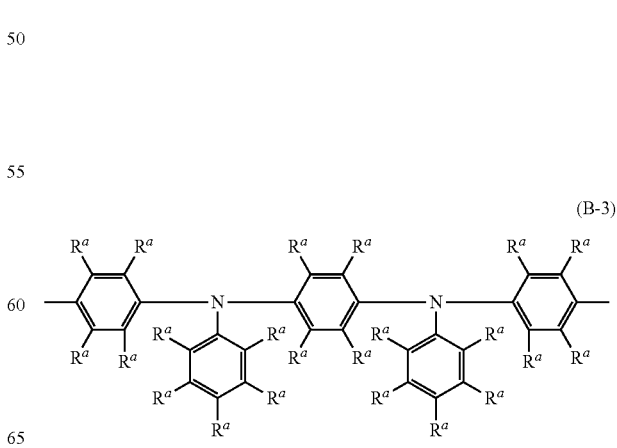
(B-3)

-continued (B-4)

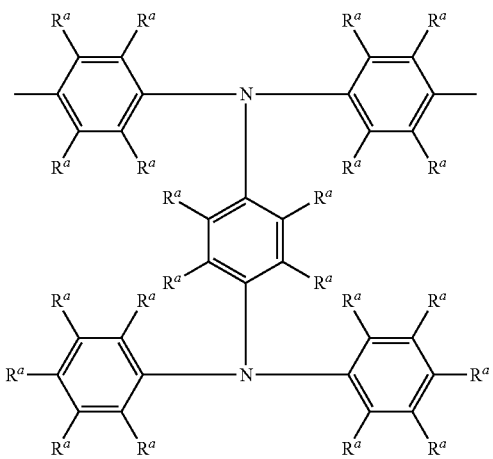

(B-5)

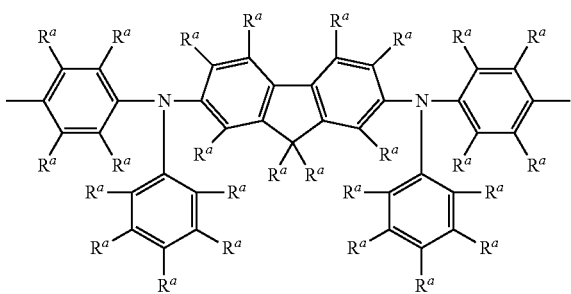

In the general formula (B), when a is 1, $Ar^3$ and $Ar^4$, and $Ar^4$ and $Ar^5$ may each be bound together to form a ring. In addition, when a is 0, $Ar^3$ and $Ar^5$ may be bound together to form a ring. Here, "bound together to form a ring" means that, for example, $Ar^3$ and $Ar^4$, $Ar^4$ and $Ar^5$ or $Ar^3$ and $Ar^5$ may be bound via a carbon atom, an oxygen atom, a nitrogen atom, a sulfur atom or a silicon atom, or bound directly. More specific examples of such repeating unit B include repeating units represented by the following general formulae (B-6), (B-7), (B-8), (B-9) and (B-10):

[Chemical Formula 10]

(B-6)
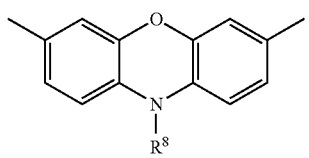

(B-7)
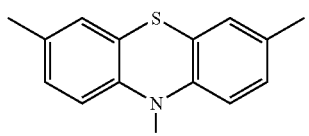

(B-8)
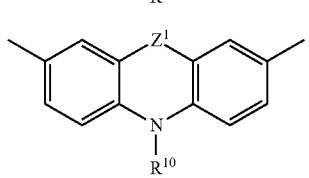

-continued (B-9)
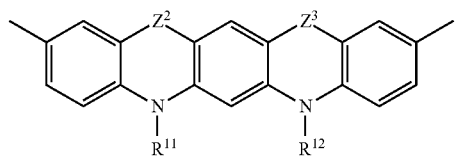

(B-10)
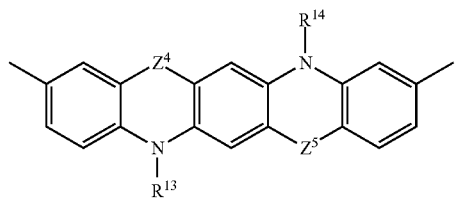

wherein $R^8$, $R^9$, $R^{10}$, $R^{11}$, $R^{12}$, $R^{13}$ and $R^{14}$ each independently represent a hydrogen atom, an alkyl group, an aryl group, a monovalent heterocyclic group or an arylalkyl group, and these substituents may further have a substituent; $Z^1$, $Z^2$, $Z^3$, $Z^4$ and $Z^5$ each independently represent a group represented by —$(CR^{15}R^{16})_d$—; $R^{15}$ and $R^{16}$ each independently represent a hydrogen atom, an alkyl group, an aryl group, a monovalent heterocyclic group or an arylalkyl group, and these substituents may further have a substituent; d represents an integer of 0 to 2; and when d is 2, $R^{15}$ present in a plural number may be same or different, and $R^{16}$ present in a plural number may be same or different.

In the general formula (B-6), $R^8$ is preferably an alkyl group, an aryl group or a monovalent heterocyclic group, more preferably an alkyl group or an aryl group, further preferably an aryl group.

In the general formula (B-7), $R^9$ is preferably an alkyl group, an aryl group or a monovalent heterocyclic group, more preferably an alkyl group or an aryl group, further preferably an aryl group.

In the general formula (B-8), $R^{10}$, $R^{15}$ and $R^{16}$ are each preferably an alkyl group, an aryl group or a monovalent heterocyclic group, more preferably an alkyl group or an aryl group, further preferably an aryl group. In addition, d is preferably 0 or 1, more preferably 1.

In the general formula (B-9), $R^{11}$, $R^{12}$, $R^{15}$ and $R^{16}$ are each preferably an alkyl group, an aryl group or a monovalent heterocyclic group, more preferably an alkyl group or an aryl group, further preferably an aryl group. In addition, d is preferably 0 or 1, more preferably 1.

In the general formula (B-10), $R^{13}$, $R^{14}$, $R^{15}$ and $R^{16}$ are each preferably an alkyl group, an aryl group or a monovalent heterocyclic group, more preferably an alkyl group or an aryl group, further preferably an aryl group. In addition, d is preferably 0 or 1, more preferably 1.

[Repeating Unit C]

As examples of $Ar^6$ in the general formula (C), those having been provided as examples of the above-mentioned $Ar^1$ can be provided. In addition, in the general formula (C), $R^3$ and $R^4$ are each preferably a hydrogen atom, an alkyl group or an aryl group, more preferably a hydrogen atom or an aryl group.

Examples of the repeating unit C include repeating units represented by the following formulae (C-1), (C-2), (C-3), (C-4), (C-5), (C-6), (C-7), (C-8) and (C-9).

[Chemical Formula 11]

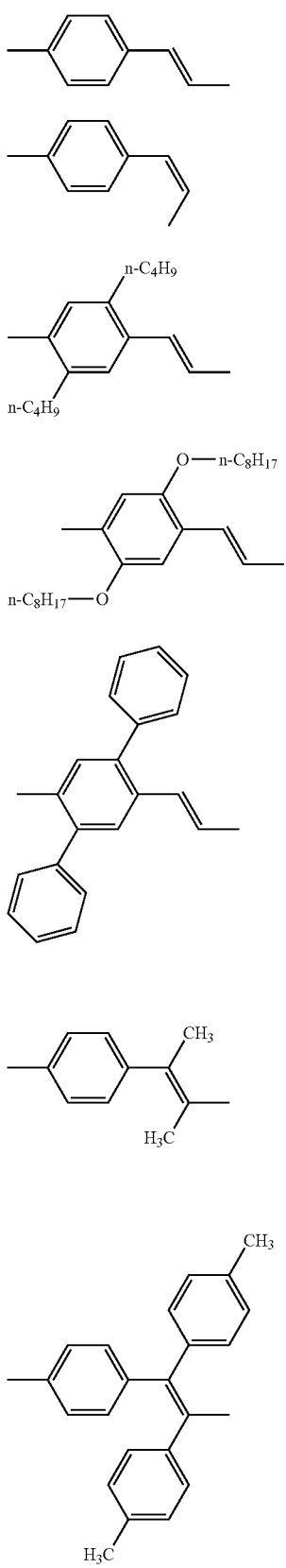

(C-1)
(C-2)
(C-3)
(C-4)
(C-5)
(C-6)
(C-7)

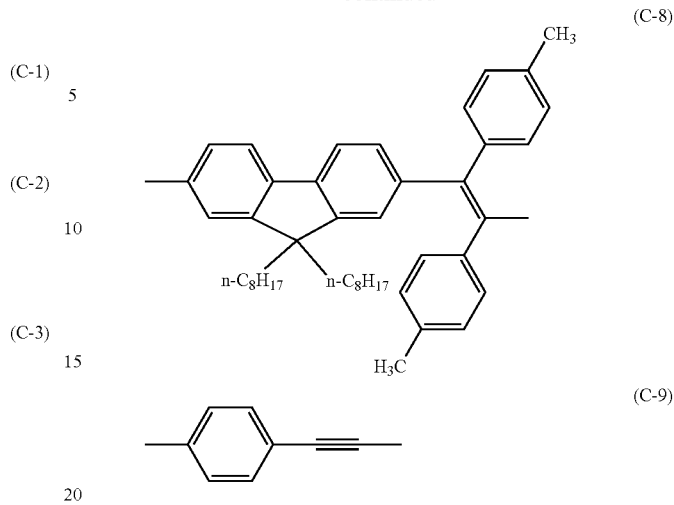

(C-8)

(C-9)

(Blue Light Emitting Compound)

The blue light emitting compound is preferably a compound having a molecular weight of 5000 or less, and has a blue light emitting part. The blue light emitting compound preferably shows blue light emission having a highest light emission maximum in a wavelength range of 420 to 480 nm, and more preferably shows blue light emission having a highest light emission maximum in a wavelength range of 440 to 470 nm. If the highest light emission maximum is at the side of wavelengths shorter than 480 nm, color purity is easily improved when the blue light emitting compound is used in a display unit such as a display. Also, if maximum light emitting intensity is at the side of wavelengths longer than 420 nm, light emitting efficiency is easily increased because of high visual sensitivity.

The blue light emitting compound may have fluorescence emission or phosphorescence emission.

Examples of the blue light emitting compound having phosphorescence emission include complexes containing a heavy metal as a central metal. The heavy metal is preferably iridium, platinum, gold, europium, terbium or the like. Examples of such blue light emitting compound include complexes represented by the following formula (4).

[Chemical Formula 12]

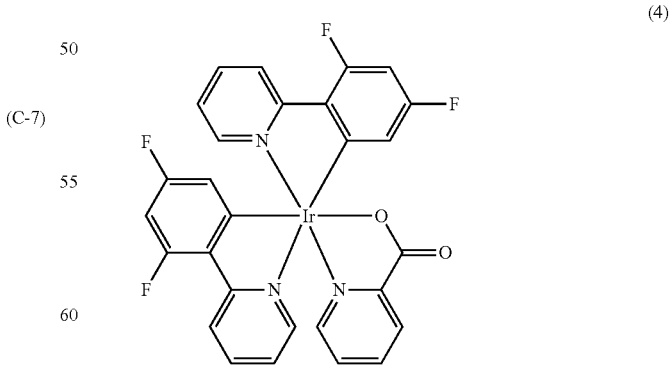

(4)

As the blue light emitting compound having fluorescence emission, the structure thereof is not necessarily limited, but compounds having a structure in which two or more hydrocarbon aromatic rings are fused, or a heterocyclic structure are preferable, and among them, more preferable are compounds having a structure in which two or more hydrocarbon aromatic rings are fused. Further preferable are compounds having a structure in which three or more hydrocarbon aromatic rings are fused.

Examples of the structures in which two or more hydrocarbon aromatic rings are fused include a naphthalene backbone, an anthracene backbone, a phenanthrene backbone, a triphenylene backbone, a chrysene backbone, a fluoranthene backbone, a benzofluoranthene backbone, a pyrene backbone, and a perylene backbone. Among them, preferable are an anthracene backbone, a phenanthrene backbone, a fluoranthene backbone, a benzofluoranthene backbone, a pyrene backbone and a perylene backbone, and more preferable are an anthracene backbone, a benzofluoranthene backbone, a pyrene backbone and a perylene backbone.

One or more groups may be bound to the structure in which two or more hydrocarbon aromatic rings are fused, and examples of such groups include an alkyl group, an alkoxy group, an aryl group, an aryloxy group, an arylalkyl group, an arylalkoxy group, an arylalkenyl group, an arylalkynyl group, a halogen atom, an acyl group, an acyloxy group, a monovalent heterocyclic group, a carboxyl group, a nitro group, and a cyano group. Among them, preferable are an alkyl group, an aryl group, an arylalkyl group, a halogen atom and a cyano group, and more preferable are an alkyl group, an aryl group and an arylalkyl group.

Examples of the blue light emitting compound include compounds represented by the following general formulae (5-1), (5-2), (5-3), (5-4), (5-5), (5-6), (5-7), (5-8), (5-9), (5-10) or (5-11):

[Chemical Formula 13]

(5-1)

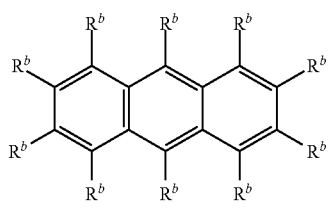

(5-2)

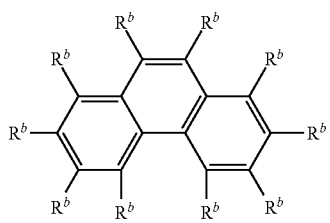

(5-3)

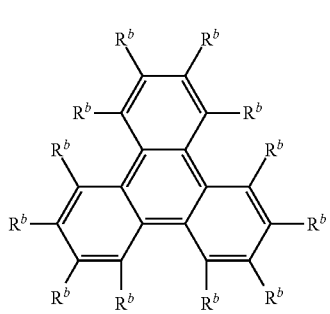

(5-4)

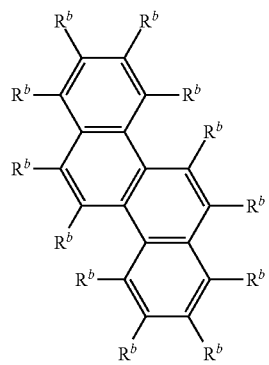

(5-5)

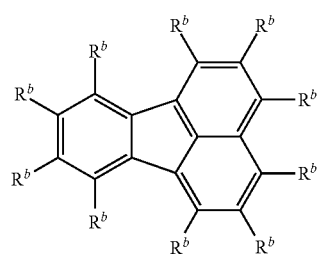

(5-6)

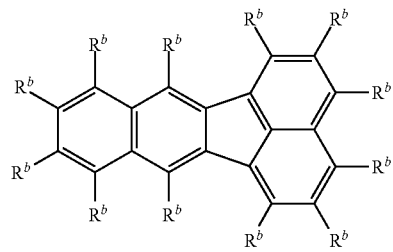

(5-7)

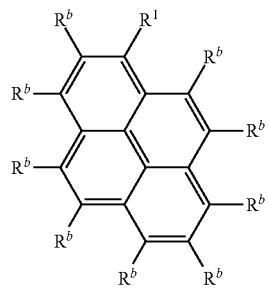

(5-8)

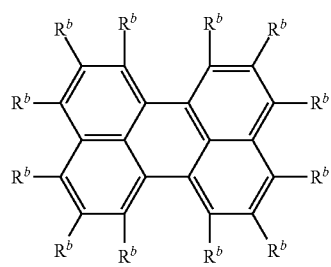

-continued (5-9)

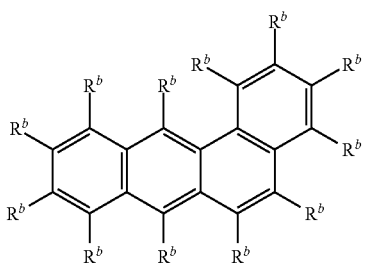

[Chemical Formula 14]

(5-10)

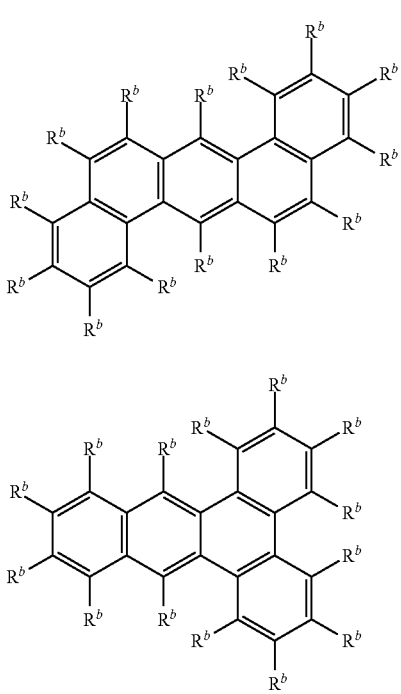

(5-11)

wherein $R^b$ present in a plural number may be same or different, and is preferably an alkyl group, an aryl group, an arylalkyl group, a halogen atom or a cyano group, more preferably an alkyl group, an aryl group, an arylalkyl group or a halogen atom. More specific examples of $R^b$ include a phenyl group, a tolyl group, a 1-naphthyl group, a 2-naphthyl group, a methoxy group, a methyl group, an ethyl group, an n-propyl group, a tertert-butyl group and groups represented by the following formulae (6-1), (6-2), (6-3), (6-4) and (6-5).

[Chemical Formula 15]

(6-1)

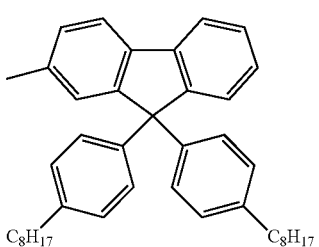

(6-2)

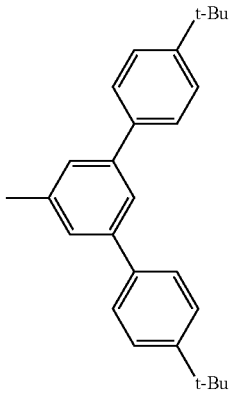

(6-3)

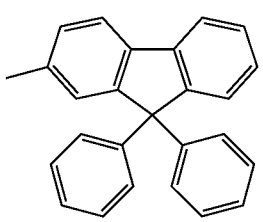

(6-4)

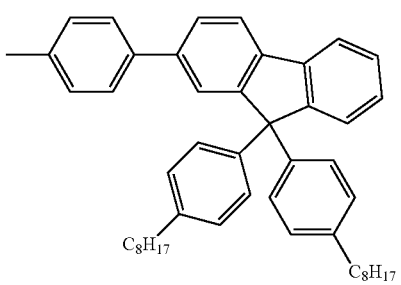

(6-5)

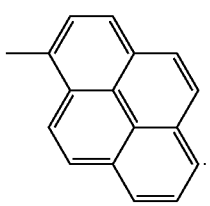

More specific examples of the blue light emitting compound include compounds represented by the following formulae (7-1), (7-2), (7-3), (7-4), (7-5), (7-6), (7-7), (7-8), (7-9), (7-10), (7-11), (7-12) and (7-13).

[Chemical Formula 16]
(7-1)
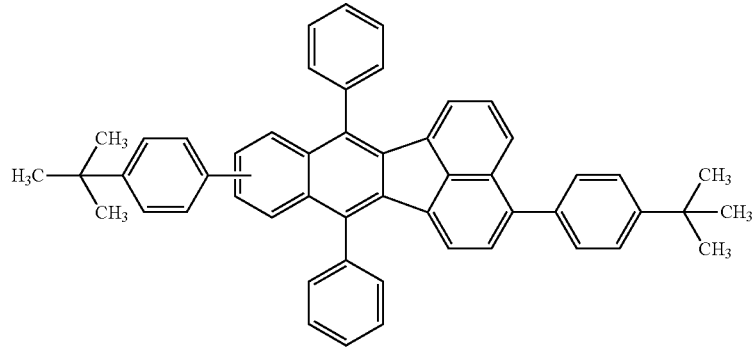
(7-2)
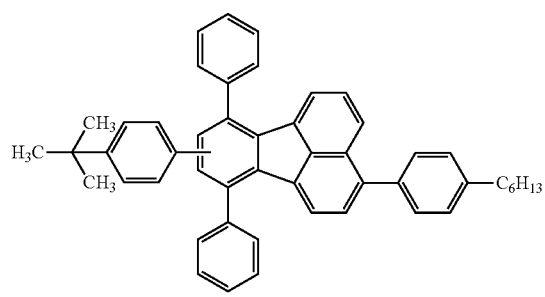
(7-3)
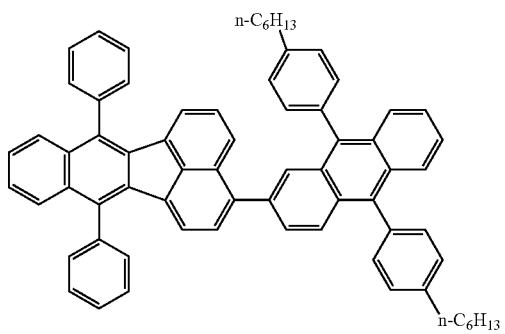
(7-4)
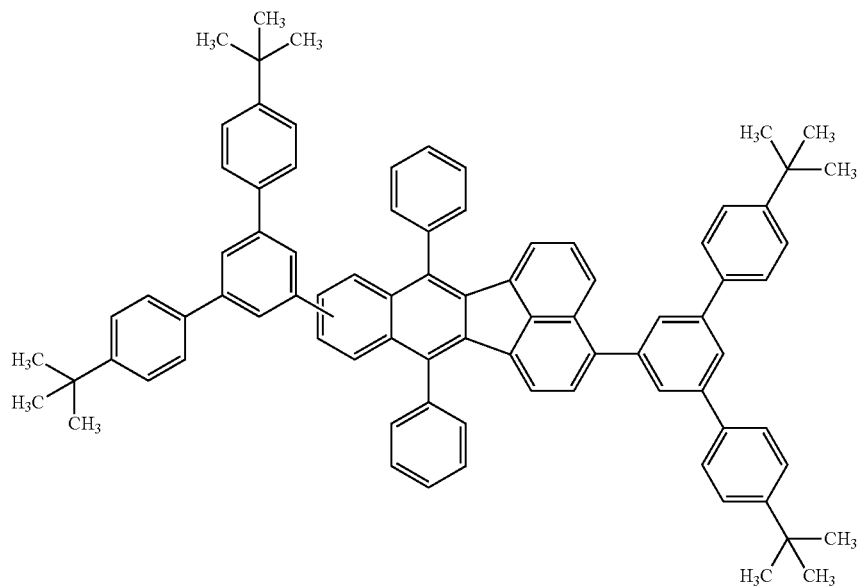

(7-5)
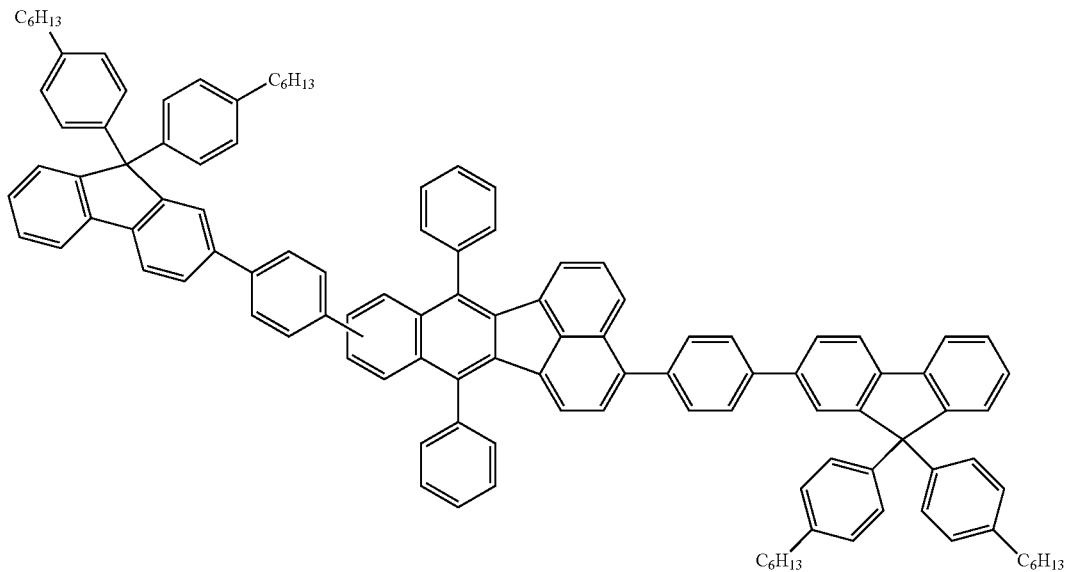
(7-6)
(7-7)
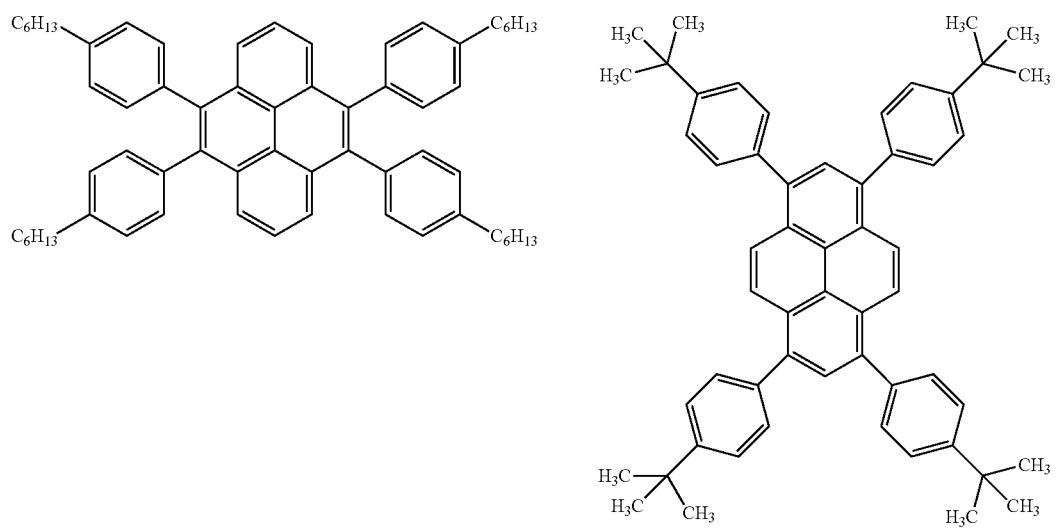
(7-8)
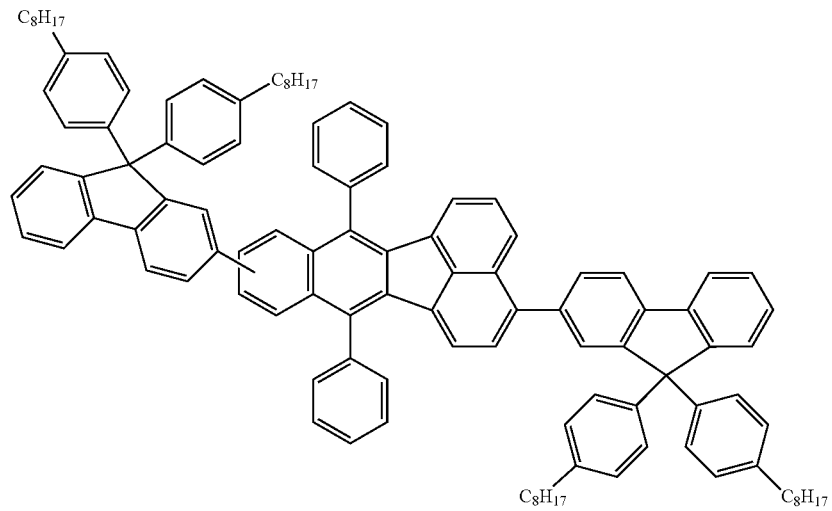

[Chemical Formula 17]

(7-9)

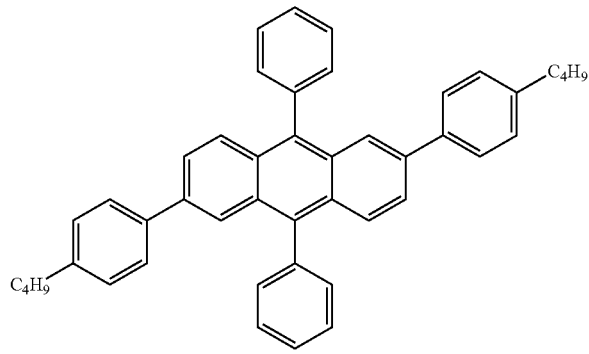

(7-10)

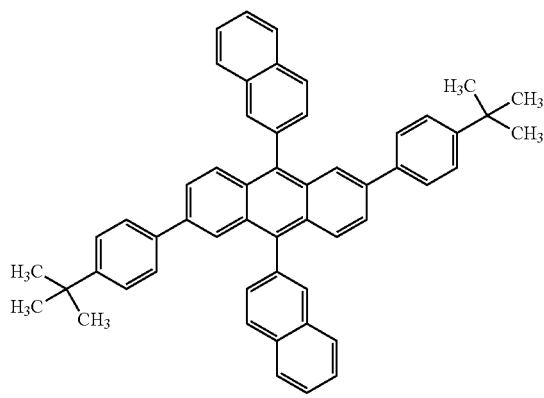

(7-11)

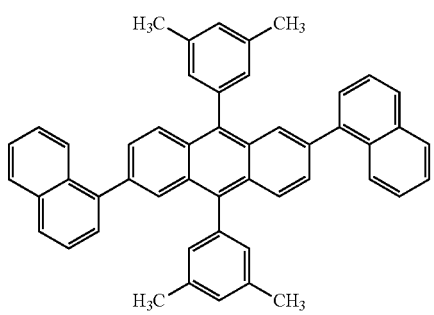

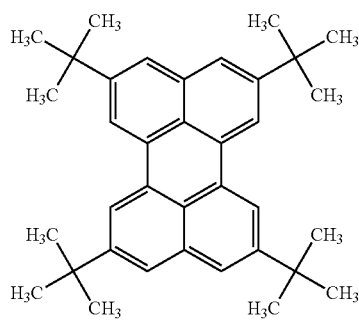

(7-13)

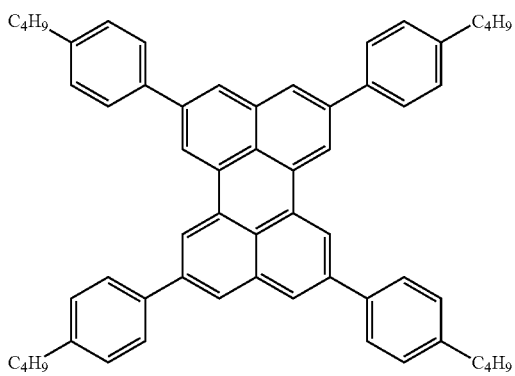

In the first light emitting material, preferably, the blue light emitting compound principally receives excitation energy formed when electrons and holes are bound in the conjugated polymer and emits light. For adequately receiving energy, peak wavelength ($\lambda_1$) of light emission present at the shortest wavelength side in the conjugated polymer and peak wavelength ($\lambda_2$) of light emission present at the shortest wavelength side in the blue light emitting compound are preferably moderately apart from each other in a wavelength range of 350 nm to 500 nm, but when considering a charge balance between holes and electrons and charge transportability, preferable is $\lambda_2-\lambda_1 \leq 50$ nm for adequately maintaining the charge balance, keeping excellent stability and transferring energy from the conjugated polymer to the blue light emitting compound.

Specific examples of combinations of the conjugated polymer and the blue light emitting compound in the first light emitting material include the following. In this specific example, the conjugated polymer is made of a repeating unit represented by the following formula (U1) and a repeating unit represented by the following formula (U2). In addition, the blue light emitting compound is a compound represented by the following formula ($E_1$).

[Chemical Formula 18]

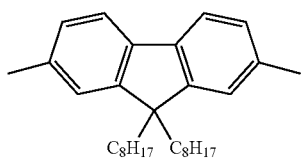
(U1)

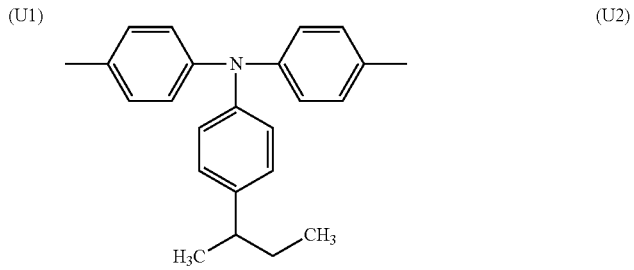
(U2)

[Chemical Formula 19]

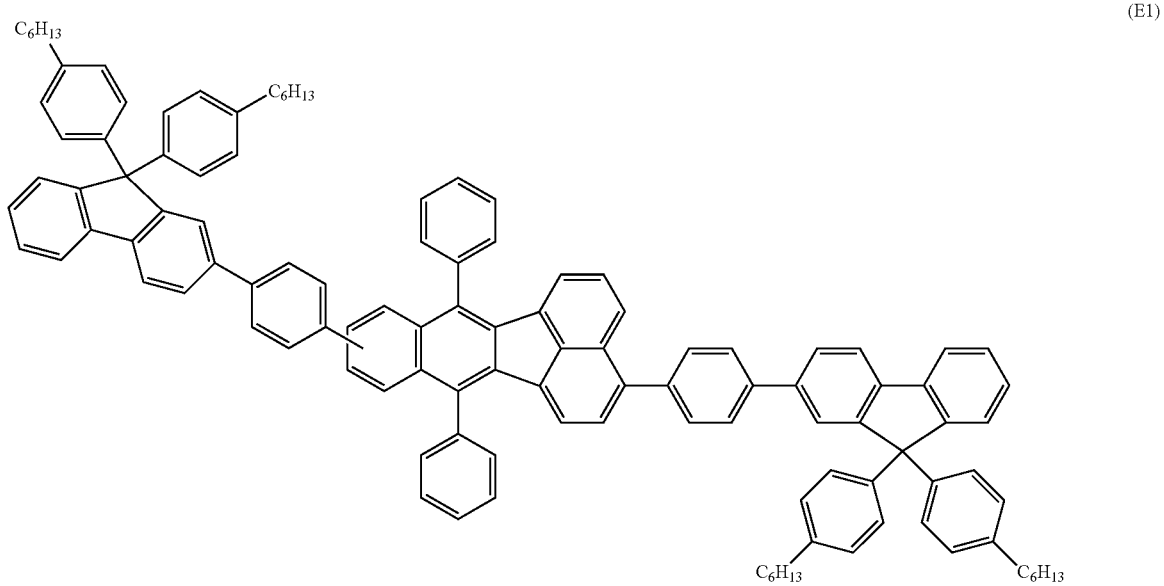
(E1)

In this specific example, where the molar ratio of the repeating unit represented by the formula (U1) is $m_1$, the molar ratio of the repeating unit represented by the formula (U2) is $m_2$, and $m_1+m_2=100$, preferable is $50 \le m_1 \le 99$, $1 \le m_2 \le 50$, more preferable is $70 \le m_1 \le 98$, $2 \le m_2 \le 30$, and more preferable is $80 \le m_1 \le 97$, $3 \le m_2 \le 20$.

Also, in this specific example, where the content ratio (mass ratio) of the conjugated polymer in the light emitting material is $n_1$, the content ratio (mass ratio) of the blue light emitting compound is $n_2$, and $n_1+n_2=100$, preferable is $0.1 \le n_2 \le 30.0$, $70.0 \le n_1 \le 99.9$, more preferable is $0.5 \le n_2 \le 20.0$, $80.0 \le n_1 \le 99.5$, further preferable is $0.7 \le n_2 \le 15.0$, $85.0 \le n_1 \le 99.3$, and especially preferable is $1.0 \le n_2 \le 10.0$, $90.0 \le n_1 \le 99.0$.

(Second Light Emitting Material)

The second light emitting material has a conjugated part and a blue light emitting part present in the same compound, and the compound is a conjugated polymer. Examples of such conjugated polymer include conjugated polymers having a repeating unit having been provided as an example of the repeating unit of the conjugated polymer in the first light emitting material and a repeating unit made of a blue light emitting part. Also, the conjugated polymer may be a conjugated polymer having a main chain same as that of the conjugated polymer in the first light emitting material and having a blue light emitting part as a side chain or a substituent. The conjugated polymer may have one or more blue light emitting parts.

Examples of the blue light emitting part include atom groups constituted by removing one or two of substituents bound to an aromatic ring in the blue light emitting compound. Examples of such atom group include atom groups constituted by removing one or more of Rb present in a plural number from a compound represented by the general formula (5-1), (5-2), (5-3), (5-4), (5-5), (5-6), (5-7), (5-8), (5-9), (5-10) or (5-11).

Examples of the conjugated polymer in the second light emitting material include conjugated polymers having as a repeating unit or a structure unit a structure represented by the following general formula (8). Further, "having as a repeating unit" means having a plurality of such structures in a molecule, and "having as a structure unit" means having one such structure in a molecule.

[Chemical Formula 20]

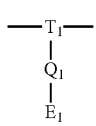

(8)

In the formula, $T_1$ represents a repeating unit or a constitutional unit of the conjugated polymer, $Q_1$ represents a direct bond or a bivalent group, and $E_1$ represents a blue light emitting part.

Examples of $T_1$ include the above-mentioned constitutional unit A, constitutional unit B, and constitutional unit C. In addition, $Q_1$ is preferably an arylene group or an alkylene group. Examples of $E_1$ include groups of atoms constituted by removing one of the substituents bound to an aromatic ring in the blue light emitting compound. More specific examples of $E_1$ include groups of atoms constituted by removing one of a plurality of $R^b$'s from a compound represented by the general formula (5-1), (5-2), (5-3), (5-4), (5-5), (5-6), (5-7), (5-8), (5-9), (5-10) or (5-11).

In addition, examples of the conjugated polymer in the second light emitting material include a conjugated polymer represented by the following general formula (9):

[Chemical Formula 21]

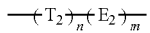

(9)

wherein $T_2$ represents a repeating unit of the conjugated polymer, $E_2$ represents a repeating unit made of a blue light emitting part, and n and m each independently represent an integer of 1 or greater.

Examples of $T_2$ include the above-mentioned constitutional unit A, constitutional unit B, and constitutional unit C. Examples of $E_1$ include groups of atoms constituted by removing two of substituents bound to an aromatic ring in the blue light emitting compound. More specifically, examples of $E_1$ include groups of atoms constituted by removing two of a plurality of $R^b$'s from a compound represented by the general formula (5-1), (5-2), (5-3), (5-4), (5-5), (5-6), (5-7), (5-8), (5-9), (5-10) or (5-11). n and m each represent a composition ratio in the polymer.

Examples of the blue light emitting part included as a constitutional unit or a repeating unit of the conjugated polymer, i.e. $E_2$, include structures represented by the following formulae (10-1), (10-2), (10-3), (10-4), (10-5), (10-6), (10-7), (10-8), (10-9), (10-10) and (10-11).

[Chemical Formula 22]

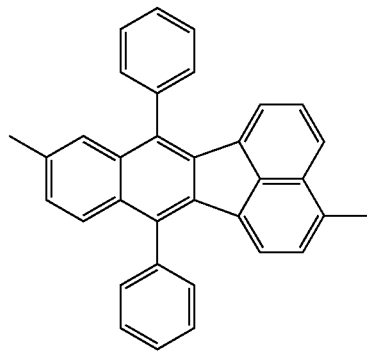

(10-1)

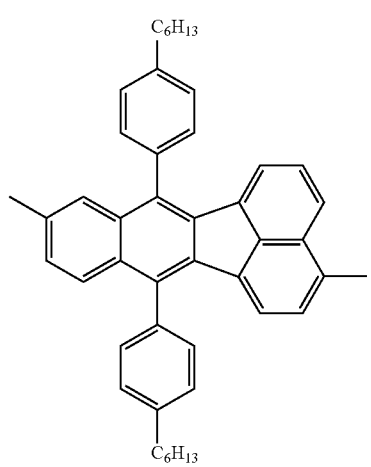

(10-2)

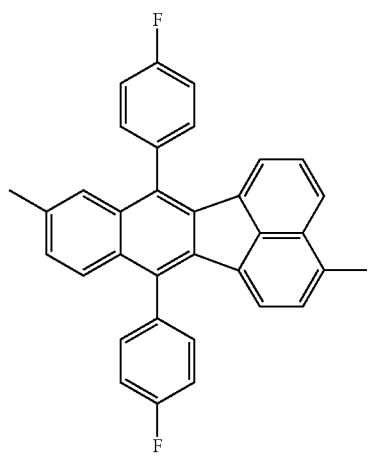

(10-3)

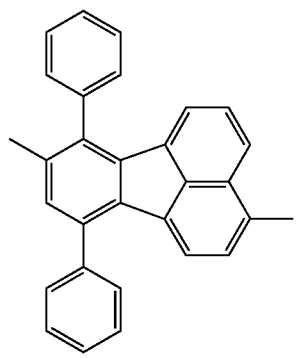

(10-4)

(10-5) 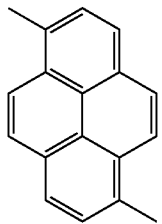

(10-6) 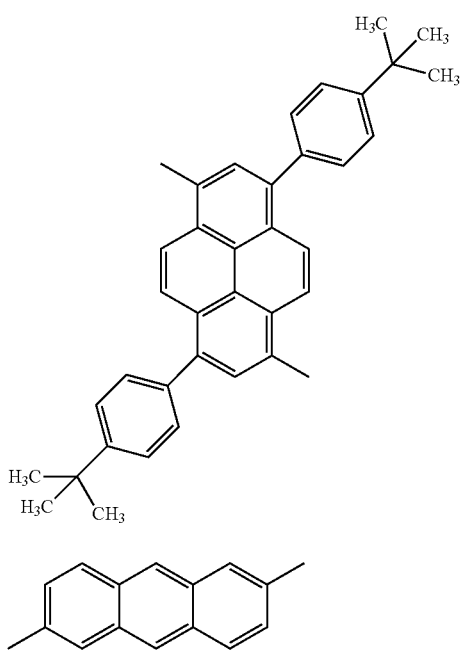

(10-7) 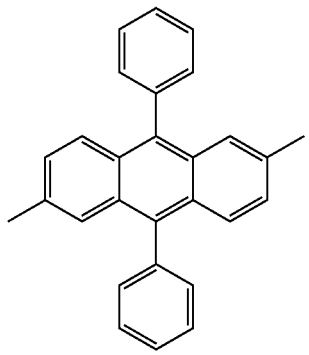

(10-8)

(10-9) 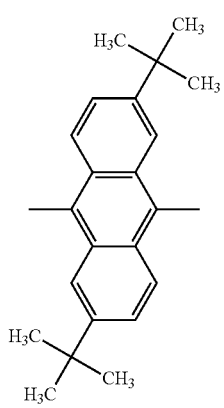

(10-10) 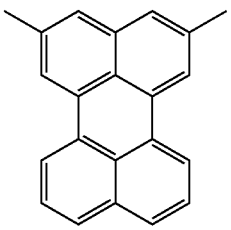

(10-11) 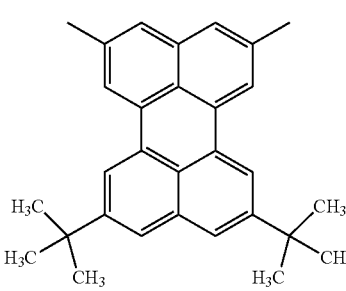

Preferably, the blue light emitting part principally receives excitation energy formed when electrons and holes are bound in the conjugated part, and emits light. For adequately receiving energy, peak wavelength ($\lambda_1$) of light emission present at the shortest wavelength side in the conjugated part and peak wavelength ($\lambda_2$) of light emission present at the shortest wavelength side in the blue light emitting part are preferably moderately apart from each other in a wavelength range of 350 nm to 500 nm, but when considering a charge balance between holes and electrons and charge transportability, preferable is $\lambda_2 - \lambda_1 \leq 50$ nm for adequately maintaining the charge balance, keeping excellent stability and transferring energy from the conjugated part to the blue light emitting part.

In the second light emitting material, the weight ratio of the blue light emitting part to the conjugated part (remainder left after removing the blue light emitting part from the conjugated compound) is preferably 99.9:0.1 to 70.0:30.0, more preferably 99.5:0.5 to 80.0:20.0, further preferably 99.3:0.7 to 85.0:15.0, especially preferably 99.0:1.0 to 90.0:10.0.

<Composition>

The light emitting material according to this embodiment can be formed into a composition by combining the light emitting material with at least one material selected from the group consisting of hole transport materials and electron transport materials. It is considered that in such a composition, the hole transport material and the electron transport material principally play a role of adjusting a charge balance, and binding of charges occurs in the conjugated part. Therefore, in this composition, an effect according to the present invention is exhibited if only the light emitting material satisfies the formula (1).

Examples of the hole transport material include polyvinylcarbazole and derivatives thereof, polysilane and derivatives thereof, polysiloxane derivatives having an aromatic amine in a side chain or a main chain, pyrazoline derivatives, arylamine derivatives, stilbene derivatives, triphenyldiamine derivatives, polyaniline and derivatives thereof, polythiophene and derivatives thereof, polypyrrole and derivatives thereof, poly(p-phenylenevinylene) and derivatives thereof, poly(2,5-thienylenevinylene) and derivatives thereof. Further examples include those described in Japanese Patent Laid-open Publication Nos. 563 (1988)-70257, S63 (1988)-175860, H2 (1990)-135359, H2 (1990)-135361, H2 (1990)-209988, H3 (1991)-37992 and H3 (1991)-152184.

The content ratio of the hole transport material in the composition according to this embodiment is preferably 3 to 30 parts by weight, more preferably 3 to 20 parts by weight, especially preferably 3 to 10 parts by weight based on 100 parts by weight of light emitting material from the viewpoint of the charge balance.

Examples of the electron transport material include oxadiazole derivatives, anthraquinodimethane and derivatives thereof, benzoquinone and derivatives thereof, naphthoquinone and derivatives thereof, anthraquinone and derivatives thereof, tetoracyanoanthraquinonedimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof, polyfluorene and derivatives thereof. Further examples include those described in Japanese Patent Laid-open Publication Nos. S63 (1988)-70257, S63 (1988)-175860, H2 (1990)-135359, H2 (1990)-135361, H2 (1990)-209988, H3 (1991)-37992 and H3 (1991)-152184.

The content ratio of the electron transport material in the composition according to this embodiment is preferably 5 to 50 parts by weight, more preferably 5 to 30 parts by weight, especially preferably 5 to 20 parts by weight based on 100 parts by weight of light emitting material from the viewpoint of the charge balance.

The light emitting material or the composition according to this embodiment can be formed into a solution or a dispersion liquid (hereinafter, referred to simply as a "solution") by including an organic solvent. By forming the material or the composition into a solution, a film can be formed by a coating method. This solution is generally called an ink composition, a liquid composition or the like.

Examples of the organic solvent include chlorine-based solvents, such as chloroform, methylene chloride, 1,2-dichloroethane, 1,1,2-trichloroethane, chlorobenzene, and o-dichlorobenzene, ether-based solvents, such as tetrahydrofurane and dioxane, aromatic hydrocarbon-based solvents, such as toluene, xylene, trimethylbenzene, and mesitylene, aliphatic hydrocarbon-based solvents, such as cyclohexane, methylcyclohexane, n-pentane, n-hexane, n-heptane, n-octane, n-nonane, and n-decane, ketone-based solvents, such as acetone, methyl ethyl ketone, and cyclohexanone, ester-based solvents, such as ethyl acetate, butyl acetate, methyl benzoate, and ethyl cellosolve acetate, polyalcohols, such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, and 1,2-hexanediol and derivatives thereof, alcoholic solvents, such as methanol, ethanol, propanol, isopropanol, and cyclohexanol, sulfoxide-based solvents, such as dimethylsulfoxide, and amide-based solvents, such as N-methyl-2-pyrolidone, and N,N-dimethylformamide. Further, these solvents may be used alone or in combination of two or more kinds. Among these solvents, it is preferable to include organic solvents having a structure including a benzene ring, and having a melting point of 0° C. or lower and boiling point of 100° C. or higher from the viewpoint of viscosity, film-forming property and so on.

If the light emitting material according to this embodiment includes an organic solvent, it is only necessary to remove the organic solvent by drying after applying the light emitting material for laminating/forming a thin film made of the light emitting material, which is very advantageous in manufacture. Further, for drying, the light emitting material may be dried with heating to about 50 to 150° C. or dried under a reduced pressure of about $10^{-3}$ Pa.

For lamination and film formation, there can be used coating methods such as a spin coating method, a casting method, a micro-gravure coating method, a gravure coating method, a bar coating method, a roll coating method, a wire bar coating method, a dip coating method, a slit coating method, a capillary coating method, a spray coating method, a screen printing method, a flexographic printing method, an offset printing method, an inkjet printing method, and a nozzle coating method.

If the light emitting material according to this embodiment includes an organic solvent, preferred viscosity of the solution varies depending on the printing method, but is preferably in a range of 0.5 to 500 mPa·s at 25° C., and viscosity is preferably in a range of 0.5 to 20 mPa·s at 25° C. for preventing clogging and deflection during jetting in the case of a printing method in which a solution passes through a jetting apparatus, such as an inkjet printing method or the like.

<Thin Film>

The thin film according to this embodiment is made of a light emitting material. Such a thin film can be easily produced from the above-mentioned solution by the method described above. Such a thin film is made of the light emitting material, and therefore is suitable as a light emitting layer of a light emitting device, and a light emitting device comprising the thin film as a light emitting layer has an improved luminous lifetime.

<Light Emitting Device>

The light emitting device according to this embodiment comprises an anode, a cathode and a layer provided between these electrodes and containing the light emitting material. Here, the layer containing the light emitting material functions as a light emitting layer. The light emitting device according to this embodiment is preferably a white light emitting device constituted by laminating a plurality of light emitting layers including a blue light emitting layer, characterized by comprising as the blue light emitting layer a light emitting layer made of the thin film. The light emitting device according to this embodiment is preferably an organic electroluminescence device.

Constitutions of the light emitting device according to this embodiment include the following constitutions a) to d).

a) anode/light emitting layer/cathode b) anode/hole transport layer/light emitting layer/cathode c) anode/light emitting layer/electron transport layer/cathode d) anode/hole transport layer/light emitting layer/electron transport layer/cathode (Here, / means that the layers are laminated adjacent to one another. The same applies hereinbelow.)

Further, the light emitting layer is a layer having a function of emitting light, the hole transport layer is a layer having a function of transport holes, and the electron transport layer is a layer having a function of transport electrons. The hole transport layer and the electron transport layer are collectively called a charge transport layer. In addition, the hole transport layer adjacent to the light emitting layer is called an interlayer layer in some cases.

Lamination/film formation of the layers can be carried out from a solution. For lamination/film formation from a solution, there can be used coating methods such as a spin coating method, a casting method, a micro-gravure coating method, a gravure coating method, a bar coating method, a roll coating method, a wire bar coating method, a dip coating method, a slit coating method, a capillary coating method, a spray coating method, a screen printing method, a flexographic printing method, an offset printing method, an inkjet printing method, and a nozzle coating method.

Film thickness of the light emitting layer may be selected so that the driving voltage and light emitting efficiency become appropriate values, but is normally 1 nm to 1 µm, preferably 2 nm to 500 nm, further preferably 5 nm to 200 nm.

If the light emitting device according to this embodiment has a hole transport layer, examples of the hole transport material used include materials same as those described above. Film formation of the hole transport layer may be carried out by any method, but if the hole transport material is a small molecule compound, it is preferable to form a film from a mixed solution with a polymer binder. If the hole transport material is a polymer compound, it is preferable to form a film from a solution. For film formation from a solution, a method provided as an example of a coating method may be used.

The polymer binder that is mixed is preferably one that does not extremely hinder charge transportation, and does not have strong absorption of visible light. Examples of the polymer binder include polycarbonate, polyacrylate, polymethyl acrylate, polymethyl methacrylate, polystyrene, polyvinyl chloride, and polysiloxane.

Film thickness of the hole transport layer may be selected so that the driving voltage and light emitting efficiency become appropriate values, but at least a thickness at which no pin hole is produced is required, and too large a thickness is not preferable because the driving voltage of the device increases. Thus, film thickness of the hole transport layer is normally 1 nm to 1 µm, preferably 2 nm to 500 nm, further preferably 5 nm to 200 nm.

If the light emitting device according to this embodiment has an electron transport layer, examples of the electron transport material used include materials same as those described above. Film formation of the electron transport layer may be carried out by any method, but if the electron transport material is a small molecule compound, a vacuum deposition method from a powder, and a method by film formation from a solution or a molten state are preferable. If the electron transport material is a polymer compound, a method by film formation from a solution or a molten state is preferable. For film formation from a solution or a molten state, a polymer binder may be used in combination. For film formation from a solution, a method provided as an example of a coating method may be used.

The polymer binder that is mixed is preferably one that does not extremely hinder charge transportation, and does not have strong absorption of visible light. Examples of the polymer binder include poly(N-vinylcarbazole), polyaniline and derivatives thereof, polythiophene and derivatives thereof, poly(p-phenylenevinylene) and derivatives thereof, poly(2,5-thienylvinylene) and derivatives thereof, polycarbonate, polyacrylate, polymethylacrylate, polymethylmethacrylate, polystyrene, polyvinyl chloride, and polysiloxane.

Film thickness of the electron transport layer may be selected so that the driving voltage and light emitting efficiency become appropriate values, but at least a thickness at which no pin hole is produced is required, and too large a thickness is not preferable because the driving voltage of the device increases. Thus, film thickness of the electron transport layer is normally 1 nm to 1 µm, preferably 2 nm to 500 nm, further preferably 5 nm to 200 nm.

In addition, among charge transport layers provided adjacent to the electrode, those having a function of improving efficiency of charge injection from the electrode and having an effect of lowering the driving voltage of the device are particularly called a charge injection layer (hole injection layer, electron injection layer) in some cases. Moreover, the charge injection layer or an insulating layer may be provided adjacent to the electrode for improvement of adhesive properties with the electrode and improvement of injection of charges from the electrode, or a thin buffer layer may be inserted into an interface of the charge transport layer or the light emitting layer for improvement of adhesive properties of the interface, prevention of mixing and the like. Further, the order and the number of layers to be laminated and thickness of each layer may be selected as appropriate in consideration of the light emitting efficiency and device life.

The light emitting devices provided with a charge injection layer include those having the following structures e) to p).

e) anode/charge injection layer/light emitting layer/cathode f) anode/light emitting layer/charge injection layer/cathode g) anode/charge injection layer/light emitting layer/charge injection layer/cathode h) anode/charge injection layer/hole transport layer/light emitting layer/cathode i) anode/hole transport layer/light emitting layer/charge injection layer/cathode j) anode/charge injection layer/hole transport layer/light emitting layer/charge injection layer/cathode k) anode/charge injection layer/light emitting layer/charge transport layer/cathode l) anode/light emitting layer/electron transport layer/charge injection layer/cathode m) anode/charge injection layer/light emitting layer/electron transport layer/charge injection layer/cathode n) anode/charge injection layer/hole transport layer/light emitting layer/charge transport layer/cathode o) anode/hole transport layer/light emitting layer/electron transport layer/charge injection layer/cathode p) anode/charge injection layer/hole transport layer/light emitting layer/electron transport layer/charge injection layer/cathode Examples of the charge injection layer include a layer including an electrically conductive polymer, a layer provided between the anode and the hole transport layer and including a material having an ionization potential of a medium value between ionization potentials of an anode material and a hole transport material included in the hole transport layer, and a layer provided between the cathode and the electron transport layer and including a material having an electron affinity of a medium value between electron affinities of a cathode material and an electron transport material included in the electron transport layer.

If the charge injection layer is a layer including an electrically conductive polymer, the electric conductivity of the electrically conductive polymer is preferably $10^{-5}$ S/cm to $10^3$ S/cm, and is more preferably $10^{-5}$ S/cm to $10^2$ S/cm, further preferably $10^{-5}$ S/cm to $10^1$ S/cm for reducing a leak current between light emitting pixels. For satisfying such a range, the electrically conductive polymer may be doped with an appropriate amount of ions.

The types of ions to be doped is an anion for the hole injection layer and a cation for the electron injection layer. Examples of the anion include a polystyrenesulfonic acid ion, an alkylbenzenesulfonic acid ion, and a camphorsulfonic acid ion, and examples of the cation include a lithium ion, a sodium ion, a potassium ion, and a tetrabutyl ammonium ion.

Film thickness of the charge injection layer is, for example, 1 to 100 nm, preferably 2 to 50 nm.

The material to be used for the charge injection layer may be appropriately selected in relation to the electrode and a material of an adjacent layer, and examples of the material include polyaniline and derivatives thereof, polythiophene and derivatives thereof, polypyrrole and derivatives thereof, polyphenylenevinylene and derivatives thereof, polythienylenevinylene and derivatives thereof, polyquinoline and derivatives thereof, polyquinoxaline and derivatives thereof, electrically conductive polymers such as polymers having an aromatic amine structure in the main chain or side chain, metal phthalocyanines (e.g., copper phthalocyanine), and carbon.

The insulating layer has a function of facilitating charge injection. Average thickness of the insulating layer is normally 0.1 to 20 nm, preferably 0.5 to 10 nm, more preferably 1 to 5 nm.

Examples of a material used for the insulating layer include metal fluorides, metal oxides, and organic insulating materials.

Examples of the light emitting device provided with an insulating layer include those having the following structures q) to ab).

q) anode/insulating layer/light emitting layer/cathode
r) anode/light emitting layer/insulating layer/cathode
s) anode/insulating layer/light emitting layer/insulating layer/cathode
t) anode/insulating layer/hole transport layer/light emitting layer/cathode
u) anode/hole transport layer/light emitting layer/insulating layer/cathode
v) anode/insulating layer/hole transport layer/light emitting layer/insulating layer/cathode
w) anode/insulating layer/light emitting layer/electron transport layer/cathode
x) anode/light emitting layer/electron transport layer/insulating layer/cathode
y) anode/insulating layer/light emitting layer/electron transport layer/insulating layer/cathode
z) anode/insulating layer/hole transport layer/light emitting layer/electron transport layer/cathode
aa) anode/hole transport layer/light emitting layer/electron transport layer/insulating layer/cathode
ab) anode/insulating layer/hole transport layer/light emitting layer/electron transport layer/insulating layer/cathode The substrate that forms the light emitting device according to this embodiment may be any substrate as long as it does not change when layers of an electrode and an organic substance are formed, and examples thereof include substrates of glass, plastic, polymer films, and silicon. In the case of a nontransparent substrate, an electrode closer to the substrate and an opposite electrode are preferably transparent or semitransparent.

In this embodiment, normally at least one of electrodes including an anode and a cathode is transparent or semitransparent, and preferably the electrode at the anode side is transparent or semitransparent.

As a material of the anode, an electrically conductive metal oxide film, a semitransparent metal thin film or the like is used, and specifically a film prepared using an electrically conductive inorganic compound including indium oxide, zinc oxide, tin oxide, and indium/tin/oxide (ITO), indium/zinc/oxide or the like that is a complex thereof, NESA, gold, platinum, silver, copper or the like is used. Also, an organic transparent electrically conductive film of polyaniline and a derivative thereof, polythiophene and a derivative thereof, or the like may be used as an anode. Also, a layer made of a phthalocyanine derivative, an electrically conductive polymer, carbon or the like, or a layer made of a metal oxide, a metal fluoride, an organic insulating material or the like may be provided on the anode for facilitating charge injection.

Examples of a method for preparing an anode include a vacuum deposition method, a sputtering method, an ion plating method, and a plating method.

Film thickness of the anode may be selected as appropriate in consideration of light transmittance and electric conductivity, but is normally 10 nm to 10 µm, preferably 20 nm to 1 µm, further preferably 50 nm to 500 nm.

As a material of the cathode, a material having a small work function is preferable, and a metal such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium or the like, an alloy of two or more of these metals, an alloy of one or more of these metals with one or more of gold, silver, platinum, copper, manganese, titanium, cobalt, nickel, tungsten and tin, graphite, a graphite intercalation compound or the like is used.

As an method for preparing a cathode, a vacuum deposition method, a sputtering method, a lamination method of thermocompression-binding a metal thin film, or the like is used.

Film thickness of the cathode may be selected as appropriate in consideration of electric conductivity and durability, but is normally 10 nm to 10 µm, preferably 20 nm to 1 µm, further preferably 50 nm to 500 nm.

Also, a layer made of an electrically conductive polymer or a layer made of a metal oxide, a metal fluoride, an organic insulating material or the like may be provided between the cathode and the light emitting layer or the cathode and the electron transport layer, or a protective layer for protecting the light emitting device may be mounted after preparation of the cathode. For using the light emitting device with stability for a long time period, a protective layer and/or a protective cover are preferably mounted for protecting the light emitting device from outside.

As the protective layer, a resin, a metal oxide, a metal fluoride, a metal boride or the like may be used. In addition, as the protective cover, a glass plate, a plastic plate with the surface subjected to a water permeability reducing treatment, or the like may be used, and a method is suitably used in which the protective cover is laminated with a device substrate by a thermosetting resin or a photocurable resin to perform sealing. If a space is maintained using a spacer, the device is easily prevented from being scratched. If an inert gas such as nitrogen, argon or the like is filled in the space, oxidation of the cathode can be prevented, and further by placing a drying agent such as barium oxide or the like in the space, moisture adsorbed in a manufacturing step is easily inhibited from damaging the device.

A light emitting device containing the light emitting material according to this embodiment is useful for, for example, planar light sources (e.g. lighting) such as a curved planar light source, and a flat light source; display units such as a segment display unit (e.g. a segment type display device), a dot matrix display unit (e.g. a dot matrix flat display), a liquid crystal display unit (e.g. a liquid crystal display unit, backlight of a liquid crystal display). In addition, the light emitting material according to this embodiment is not only suitable as a material for use in production of the above-mentioned articles, but also useful, for example, as a pigment for a laser, a material for an organic solar battery, an organic semiconductor for an organic transistor, a material for a conductive thin film such as an electrically conductive thin film or an organic semiconductor thin film, a light emitting thin film material emitting fluorescence, a material of a polymer electric field effect transistor.

If a light emitting layer having the light emitting material according to this embodiment is used as a part of white lighting, a light emitting material with a color other than blue may be contained as a composition in the light emitting layer, or a second light emitting layer having a light emitting material with a color other than blue may be possessed for obtaining white color purity.

For obtaining planar light emission using the light emitting device according to this embodiment, a planar anode and cathode may be arranged so that they are superimposed on each other. In addition, for obtaining patterned light emission, there are a method in which a mask provided with a patterned window is placed on the surface of the planar light emitting device and a method in which either one of an anode and a cathode, or both the electrodes are formed in a patterned form. A pattern is formed by either of these methods, and some electrodes are arranged so that they can be independently turned ON/OFF to thereby obtain a segment type display device that can display numbers, characters, simple symbols and the like. Further, for forming a dot matrix device, both an anode and a cathode may be formed in a striped form and placed so that they are orthogonal to each other. Partial color display and multi-color display can be provided by a method of painting in different colors a plurality of kinds of different polymer compounds with different luminescent colors or a method of using a color filter or a fluorescence conversion filter. The dot matrix device can be passively driven, or may be actively driven in combination with a TFT or the like. These display devices can be used, for example, as display units of computers, televisions, portable terminals, mobile phones, car navigations, and view finders of video cameras.

<Method for Manufacturing Light Emitting Device>

A method for manufacturing a light emitting device according to this embodiment is a method for manufacturing a light emitting device, the luminous lifetime of which is improved, characterized by including in a light emitting layer in the light emitting device a light emitting material comprising a conjugated polymer having a conjugated part and a blue light emitting compound having a blue light emitting part and satisfying the following formula (1). According to this manufacturing method, a light emitting device, the luminous lifetime of which is improved, can be manufactured. Further, as a light emitting material in the method for manufacturing a light emitting device according to this embodiment, a material same as those described above can be used.

[Mathematical Formula 13]

$$y \geq \log_{10}(5.1 \times x^{0.2} + 1) \quad (1)$$

In the formula, y represents an amount of light emission of the blue light emitting compound where the total amount of light emission of the conjugated polymer and the blue light emitting compound in the light emitting material by excitation with light having a wavelength of 370 nm is 1, and provided that the gram light absorption coefficient of the conjugated polymer and the blue light emitting compound in the light emitting material are $\epsilon_1$ and $\epsilon_2$, and further the content of the blue light emitting compound is $P_2$ (parts by mass) where the total content of the conjugated polymer and the blue light emitting compound in the light emitting material is 100 parts by mass, x is defined by the formula:

[Mathematical Formula 14]

$$x = (\epsilon_2/\epsilon_1) \times P_2.$$

Hereinabove, preferred embodiments of the present invention have been described, but the present invention is not limited to the embodiments described above. For example, in the embodiment described above, a part described as a method for manufacturing a light emitting device can also be understood as a method for improving the luminous lifetime of a light emitting device, characterized by including in a light emitting layer in the light emitting device a light emitting material comprising a conjugated polymer having a conjugated part and a blue light emitting compound having a blue light emitting part and satisfying the formula (1).

Also, it can be understood as a method for selecting a light emitting material for obtaining a light emitting device excellent in luminous lifetime, wherein as a light emitting material a light emitting material comprising a conjugated polymer having a conjugated part and a blue light emitting compound having a blue light emitting part and satisfying the formula (1) is selected.

EXAMPLES

Hereinbelow, the present invention will be described more specifically on the basis of examples and comparative examples, but the present invention is not in any way limited to the following examples.

(Number Average Molecular Weight and Weight Average Molecular Weight)

In examples, number average molecular weight and weight average molecular weight in terms of polystyrene were determined by gel permeation chromatography (GPC, manufactured by Shimadzu Corporation, trade name: LC-10 Avp). A polymer compound to be measured was dissolved in tetrahydrofuran (hereinafter, referred to as "THF") so as to have a concentration of about 0.5% by weight, and the solution was injected into GPC in an amount of 30 μL. THF was used for a mobile phase of GPC, and made to flow at a flow rate of 0.6 mL/minute. For a column, two pieces of TSKgel SuperHM-H (manufactured by TOSOH CORPORATION) and a piece of TSKgel SuperH 2000 (manufactured by TOSOH CORPORATION) were connected in series. For a detector, a differential refractive index detector (manufactured by Shimadzu Corporation, trade name: RID-10A) was used.

(NMR Measurement)

In examples, NMR measurement of monomers was made under the following conditions.

Apparatus: nuclear magnetic resonance apparatus, INOVA 300 (trade name), manufactured by Varian, Inc.)

Measurement solvent: chloroform deuteride

Concentration of sample: about 1% by weight

Measurement temperature: 25° C.

(Light Emitting Spectrum Measurement)

In examples, light emitting spectrum measurement of light emitting organic compounds and conjugated polymers was made under the following conditions.

Apparatus: spectrofluoro-photometer, Model FP-6500, manufactured by JASCO Corporation Measurement solvent: toluene was used as a solvent in the case of light emitting organic compounds.

Concentration of sample: $0.8 \times 10^{-3}$% by weight

Measurement temperature: 25° C.

(Gram Light Absorption Coefficient Measurement)

In examples, gram light absorption factor measurement of light emitting organic compounds was made under the following conditions.

Apparatus: ultraviolet and visible spectrophotometer, Cary 5E, manufactured by Varian, Inc.
Measurement solvent: toluene
Concentration of sample: $8\times10^{-4}\%$ by weight
Measurement temperature: 25° C.

Synthesis of Blue Light Emitting Compound

Synthesis Example a-1

Synthesis of Blue Light Emitting Compound (a-1)

As shown in the following reaction scheme, a blue light emitting compound represented by the following formula (a-1) (hereinafter, referred to as a "blue light emitting compound (a-1)") was synthesized.

[Chemical Formula 23]

That is, in a 100 mL three-necked flask were placed 0.52 g (1.00 mmol) of 1,3,6,8-tetrabromopyrene (a compound represented by the formula (1a)), 2.70 g of a compound represented by the formula (2a) and 2.21 g of an aqueous tetraethylammonium hydroxide solution (20 mass % aqueous solution), and air within the flask was then replaced by nitrogen. Thereto were added 200 mL of 1,4-dioxane, 10 mg of palladium acetate (Pd(OAc)$_2$) and 50 mg of tris(2-methoxyphenyl)phosphine (P(o-MeOPh)$_3$), and the resulting mixture was stirred at 105° C. for 6 hours. The obtained solution was cooled to room temperature, and then filtered by a funnel precoated with Celite. The filtrate liquid was separated, the organic phase was washed with water, and the organic phase was then dried with anhydrous sodium sulfate, filtered and concentrated. The obtained residue was purified by a silica gel column, and the obtained solid was further recrystallized with a chloroform-hexane mixed solvent to thereby obtain 0.51 g of a blue light emitting compound (a-1) as a yellow solid.

LC/MS (APPI, positive): [M+H]$^+$ 2364.6

Synthesis Example a-2

Blue Light Emitting Compound (a-2)

As shown in the following reaction scheme, a blue light emitting compound represented by the following formula (a-2) (hereinafter, referred to as a "blue light emitting compound (a-2)") was synthesized.

Synthesis Example a-2-1

Synthesis of Raw Material Compound (6a)

As shown in the following reaction scheme, a raw material compound represented by the following formula (6a) (hereinafter, referred to as a "raw material compound (6a)") was synthesized.

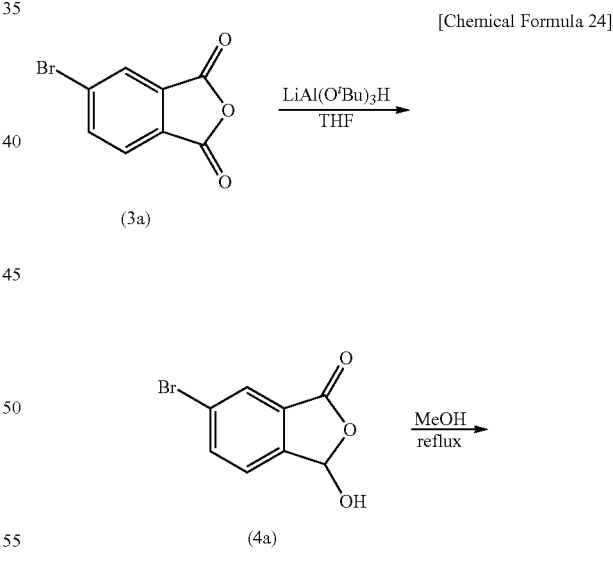

[Chemical Formula 24]

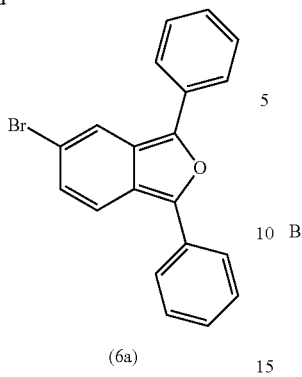

(6a)

That is, 23.2 g (100.2 mmol) of 5-bromophthalic anhydride (a compound represented by the formula (3a)) was placed in a 1 L four-necked flask, and dissolved in THF (430 mL), and air within the flask was replaced by nitrogen. The resulting solution was cooled to −66° C., and lithium tri(tert)-butoxy) aluminum hydride (100.2 mL, 100.2 mmol, 1.0 M THF solution) was then added dropwise. The resulting mixture was stirred at −65° C. for 2 hours, and water (100 mL) and dilute hydrochloric acid (400 mL) were then added to stop the reaction. The reaction solution was separated, the aqueous phase was extracted with ethyl acetate (400 mL×2), and the organic phase was then dried with anhydrous sodium sulfate, filtered and concentrated to obtain 23.5 g of a compound (4a) as a white solid.

Subsequently, 23.5 g of the compound (4a) was placed in a 300 mL egg-plant flask, and dissolved in methanol (232 mL), and air within the flask was then replaced by nitrogen. The resulting solution was heated at a bath temperature of 80° C. for 6 hours, and then allowed to cool, and the obtained solution was concentrated, and separated by addition of ethyl acetate (100 mL) and water (100 mL). Further, the aqueous layer was extracted with ethyl acetate (100 mL). The organic phase was washed with a saturated saline solution (100 mL), and the organic phase was then dried with anhydrous sodium sulfate, filtered and concentrated to obtain 20.3 g of a compound (5a) as a light yellow oil.

Subsequently, 16.2 g of the compound (5a) was placed in a 1 L 4-necked egg-plant flask, and dissolved in THF (267 mL), and air within the flask was then replaced by nitrogen. The resulting solution was cooled to 0° C., phenyl magnesium bromide (110.0 mL, 110.0 mmol, 1.0 M THF solution) was then added dropwise, and after 3 hours, dilute hydrochloric acid (200 mL) was added dropwise at this temperature to stop the reaction. The reaction solution was separated, the aqueous phase was extracted with ethyl acetate (300 mL×2), and the organic phase was then washed with water (300 mL). The organic phase was dried with anhydrous sodium sulfate, filtered and concentrated to obtain 22.1 g of a compound (6a).

Synthesis Example a-2-2

Synthesis of Raw Material Compound (8a/8b)

As shown in the following reaction scheme, a raw material compound represented by the following formula (8a/8b) (hereinafter, referred to as a "raw material compound (8a/8b)") was synthesized.

[Chemical Formula 25]

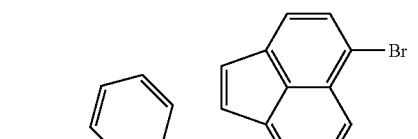

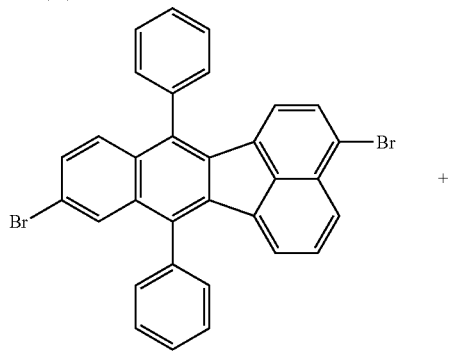

(8a)

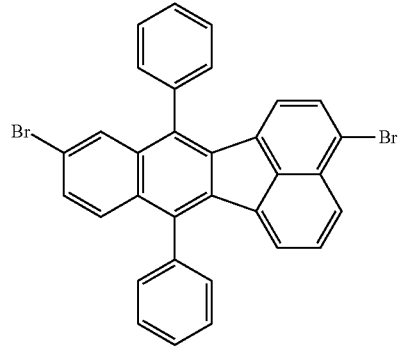

(8b)

That is, 22.1 g of the compound (6a) and 5-bromoacenaphthylene (a compound represented by the formula (7a)) (12.1 g, 52.2 mmol) were placed in a 300 mL egg-plant flask, and dissolved in xylene (182 mL), and air within the flask was replaced by nitrogen. The resulting solution was heated and refluxed at 150° C. for 4 hours, and then allowed to cool to room temperature, p-toluenesulfonic acid monohydrate (2.98 g) was added, and the resulting mixture was stirred at 110° C. for 5 hours. Thereafter, the mixture was allowed to cool, and the solution thus obtained was distilled to remove a solvent under a reduced pressure. For removing colored components, the solution was dissolved in 20:1 hexane-toluene (100 mL), the resulting solution was then separated, the aqueous phase was extracted with toluene (200 mL×2), and the organic phase was then washed with a saturated aqueous sodium hydrogen carbonate solution (200 mL) and water (200 mL). The organic phase was dried with anhydrous sodium sulfate, filtered and concentrated, and the crude product thus obtained was purified using a silica gel column (hexane) to obtain 13.3 g of compounds (8a) and (8b) as a light yellow solid.

8a: 3,9-dibromo-7,12-diphenylbenzo[k]fluoranthene
8b: 3,10-dibromo-7,12-diphenylbenzo[k]fluoranthene Hereinbelow, the compound (8) means a mixture of the compounds (8a) and (8b). Further, the same applies to compounds derived from the compound (8).

LC-MS (APPI, positive): $[M+H]^+$ 561.8

Synthesis Example a-2-3

Synthesis of Blue Light Emitting Compound (a-2)

As shown in the following reaction scheme, a blue light emitting compound represented by the following formula (a-2) (hereinafter, referred to as a "blue light emitting compound (a-2)") was synthesized.

[Chemical Formula 26]

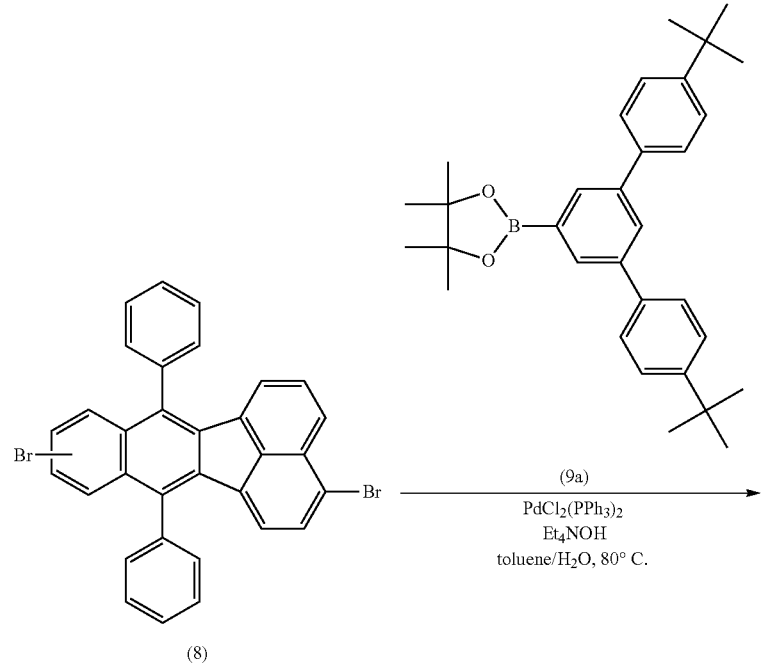

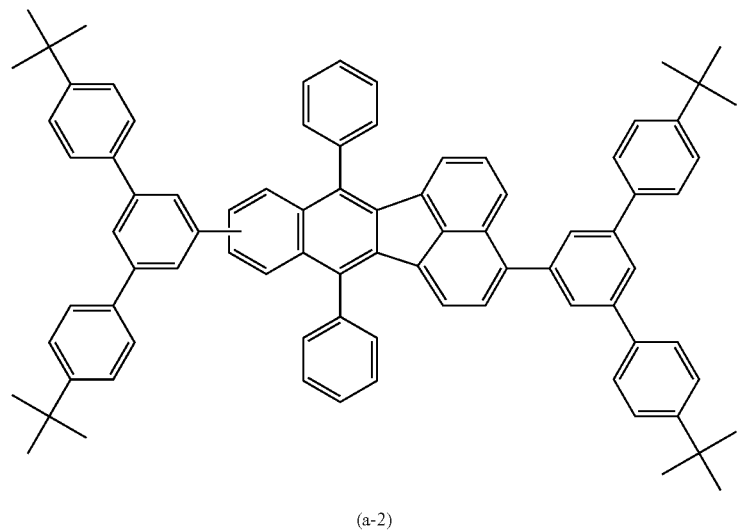

That is, in a 100 mL three-necked flask were placed 51.7 mg (0.09 mmol) of the compound (8), 102 mg of 3,5-bis(4-tert-butylphenyl)phenylboric acid pinacol ester synthesized in accordance with a method described in Japanese Patent Laid-open Publication No. 2005-82730 (a compound represented by the formula (9a)) and 381 mg of an aqueous tetraethylammonium hydroxide solution (20 mass % aqueous solution), and air within the flask was then replaced by nitrogen. Thereto were added 5 mL of toluene and 1 mg of dichlorobis(triphenylphosphine)palladium ($PdCl_2(PPh_3)_2$), and the resulting mixture was stirred at a bath temperature of 80° C. for 3 hours. The obtained solution was cooled to room temperature, and then filtered by a funnel precoated with Celite. The filtrate liquid was separated, the organic phase was washed with water, and the organic phase was then dried with anhydrous sodium sulfate, filtered and concentrated. The obtained residue was purified by a silica gel column, and further recrystallized with acetonitrile to thereby obtain 10 mg of a blue light emitting compound (a-2) as a yellow solid.

Synthesis Example a-3-1

Synthesis of Raw Material Compound (10)

As shown in the following reaction scheme, a raw material compound represented by the following formula (10) (hereinafter, referred to as a "raw material compound (10)") was synthesized.

[Chemical Formula 27]

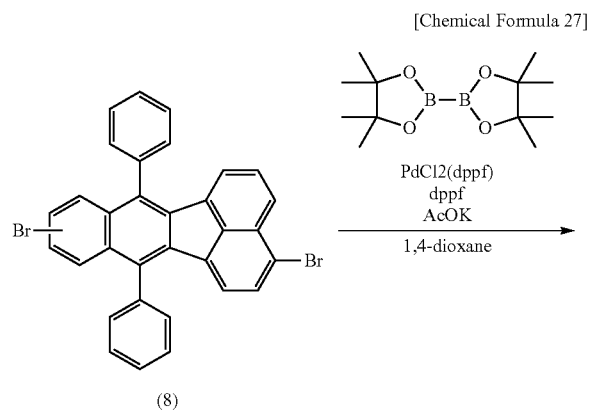

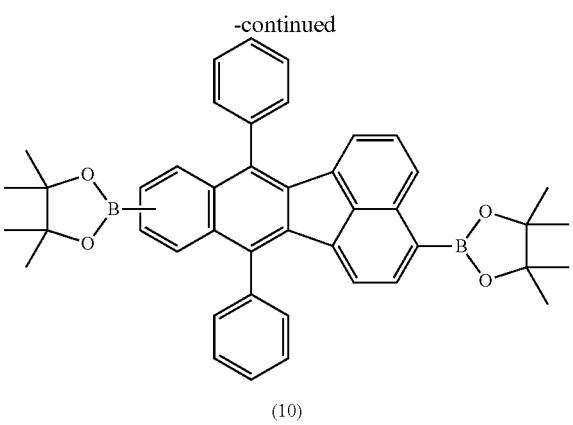

(10)

That is, in a 200 mL four-necked flask were placed 5.0 g (8.75 mmol) of the compound (8), 4.89 g of bispinacolate diboron and 5.15 g of potassium acetate, and air within the flask was replaced by nitrogen. Thereto were added 50 mL of 1,4-dioxane, 0.43 g of palladium chloride (diphenylphosphinoferrocene ($PdCl_2$ (dppf)) and 0.29 g of diphenylphosphinoferrocene (dppf), and the resulting mixture was stirred at a bath temperature of 105° C. for 17 hours. The obtained solution was cooled to room temperature, and then filtered by a funnel precoated with Celite. A residue obtained by concentrating the filtrate liquid was dissolved in hexane, activated carbon was then added, and the resulting mixture was stirred at 70° C. for an hour. This was cooled to room temperature, and then filtered by a funnel precoated with Celite. A solid precipitated by adding acetonitrile (200 mL) to an oil obtained by concentration under a reduced pressure was taken by filtration to obtain 3.7 g of a compound (10) as a yellow solid.

Synthesis Example a-3-2

Synthesis of Raw Material Compound (11)

As shown in the following reaction scheme, a raw material compound represented by the following formula (11) (hereinafter, referred to as a "raw material compound (11)") was synthesized.

[Chemical Formula 28]

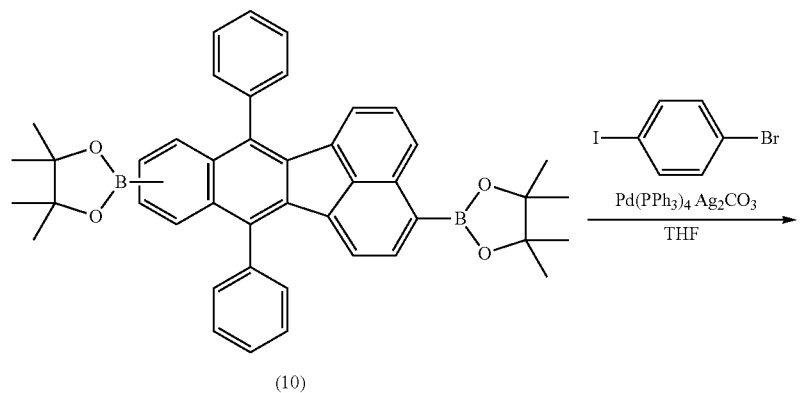

(10)

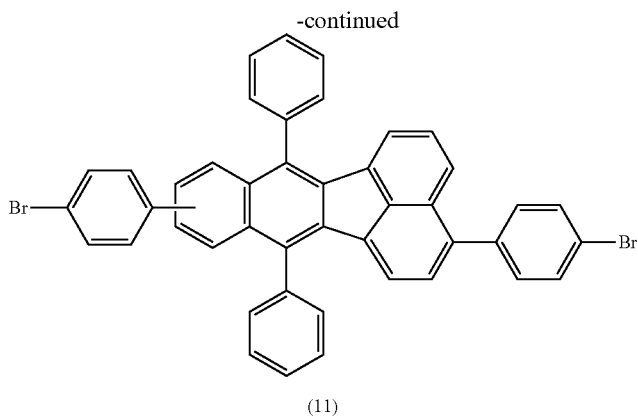

(11)

That is, in a 500 mL three-necked flask were placed 0.28 g (0.43 mmol) of the compound (10), 4-bromoiodobenzene (0.25 g) and silver carbonate (0.24 g), and air within the flask was replaced by nitrogen. Thereto were added 3 mL of THF and 25 mg of tetrakis(triphenylphosphine)palladium (Pd (PPh$_3$)$_4$), and the resulting mixture was heated at a bath temperature of 50° C. for 7 hours. The obtained solution was cooled to room temperature, and then filtered by a funnel precoated with Celite. A solid obtained by concentrating the filtrate liquid under a reduced pressure was taken by filtration, and washed with acetonitrile to obtain 0.31 g of a compound (11) as a light yellow solid.

LC-MS (APPI, positive): [M+H]$^+$ 714.0

Synthesis Example a-3

Blue Light Emitting Compound (a-3)

As shown in the following reaction scheme, a blue light emitting compound represented by the following formula (a-3) (hereinafter, referred to as a "blue light emitting compound (a-3)") was synthesized.

[Chemical Formula 29]

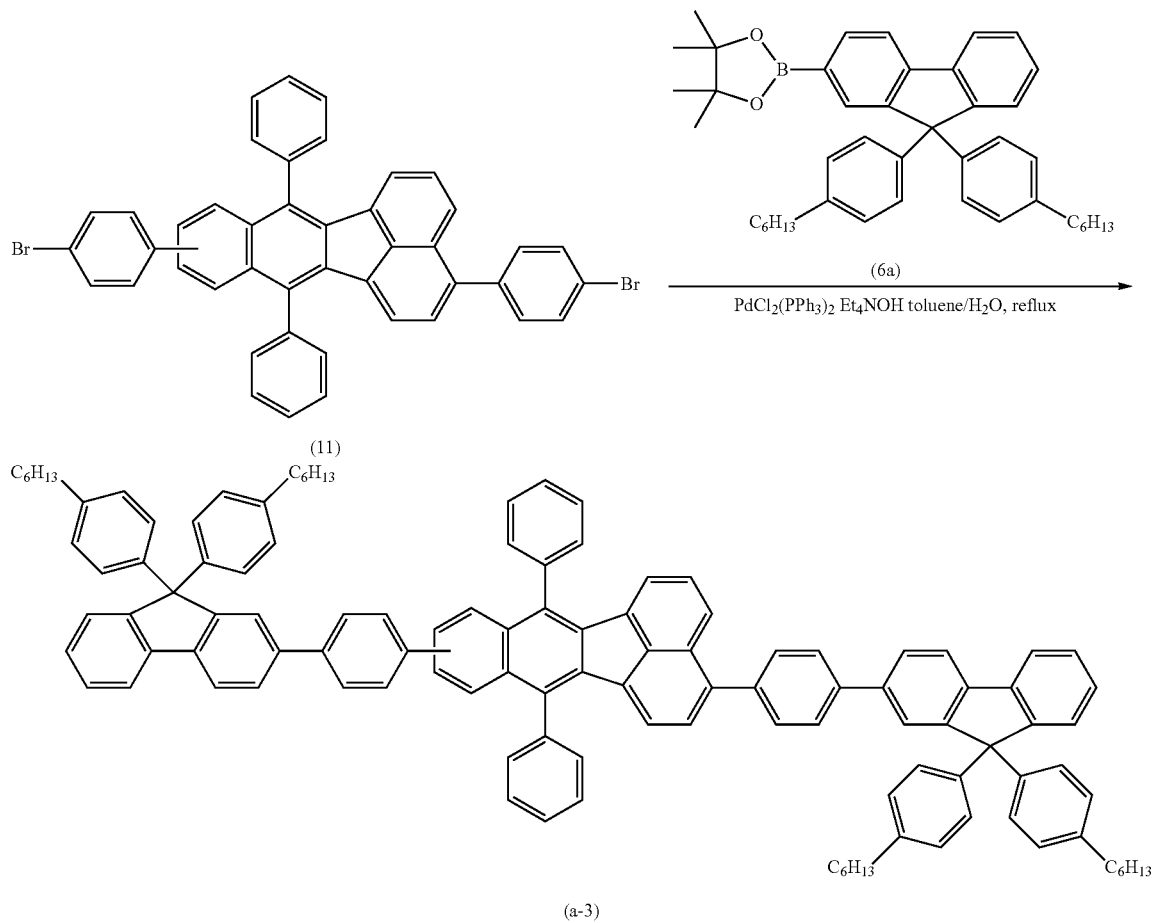

That is, in a 100 mL three-necked flask were placed 0.20 g (0.28 mmol) of the compound (11), 0.45 g of a compound represented by the formula (6a) and 1.46 g of an aqueous tetraethylammonium hydroxide solution (20 mass % aqueous solution), and air within the flask was then replaced by nitrogen. Thereto were added 3 mL of toluene and 17 mg of dichlorobis(triphenylphosphine)palladium ($PdCl_2(PPh_3)_2$), and the resulting mixture was stirred at a bath temperature of 105° C. for 11 hours.

The obtained solution was cooled to room temperature, and then filtered by a funnel precoated with Celite. The filtrate liquid was separated, the organic phase was washed with water, and the organic phase was then dried with anhydrous sodium sulfate, filtered and concentrated. The obtained residue was purified by a silica gel column to thereby obtain 0.21 g of a blue light emitting compound (a-3) as a yellow solid.

LC-MS (APPI, positive): $[M+H]^+$ 1525.5 washed with water, and the organic phase was then dried with anhydrous sodium sulfate, filtered and concentrated.

The obtained residue was purified by a silica gel column to thereby obtain 0.33 g of a blue light emitting compound (a-4) as a yellow solid.

LC-MS (APPI, positive): $[M+H]^+$ 1485.4

Synthesis Example a-5

Synthesis of Blue Light Emitting Compound (a-5)

Synthesis Example a-5-1

Synthesis of Alcohol Body (12a)

As shown in the following reaction scheme, an alcohol body represented by the following formula (12a) (hereinafter, referred to as an "alcohol body (12a)") was synthesized.

[Chemical Formula 30]

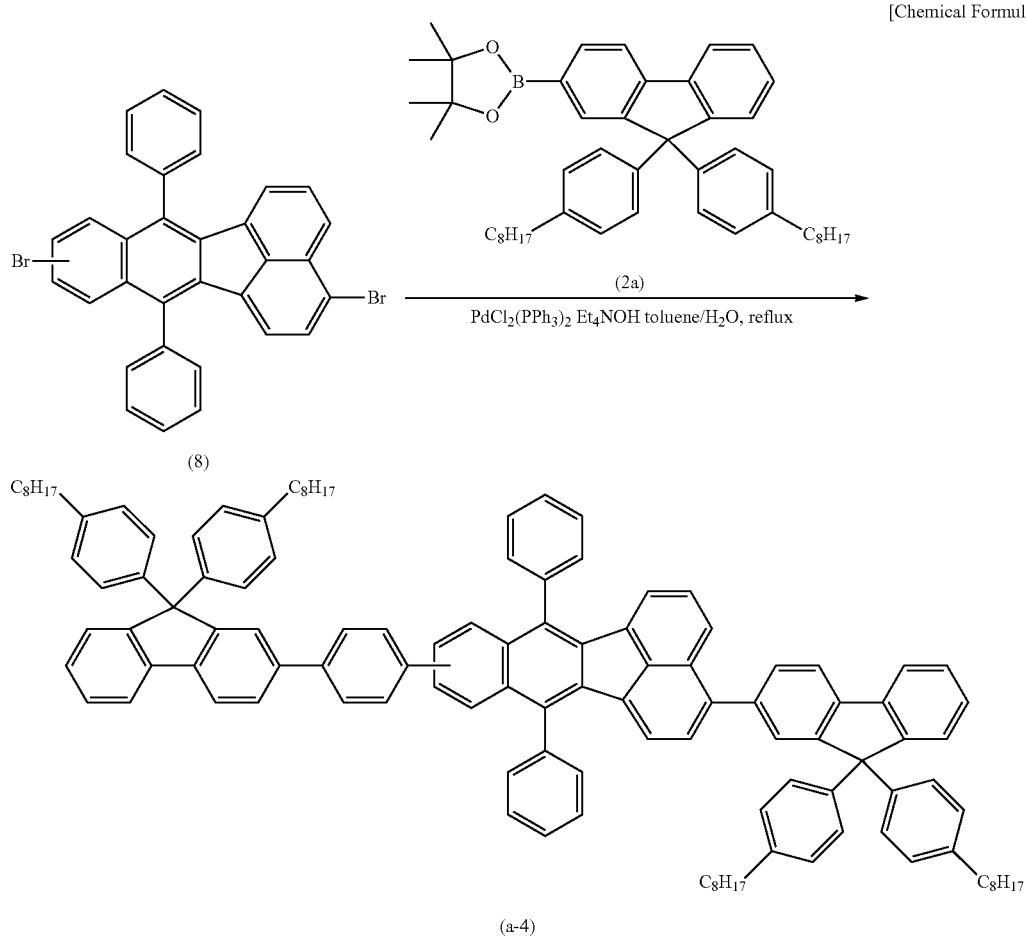

That is, in a 100 mL three-necked flask were placed 0.29 g (0.52 mmol) of the compound (8), 0.75 g of a compound represented by the formula (2a) and 2.24 g of an aqueous tetraethylammonium hydroxide solution (20 mass % aqueous solution), and air within the flask was then replaced by nitrogen. Thereto were added 4 mL of toluene and 4 mg of dichlorobis(triphenylphosphine)palladium ($PdCl_2(PPh_3)_2$), and the resulting mixture was stirred at a bath temperature of 105° C. for 2 hours. The obtained solution was cooled to room temperature, and then filtered by a funnel precoated with Celite. The filtrate liquid was separated, the organic phase was

[Chemical Formula 31]

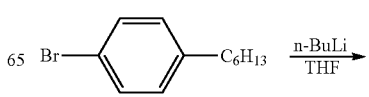

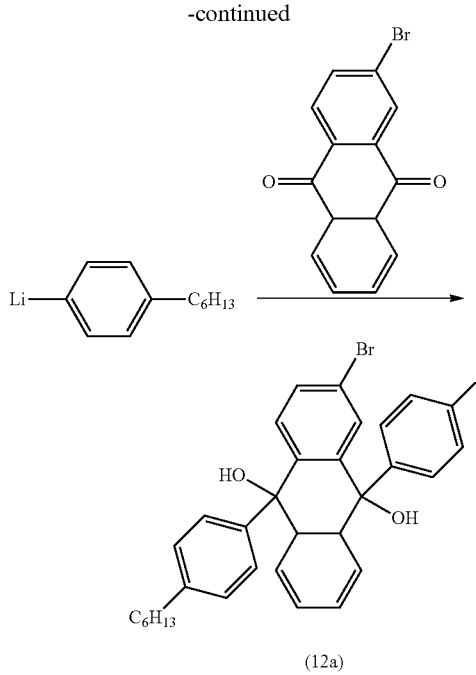

(12a)

That is, in a 300 mL three-necked flask was placed 20.0 g (82.9 mmol) of 4-hexylbromobenzene, and air within the flask was then replaced by nitrogen. Thereto was added 200 mL of tetrahydrofuran, the resulting mixture was cooled to −66° C., and 46.2 mL (1.6 M) of an n-butyllithiumhexane solution was added dropwise. Further, the resulting mixture was stirred at the same temperature for 40 minutes to prepare a lithium reagent.

Subsequently, 10.0 g (34.59 mmol) of 2-bromoanthraquinone was slowly added, and the resulting mixture was then reacted while gradually raising temperature to room temperature. The reaction was stopped with a saturated aqueous ammonium chloride solution, and the aqueous phase was extracted with chloroform. The organic phase was dried with anhydrous sodium sulfate, filtered and concentrated. The obtained residue was purified by a silica gel column, and further recrystallized with hexane to thereby obtain 2.12 g of an alcohol body (12a) as a white solid.

Synthesis Example a-5-2

Synthesis of Raw Material Compound (14a)

As shown in the following reaction scheme, a raw material compound represented by the following formula (14a) (hereinafter, referred to as "raw material compound (14a)") was synthesized.

[Chemical Formula 32]

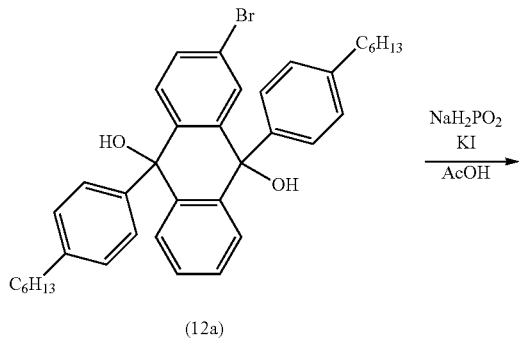

(12a)

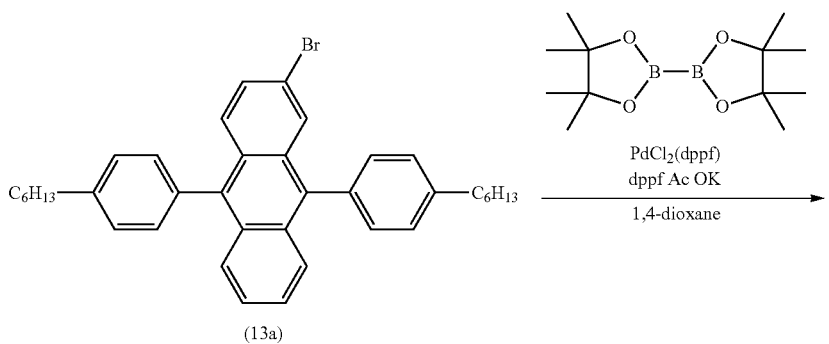

(13a)

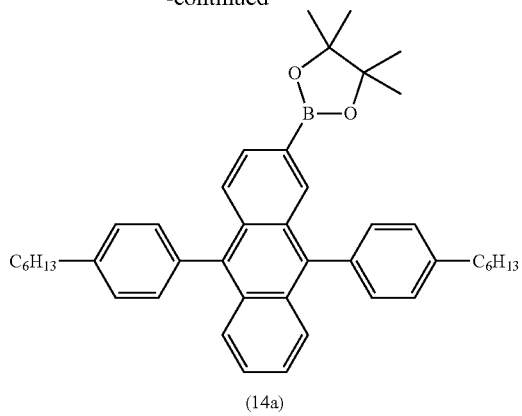

(14a)

That is, in a 100 mL three-necked flask were placed 804 mg (1.31 mmol) of the alcohol body (12a), 104 mg of sodium dihydrogen hypophosphite and 218 mg of potassium iodide, and air within the flask was replaced by nitrogen. Thereto was added 25 mL of acetic acid, and the resulting mixture was heated and stirred at a bath temperature of 80° C. for 3 hours. The obtained solution was cooled to room temperature, and water was then added to stop the reaction. The aqueous phase was extracted with toluene, and the organic phase was dried with anhydrous sodium sulfate, filtered and concentrated. The obtained residue was purified by a silica gel column to thereby obtain 670 mg of a compound represented by the formula (13a) as a white solid.

In a 100 mL three-necked flask were placed 670 mg (1.16 mmol) of a compound represented by the formula (13a), 320 mg of bispinacolate diboron and 340 mg of potassium acetate, and air within the flask was replaced by nitrogen. Thereto were added 20 mL of 1,4-dioxane, 30 mg of palladium chloride (diphenylphosphinoferrocene (PdCl$_2$ (dppf)) and 20 mg of diphenylphosphinoferrocene, and the resulting mixture was stirred at a bath temperature of 100° C. for 9 hours. The obtained solution was cooled to room temperature, and then filtered by a funnel precoated with Celite. A residue obtained by concentrating the filtrate liquid was dissolved in hexane, activated carbon was then added, and the resulting mixture was stirred at 70° C. for an hour. This was cooled to room temperature, and then filtered by a funnel precoated with Celite. The filtrate liquid was concentrated under a reduced pressure to obtain 600 mg of a raw material compound (14a) as a yellow solid.

TLC-MS (DART, positive): [M+H]$^+$ 625.4

Synthesis Example a-5-3

Synthesis of Blue Light Emitting Compound (a-5)

As shown in the following reaction scheme, a blue light emitting compound represented by the following formula (a-5) (hereinafter, referred to as a "blue light emitting compound (a-5)") was synthesized.

[Chemical Formula 33]

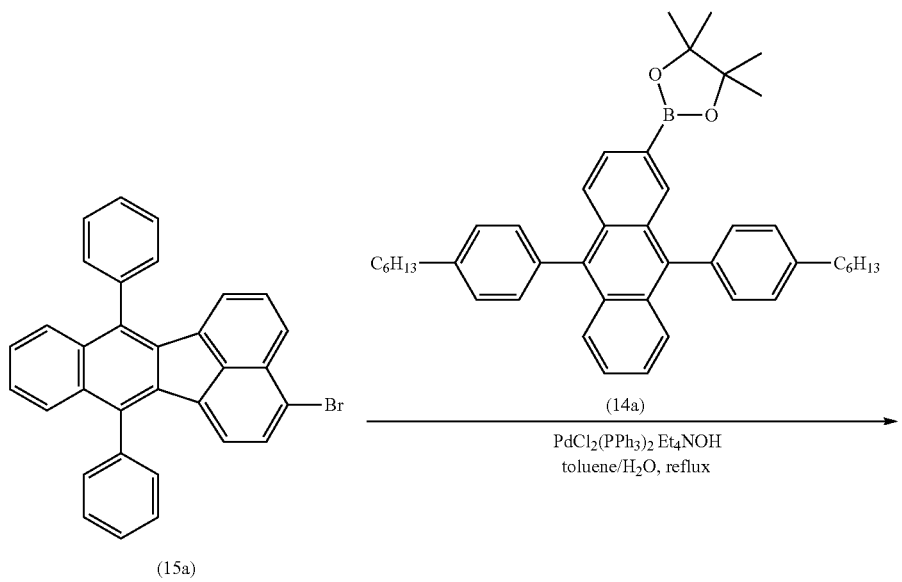

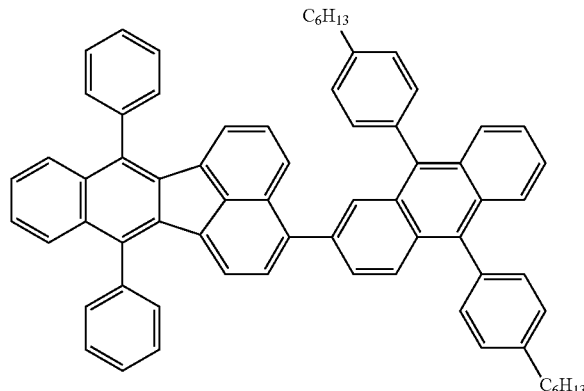

(a-5)

That is, in a 100 mL three-necked flask were placed 100 mg (0.21 mmol) of 3-bromo-7,12-diphenylbenzo[k]fluoranthene (a compound represented by the formula (15a)), 140 mg of the raw material compound (14a) and 443 mg of an aqueous tetraethylammonium hydroxide solution (20 mass % aqueous solution), and air within the flask was then replaced by nitrogen. Thereto were added 3 mL of toluene and 4 mg of dichlorobis(triphenylphosphine)palladium ($PdCl_2(PPh_3)_2$), and the resulting mixture was stirred at a bath temperature of 105° C. for 2 hours. The obtained solution was cooled to room temperature, and then filtered by a funnel precoated with Celite. The filtrate liquid was separated, the organic phase was washed with water, and the organic phase was then dried with anhydrous sodium sulfate, filtered and concentrated. The obtained residue was purified by a silica gel column to thereby obtain 40 mg of a blue light emitting compound (a-5) as a yellow solid.

TLC-MS (DART, positive): $[M+H]^+$ 901.4

Synthesis Example a-6

Synthesis of Blue Light Emitting Compound (a-6)

As shown in the following reaction scheme, a blue light emitting compound represented by the following formula (a-6) (hereinafter, referred to as a "blue light emitting compound (a-6)") was synthesized.

[Chemical Formula 34]

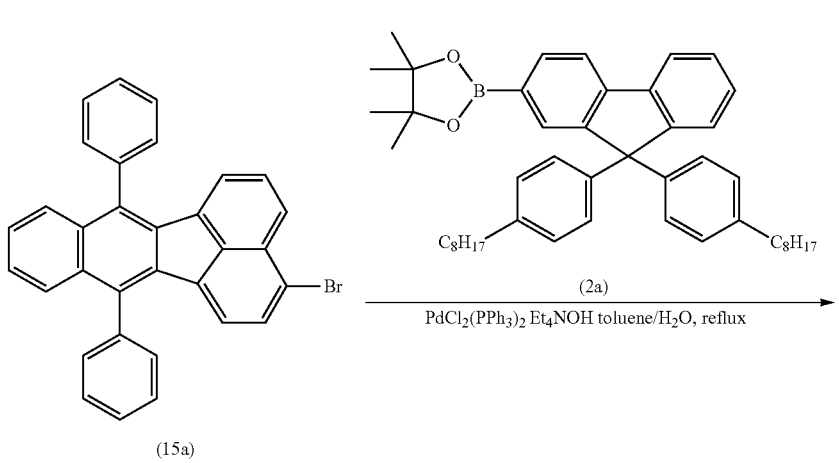

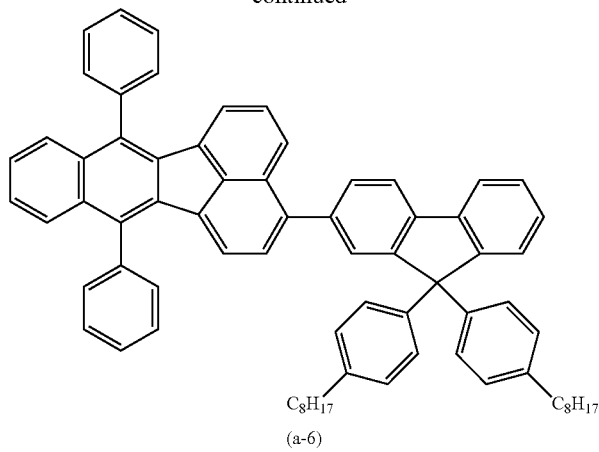

(a-6)

That is, in a 100 mL three-necked flask were placed 0.38 g (0.79 mmol) of 3-bromo-7,12-diphenylbenzo[k]fluoranthene (a compound represented by the formula (15a)), 0.57 g of a compound represented by the formula (2a) and 4.39 g of an aqueous tetraethylammonium hydroxide solution (20 mass % aqueous solution), and air within the flask was then replaced by nitrogen. Thereto were added 11.5 mL of toluene and 27 mg of dichlorobis(triphenylphosphine)palladium ($PdCl_2(PPh_3)_2$), and the resulting mixture was heated at a bath temperature of 105° C. for 2 hours. Thereafter, the resulting mixture was allowed to cool, and the solution thus obtained was filtered by a funnel precoated with Celite. The filtrate liquid was separated, the organic phase was washed with water, and the organic phase was then dried with anhydrous sodium sulfate, filtered and concentrated. The obtained residue was purified by a silica gel column to thereby obtain 0.60 g of a blue light emitting compound (a-6) as a yellow solid.

LC-MS (APPI, positive): $[M+H]^+$ 945.5

Synthesis Example a-7

Synthesis of Blue Light Emitting Compound (a-7)

As shown in the following reaction scheme, a blue light emitting compound represented by the following formula (a-7) (hereinafter, referred to as a "blue light emitting compound (a-7)") was synthesized.

[Chemical Formula 35]

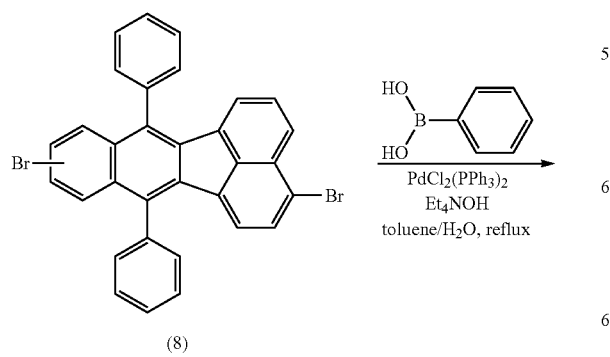

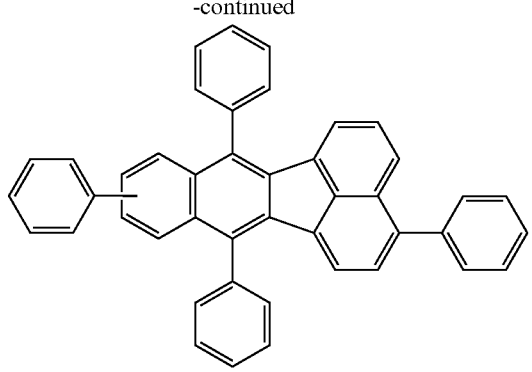

(a-7)

That is, in a 100 mL three-necked flask were placed 0.20 g (0.36 mmol) of the compound (8), 0.21 g phenylboronic acid and 1.56 g of an aqueous tetraethylammonium hydroxide solution (20 mass % aqueous solution), and air within the flask was then replaced by nitrogen. Thereto were added 2 mL of toluene and 2 mg of dichlorobis(triphenylphosphine)palladium ($PdCl_2(PPh_3)_2$), and the resulting mixture was stirred at a bath temperature of 105° C. for 8 hours. The obtained solution was cooled to room temperature, and then filtered by a funnel precoated with Celite. The filtrate liquid was separated, the organic phase was washed with water, and the organic phase was then dried with anhydrous sodium sulfate, filtered and concentrated. The obtained residue was purified by a silica gel column to thereby obtain 67 mg of a blue light emitting compound (a-7) as a yellow solid.

TLC-MS (DART, positive): $[M+H]^+$ 557.2

Synthesis Example a-8

Synthesis of Blue Light Emitting Compound (a-8)

As shown in the following reaction scheme, a blue light emitting compound represented by the following formula (a-8) (hereinafter, referred to as a "blue light emitting compound (a-8)") was synthesized.

[Chemical Formula 36]

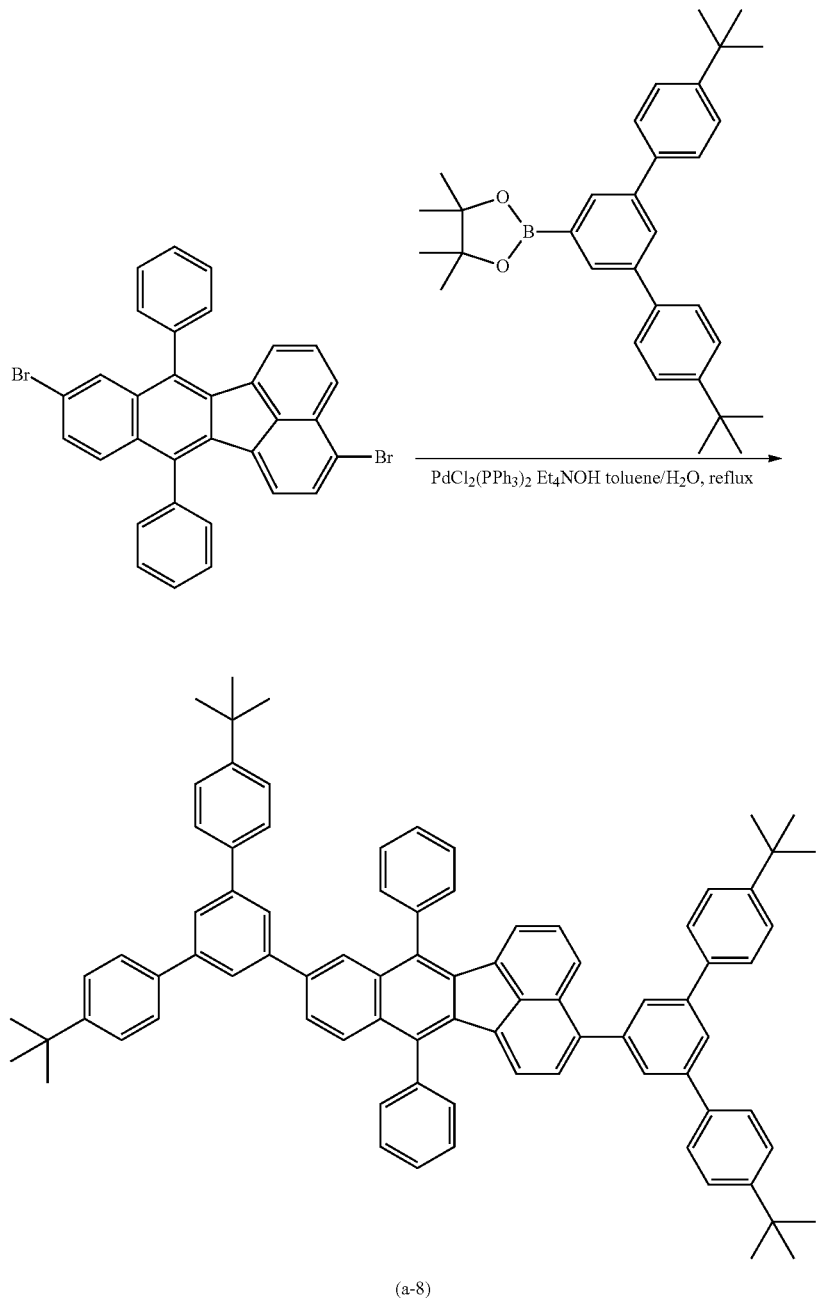

(a-8)

In a 100 mL three-necked flask were placed 51.7 mg (0.09 mmol) of 3,9-dibromo-7,12-diphenylbenzo[k]fluoranthene, 102 mg of 3,5-bis(4-tert-butylphenyl)phenylboric acid pinacol ester synthesized in accordance with a method described in Japanese Patent Laid-open Publication No. 2005-82730 and 381 mg of an aqueous tetraethylammonium hydroxide solution (20 wt % aqueous solution), and air within the flask was then replaced by nitrogen. Thereto were added 5 mL of toluene and 1 mg of dichlorobis(triphenylphosphine)palladium, and the resulting mixture was stirred at 80° C. for 3 hours. The obtained solution was cooled to room temperature, and then filtered by a funnel precoated with Celite. The filtrate liquid was separated, the organic phase was washed with water, and the organic phase was then dried with anhydrous sodium sulfate, filtered and concentrated. The obtained residue was purified by a silica gel column, and further recrystallized with acetonitrile to thereby obtain 10 mg of a blue light emitting compound (a-8) as a yellow solid.

Synthesis Example a-9

Synthesis of Blue Light Emitting Compound (a-9)

As shown in the following reaction scheme, a blue light emitting compound represented by the following formula (a-9) (hereinafter, referred to as a "blue light emitting compound (a-9)") was synthesized.

[Chemical Formula 37]

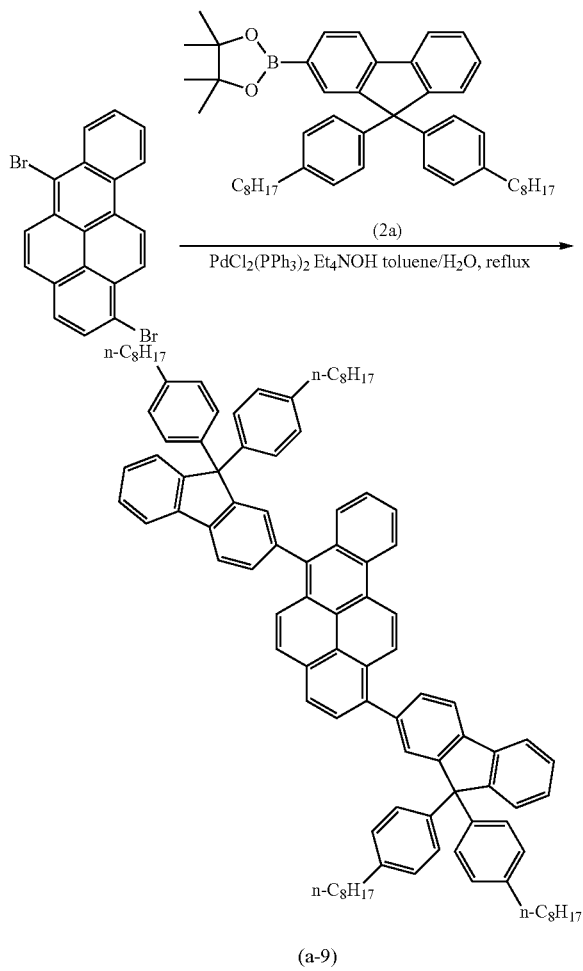

[Chemical Formula 38]

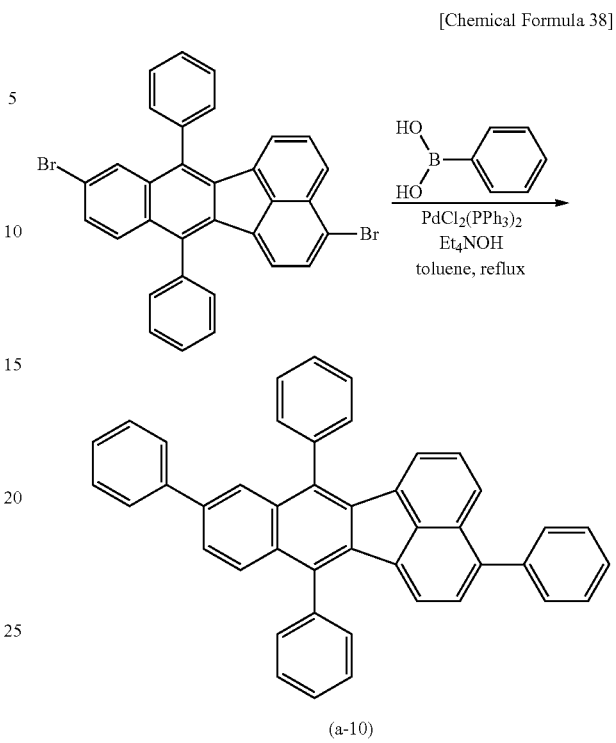

In a 50 mL three-necked flask were placed 0.30 g (0.71 mmol) of 1,6-dibromobenzo[a]pyrene, 1.03 g of a compound represented by the formula (2a) and 1.57 g of an aqueous tetraethylammonium hydroxide solution (20 wt % aqueous solution), and air within the flask was then replaced by nitrogen. Thereto were added 5 mL of toluene and 449 mg of dichlorobis(triphenylphosphine)palladium, and the resulting mixture was stirred at 105° C. for 4 hours. The obtained solution was cooled to room temperature, and then filtered by a funnel precoated with Celite. The filtrate liquid was separated, the organic phase was washed with water, and the organic phase was then dried with anhydrous sodium sulfate, filtered and concentrated. The obtained residue was purified by a silica gel column to thereby obtain a yellow liquid. Further, 0.60 g of a blue light emitting compound (a-9) was obtained as a yellow solid by recrystallization from THF-acetonitrile.

LC-MS (APPI, positive): [M+H]$^+$ 1334.7

Synthesis Example a-10

Synthesis of Blue Light Emitting Compound (a-10)

As shown in the following reaction scheme, a blue light emitting compound represented by the following formula (a-10) (hereinafter, referred to as a "blue light emitting compound (a-10)") was synthesized.

In a 100 mL three-necked flask were placed 0.20 g (0.36 mmol) of 3,9-dibromo-7,12-diphenylbenzo[k]fluoranthene, 0.21 g of phenylboronic acid and 1.56 g of tetraethylammonium hydroxide (20 wt % aqueous solution), and air within the flask was then replaced by nitrogen. Thereto were added 2 mL of toluene and 2 mg of dichlorobis(triphenylphosphine) palladium, and the resulting mixture was stirred at 105° C. for 8 hours. The obtained solution was cooled to room temperature, and then filtered by a funnel precoated with Celite. The filtrate liquid was separated, and washed with water, and the oil phase was then dried with anhydrous sodium sulfate, filtered and concentrated. The obtained residue was purified by a silica gel column to thereby obtain 67 mg of a blue light emitting compound (a-10) as a yellow solid.

TLC-MS (DART, positive): [M+H]$^+$ 557.2

Synthesis of Conjugated Polymer

Synthesis Example b-1

Synthesis of Conjugated Polymer (b-1)

To a 200 mL separable flask were added 3.182 g (6.0 mmol) of 9,9-dioctylfluorene-2,7-diboric acid ethylene glycol ester (a compound represented by the following formula (1b)), 2.632 g (4.8 mmol) of 9,9-dioctyl-2,7-dibromofluorene (a compound represented by the following formula (2b)), 0.551 g (1.2 mmol) of N,N-bis-(4-bromophenyl)-4-sec-butylaniline (a compound represented by the following formula (3b)), 0.78 g of methyltrioctylammonium chloride (trade name: Aliquat 336, manufactured by Aldrich) and 60 mL of toluene. 4.3 mg of bistriphenylphosphinepalladium dichloride was added under a nitrogen atmosphere, and the resulting mixture was heated to 95° C.

[Chemical Formula 39]

(2b)

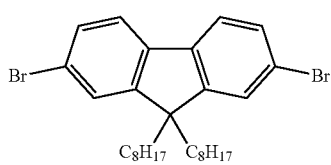

(3b)

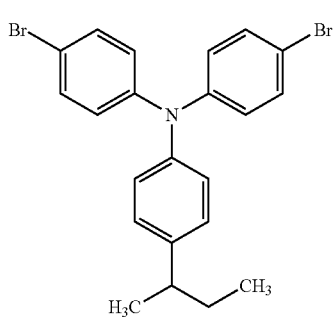

This solution was heated to 105° C. while adding 16.5 mL of a 17.5 wt % aqueous sodium carbonate solution dropwise thereto, and the resulting mixture was stirred for 3 hours. Next, 0.732 g of phenylboric acid, 4.2 mg of bistriphenylphosphinepalladium dichloride and 60 mL of toluene were added, and the resulting mixture was stirred at 105° C. for 18 hours. The aqueous layer was removed, 3.65 g of sodium N,N-diethyldithiocarbamate trihydrate and 36 mL of ion-exchanged water were then added, and the resulting mixture was stirred at 85° C. for 2 hours. The organic layer was separated from the aqueous layer, and the organic layer was then washed with 78 mL of ion-exchanged water (2×), 78 mL of a 3 wt % aqueous acetic acid solution (2×) and 78 mL of ion-exchanged water (2×) in this order.

The organic layer was added dropwise to methanol to precipitate a polymer, and the precipitate was filtered, and then dried to obtain a solid. This solid was dissolved in toluene, the solution was passed through a silica gel/alumina column through which toluene had been passed in advance, the passed eluate liquid was added dropwise to methanol to precipitate a polymer, and the precipitate was filtered, and then dried to obtain 3.23 g of a polymer (hereinafter, referred to as a "conjugated polymer (b-1)"). In addition, number average molecular weight and weight average molecular weight in terms of polystyrene were $Mn=1.3\times10^5$, $Mw=3.1\times10^5$, respectively.

The conjugated polymer (b-1) is a polymer having a repeating unit represented by the following formula (4b) and a repeating unit represented by the following formula (5b) in a molar ratio of 90:10.

[Chemical Formula 40]

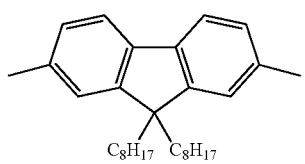

(4b)

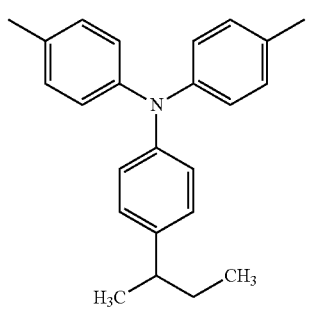

(5b)

Synthesis of Hole Transport Polymer Compound

Synthesis Example c-1

Synthesis of Hole Transport Polymer Compound (c-1)

To a flask to which a Dimroth was connected were added 5.25 g (9.9 mmol) of a compound represented by the following formula (1c), 4.55 g (9.9 mmol) of a compound represented by a compound represented by the following formula (2c), 0.91 g of methyltrioctylammonium chloride (trade name: Aliquat 336, manufactured by Aldrich) and 69 mL of toluene to obtain a monomer solution. Under a nitrogen atmosphere, the monomer solution was heated, and 2 mg of palladium acetate and 15 mg of tris(2-methylphenyl)phosphine were added at 80° C. Into the obtained monomer solution were poured 9.8 g of a 17.5 wt % aqueous sodium carbonate solution, and the resulting mixture was then stirred at 110° C. for 19 hours. Thereto was added 121 mg of phenylboric acid dissolved in 1.6 mL of toluene, and the resulting mixture was stirred at 105° C. for an hour.

[Chemical Formula 41]

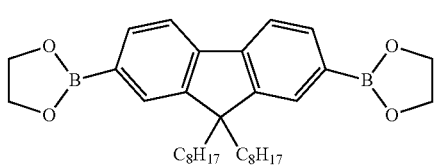

(1c)

77
-continued (2c)

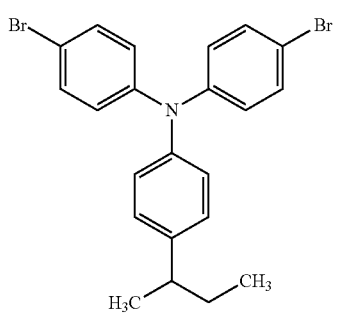

The organic layer was separated from the aqueous layer, and 300 mL of toluene was then added to the organic layer. The organic layer was washed with 40 mL of a 3 wt % aqueous acetic acid solution (2×) and 100 mL of ion-exchanged water (1×) in this order, and separated from the aqueous layer. To the organic layer were added 0.44 g of sodium N,N-diethyldithiocarbamate trihydrate and 12 mL of toluene, and the resulting mixture was stirred at 65° C. for 4 hours.

A solution of the obtained reaction product in toluene was passed through a silica gel/alumina column through which toluene had been passed in advance, the obtained solution was added dropwise to 1400 mL of methanol, a precipitate was resultantly generated, and this precipitate was filtered and dried to obtain a solid. This solid was dissolved in 400 mL of toluene, the resulting solution was added dropwise to 1400 mL of methanol, a precipitate was resultantly generated, and this precipitate was filtered and dried to obtain 6.33 g of a polymer (hereinafter, referred to as a "hole transport polymer compound (c-1)). Number average molecular weight Mn in terms of polystyrene of the hole transport polymer compound (c-1) was $8.8 \times 10^4$, and weight average molecular weight Mw in terms of polystyrene was $3.2 \times 10^5$.

The hole transport polymer compound (c-1) is estimated to be a polymer having a repeating unit represented by the following formula (3c) and a repeating unit represented by the following formula (4c) in a molar ratio of 1:1.

[Chemical Formula 42]

(3c)

(4c)

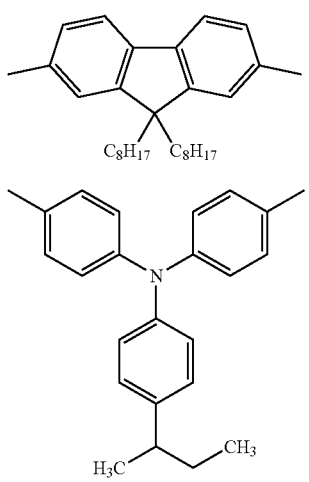

78
Manufacture of Organic EL Device

Example 1

FIG. 1 is a schematic cross-sectional view showing a structure of an organic EL device that is one embodiment of the present invention.

On a glass substrate 1 with an ITO film 2 deposited in a thickness of 45 nm by a sputtering method, a film was formed in a thickness of 65 nm by spin coating using a solution of poly(ethylenedioxythiophene)/polystyrenesulfonic acid (Bayer, trade name: AI4083), and dried on a hot plate at 200° C. for 10 minutes to form a hole injection layer 3.

Next, the hole transport polymer compound (c-1) was spin-coated in a state of a 0.7 wt % xylene solution, and thereby formed into a film in a thickness of about 20 nm. Thereafter, the film was heat-treated on a hot plate at 180° C. for 60 minutes to form a hole transport layer 4.

Next, a solution of the conjugated polymer (b-1) dissolved in a xylene solvent at a concentration of 1.2% by mass and a solution of the blue light emitting compound (a-2) dissolved in a xylene solvent at a concentration of 1.2% by mass were mixed in a mass ratio of 95:5 to prepare a light emitting material 1. In the light emitting material 1, x was 0.82, and y was 0.825. $\log_{10}(5.1 \times x^{0.2}+1)$ was 0.771.

The light emitting material 1 was formed into a film by spin coating at a rotation speed of 2400 rpm. Film thickness was about 60 nm. This film was dried under a nitrogen gas atmosphere at 130° C. for 10 minutes to form a light emitting layer 5, after which as a cathode 8, sodium fluoride 6 was deposited in a thickness of about 3 nm, and aluminum 7 was then deposited in a thickness of about 80 nm to prepare an organic EL device. Further, after the degree of vacuum reached $1 \times 10^{-4}$ Pa, deposition of a metal was started.

A voltage was applied to the obtained organic EL device, and EL light emission having a peak at a wavelength of 450 nm, which originated in the blue light emitting compound (a-2), was resultantly obtained from the device. The device started to emit light at 3.1 V, showed a light emission of 1000 cd/m² at 5.3 V, and had a maximum light emitting efficiency of 1.98 cd/A.

A current value was set so that the organic EL device obtained as described above had an initial luminance of 100 cd/m², the device was then driven at a constant current, and a change in luminance with time was measured. As a result, luminance decreased by half after 141.7 hours.

Example 2

An organic EL device was prepared in the same manner as in Example 1, except that a light emitting material 2 prepared by mixing a solution of the conjugated polymer (b-1) dissolved in a xylene solvent at a concentration of 1.2% by mass and a solution of the blue light emitting compound (a-4) dissolved in a xylene solvent at a concentration of 1.2% by mass in a mass ratio of 99:1 was used in place of the light emitting material 1 in Example 1. In the light emitting material 2, x was 0.26, and y was 0.73. $\log_{10}(5.1 \times x^{0.2}+1)$ was 0.690.

A voltage was applied to the obtained organic EL device, and EL light emission having a peak at a wavelength of 455 nm, which originated in the blue light emitting compound (a-4), was resultantly obtained. The device started to emit light at 2.9 V, showed a light emission of 1000 cd/m² at 4.4 V, and had a maximum light emitting efficiency of 2.93 cd/A.

A current value was set so that the organic EL device obtained as described above had an initial luminance of 100 cd/m², the device was then driven at a constant current, and a change in luminance with time was measured. As a result, luminance decreased by half after 111 hours.

Example 3

An organic EL device was prepared in the same manner as in Example 1, except that a light emitting material 3 prepared by mixing a solution of the conjugated polymer (b-1) dissolved in a xylene solvent at a concentration of 1.2% by mass and a solution of the blue light emitting compound (a-4) dissolved in a xylene solvent at a concentration of 1.2% by mass in a mass ratio of 98:2 was used in place of the light emitting material 1 in Example 1. In the light emitting material 3, x was 0.52, and y was 0.87. $\log_{10}(5.1 \times x^{0.2}+1)$ was 0.738.

A voltage was applied to the obtained organic EL device, and EL light emission having a peak at a wavelength of 455 nm, which originated in the blue light emitting compound (a-4), was resultantly obtained. The device started to emit light at 3.0 V, showed a light emission of 1000 cd/m² at 4.7 V, and had a maximum light emitting efficiency of 2.99 cd/A.

A current value was set so that the organic EL device obtained as described above had an initial luminance of 100 cd/m², the device was then driven at a constant current, and a change in luminance with time was measured. As a result, luminance decreased by half after 319 hours.

Example 4

An organic EL device was prepared in the same manner as in Example 1, except that a light emitting material 4 prepared by mixing a solution of the conjugated polymer (b-1) dissolved in a xylene solvent at a concentration of 1.2% by mass and a solution of the blue light emitting compound (a-4) dissolved in a xylene solvent at a concentration of 1.2% by mass in a mass ratio of 97:3 was used in place of the light emitting material 1 in Example 1. In the light emitting material 4, x was 0.79, and y was 0.91. $\log_{10}(5.1 \times x^{0.2}+1)$ was 0.768.

A voltage was applied to the obtained organic EL device, and EL light emission having a peak at a wavelength of 455 nm, which originated in the blue light emitting compound (a-4), was resultantly obtained. The device started to emit light at 3.0 V, showed a light emission of 1000 cd/m² at 4.5 V, and had a maximum light emitting efficiency of 2.79 cd/A.

A current value was set so that the organic EL device obtained as described above had an initial luminance of 100 cd/m², the device was then driven at a constant current, and a change in luminance with time was measured. As a result, luminance decreased by half after 477 hours.

Example 5

An organic EL device was prepared in the same manner as in Example 1, except that a light emitting material 5 prepared by mixing a solution of the conjugated polymer (b-1) dissolved in a xylene solvent at a concentration of 1.2% by mass and a solution of the blue light emitting compound (a-4) dissolved in a xylene solvent at a concentration of 1.2% by mass in a mass ratio of 94:6 was used in place of the light emitting material 1 in Example 1. In the light emitting material 5, x was 1.58, and y was 0.97. $\log_{10}(5.1 \times x^{0.2}+1)$ was 0.819.

A voltage was applied to the obtained organic EL device, and EL light emission having a peak at a wavelength of 455 nm, which originated in the blue light emitting compound (a-4), was resultantly obtained. The device started to emit light at 3.1 V, showed a light emission of 1000 cd/m² at 5.1 V, and had a maximum light emitting efficiency of 2.14 cd/A.

A current value was set so that the organic EL device obtained as described above had an initial luminance of 100 cd/m², the device was then driven at a constant current, and a change in luminance with time was measured. As a result, luminance decreased by half after 840 hours.

Example 6

An organic EL device was prepared in the same manner as in Example 1, except that a light emitting material 6 prepared by mixing a solution of the conjugated polymer (b-1) dissolved in a xylene solvent at a concentration of 1.2% by mass and a solution of the blue light emitting compound (a-5) dissolved in a xylene solvent at a concentration of 1.2% by mass in a mass ratio of 97:3 was used in place of the light emitting material 1 in Example 1. In the light emitting material 6, x was 0.66, and y was 0.80. $\log_{10}(5.1 \times x^{0.2}+1)$ was 0.755.

A voltage was applied to the obtained organic EL device, and EL light emission having a peak at a wavelength of 460 nm, which originated in the blue light emitting compound (a-5), was resultantly obtained. The device started to emit light at 3.0 V, showed a light emission of 1000 cd/m² at 5.6 V, and had a maximum light emitting efficiency of 2.93 cd/A.

A current value was set so that the organic EL device obtained as described above had an initial luminance of 100 cd/m², the device was then driven at a constant current, and a change in luminance with time was measured. As a result, luminance decreased by half after 776 hours.

Example 7

An organic EL device was prepared in the same manner as in Example 1, except that a light emitting material 13 prepared by mixing a solution of the conjugated polymer (b-1) dissolved in a xylene solvent at a concentration of 1.2% by mass and a solution of the blue light emitting compound (a-9) dissolved in a xylene solvent at a concentration of 1.2% by mass in a mass ratio of 95:5 was used in place of the light emitting material 1 in Example 1. In the light emitting material 13, x was 3.31, and y was 0.98. $\log_{10}(5.1 \times x^{0.2}+1)$ was 0.874.

A voltage was applied to the obtained organic EL device, and EL light emission having a peak at a wavelength of 460 nm, which originated in the blue light emitting compound (a-9), was resultantly obtained. The device started to emit light at 3.0 V, showed a light emission of 1000 cd/m² at 5.3 V, and had a maximum light emitting efficiency of 2.09 cd/A.

A current value was set so that the organic EL device obtained as described above had an initial luminance of 100 cd/m², the device was then driven at a constant current, and a change in luminance with time was measured. As a result, luminance decreased by half after 145 hours.

Comparative Example 1

An organic EL device was prepared in the same manner as in Example 1, except that a light emitting material 7 prepared by mixing a solution of the conjugated polymer (b-1) dissolved in a xylene solvent at a concentration of 1.2% by mass and a solution of the blue light emitting compound (a-2) dissolved in a xylene solvent at a concentration of 1.2% by mass in a mass ratio of 99:1 was used in place of the light emitting material 1 in Example 1. In the light emitting material 7, x was 0.16, and y was 0.39. $\log_{10}(5.1 \times x^{0.2}+1)$ was 0.657.

A voltage was applied to the obtained organic EL device, and EL light emission having a peak at a wavelength of 450 nm, which originated in the blue light emitting compound (a-2), was resultantly obtained. The device started to emit light at 3.0 V, showed a light emission of 1000 cd/m² at 5.1 V, and had a maximum light emitting efficiency of 1.69 cd/A.

A current value was set so that the organic EL device obtained as described above had an initial luminance of 100 cd/m², the device was then driven at a constant current, and a change in luminance with time was measured. As a result, luminance decreased by half after 17.2 hours.

Comparative Example 2

An organic EL device was prepared in the same manner as in Example 1, except that a light emitting material 8 prepared by mixing a solution of the conjugated polymer (b-1) dissolved in a xylene solvent at a concentration of 1.2% by mass and a solution of the blue light emitting compound (a-1) dissolved in a xylene solvent at a concentration of 1.2% by mass in a mass ratio of 99:1 was used in place of the light emitting material 1 in Example 1. In the light emitting material 8, x was 0.14, and y was 0.39. $\log_{10}(5.1 \times x^{0.2}+1)$ was 0.648.

A voltage was applied to the obtained organic EL device, and EL light emission having a peak at a wavelength of 460 nm, which originated in the blue light emitting compound (a-1), was resultantly obtained. The device started to emit light at 3.0 V, showed a light emission of 1000 cd/m² at 4.9 V, and had a maximum light emitting efficiency of 1.49 cd/A.

A current value was set so that the organic EL device obtained as described above had an initial luminance of 100 cd/m², the device was then driven at a constant current, and a change in luminance with time was measured. As a result, luminance decreased by half after 9.8 hours.

Comparative Example 3

An organic EL device was prepared in the same manner as in Example 1, except that a light emitting material 9 prepared by mixing a solution of the conjugated polymer (b-1) dissolved in a xylene solvent at a concentration of 1.2% by mass and a solution of the blue light emitting compound (a-1) dissolved in a xylene solvent at a concentration of 1.2% by mass in a mass ratio of 97:3 was used in place of the light emitting material 1 in Example 1. In the light emitting material 9, x was 0.43, and y was 0.69. $\log_{10}(5.1 \times x^{0.2}+1)$ was 0.725.

A voltage was applied to the obtained organic EL device, and EL light emission having a peak at a wavelength of 460 nm, which originated in the blue light emitting compound (a-1), was resultantly obtained. The device started to emit light at 3.0 V, showed a light emission of 1000 cd/m² at 5.1 V, and had a maximum light emitting efficiency of 2.15 cd/A.

A current value was set so that the organic EL device obtained as described above had an initial luminance of 100 cd/m², the device was then driven at a constant current, and a change in luminance with time was measured. As a result, luminance decreased by half after 37.9 hours.

Comparative Example 4

An organic EL device was prepared in the same manner as in Example 1, except that a light emitting material 10 prepared by mixing a solution of the conjugated polymer (b-1) dissolved in a xylene solvent at a concentration of 1.2% by mass and a solution of the blue light emitting compound (a-6) dissolved in a xylene solvent at a concentration of 1.2% by mass in a mass ratio of 98:2 was used in place of the light emitting material 1 in Example 1. In the light emitting material 10, x was 0.34, and y was 0.60. $\log_{10}(5.1 \times x^{0.2}+1)$ was 0.708.

A voltage was applied to the obtained organic EL device, and EL light emission having a peak at a wavelength of 447 nm, which originated in the blue light emitting compound (a-6), was resultantly obtained. The device started to emit light at 2.9 V, showed a light emission of 1000 cd/m² at 4.9 V, and had a maximum light emitting efficiency of 1.68 cd/A.

A current value was set so that the organic EL device obtained as described above had an initial luminance of 100 cd/m², the device was then driven at a constant current, and a change in luminance with time was measured. As a result, luminance decreased by half after 23.1 hours.

Comparative Example 5

An organic EL device was prepared in the same manner as in Example 1, except that a light emitting material 11 prepared by mixing a solution of the conjugated polymer (b-1) dissolved in a xylene solvent at a concentration of 1.2% by mass and a solution of the blue light emitting compound (a-6) dissolved in a xylene solvent at a concentration of 1.2% by mass in a mass ratio of 99:1 was used in place of the light emitting material 1 in Example 1. In the light emitting material 11, x was 0.17, and y was 0.42. $\log^{10}(5.1 \times x^{0.2}+1)$ was 0.661.

A voltage was applied to the obtained organic EL device, and EL light emission having a peak at a wavelength of 450 nm, which originated in the blue light emitting compound (a-6), was resultantly obtained. The device started to emit light at 2.9 V, showed a light emission of 1000 cd/m² at 4.9 V, and had a maximum light emitting efficiency of 1.68 cd/A.

A current value was set so that the organic EL device obtained as described above had an initial luminance of 100 cd/m², the device was then driven at a constant current, and a change in luminance with time was measured. As a result, luminance decreased by half after 18.3 hours.

Comparative Example 6

An organic EL device was prepared in the same manner as in Example 1, except that a light emitting material 12 prepared by mixing a solution of the conjugated polymer (b-1) dissolved in a xylene solvent at a concentration of 1.2% by mass and a solution of the blue light emitting compound (a-7) dissolved in a xylene solvent at a concentration of 1.2% by mass in a mass ratio of 99:1 was used in place of the light emitting material 1 in Example 1. In the light emitting material 12, x was 0.23, and y was 0.50. $\log_{10}(5.1 \times x^{0.2}+1)$ was 0.681.

A voltage was applied to the obtained organic EL device, and EL light emission having a peak at a wavelength of 445 nm, which originated in the blue light emitting compound (a-7), was resultantly obtained. The device started to emit light at 3.0 V, showed a light emission of 1000 cd/m² at 5.3 V, and had a maximum light emitting efficiency of 1.49 cd/A.

A current value was set so that the organic EL device obtained as described above had an initial luminance of 100 cd/m², the device was then driven at a constant current, and a change in luminance with time was measured. As a result, luminance decreased by half after 16.7 hours.

Comparative Example 7

An organic EL device was prepared in the same manner as in Example 1, except that a light emitting material 14 prepared by mixing a solution of the conjugated polymer (b-1) dissolved in a xylene solvent at a concentration of 1.2% by mass and a solution of the blue light emitting compound (a-8) dissolved in a xylene solvent at a concentration of 1.2% by mass in a mass ratio of 98.5:1.5 was used in place of the light emitting material 1 in Example 1. In the light emitting material 14, x was 0.25, and y was 0.54. $\log_{10}(5.1 \times x^{0.2}+1)$ was 0.686.

A voltage was applied to the obtained organic EL device, and EL light emission having a peak at a wavelength of 445 nm, which originated in the blue light emitting compound (a-8), was resultantly obtained. The device started to emit light at 2.9 V, showed a light emission of 1000 cd/m² at 4.8 V, and had a maximum light emitting efficiency of 1.92 cd/A.

A current value was set so that the organic EL device obtained as described above had an initial luminance of 100 cd/m², the device was then driven at a constant current, and a change in luminance with time was measured. As a result, luminance decreased by half after 27.8 hours.

Comparative Example 8

An organic EL device was prepared in the same manner as in Example 1, except that a light emitting material 15 prepared by mixing a solution of the conjugated polymer (b-1) dissolved in a xylene solvent at a concentration of 1.2% by mass and a solution of the blue light emitting compound (a-9) dissolved in a xylene solvent at a concentration of 1.2% by mass in a mass ratio of 97:3 was used in place of the light emitting material 1 in Example 1. In the light emitting material 15, x was 1.99, and y was 0.828. $\log_{10}(5.1 \times x^{0.2}+1)$ was 0.836.

A voltage was applied to the obtained organic EL device, and EL light emission having a peak at a wavelength of 455 nm, which originated in the blue light emitting compound (a-9), was resultantly obtained. The device started to emit light at 3.0 V, showed a light emission of 1000 cd/m² at 5.0 V, and had a maximum light emitting efficiency of 1.67 cd/A.

A current value was set so that the organic EL device obtained as described above had an initial luminance of 100 cd/m², the device was then driven at a constant current, and a change in luminance with time was measured. As a result, luminance decreased by half after 49.1 hours.

Comparative Example 9

An organic EL device was prepared in the same manner as in Example 1, except that a light emitting material 16 prepared by mixing a solution of the conjugated polymer (b-1) dissolved in a xylene solvent at a concentration of 1.2% by mass and a solution of the blue light emitting compound (a-10) dissolved in a xylene solvent at a concentration of 1.2% by mass in a mass ratio of 98:2 was used in place of the light emitting material 1 in Example 1. In the light emitting material 16, x was 0.47, and y was 0.61. $\log_{10}(5.1 \times x^{0.2}+1)$ was 0.731.

A voltage was applied to the obtained organic EL device, and EL light emission having a peak at a wavelength of 455 nm, which originated in the blue light emitting compound (a-10), was resultantly obtained. The device started to emit light at 3.0 V, showed a light emission of 1000 cd/m² at 5.5 V, and had a maximum light emitting efficiency of 1.46 cd/A.

A current value was set so that the organic EL device obtained as described above had an initial luminance of 100 cd/m², the device was then driven at a constant current, and a change in luminance with time was measured. As a result, luminance decreased by half after 47.2 hours.

Figure 2:
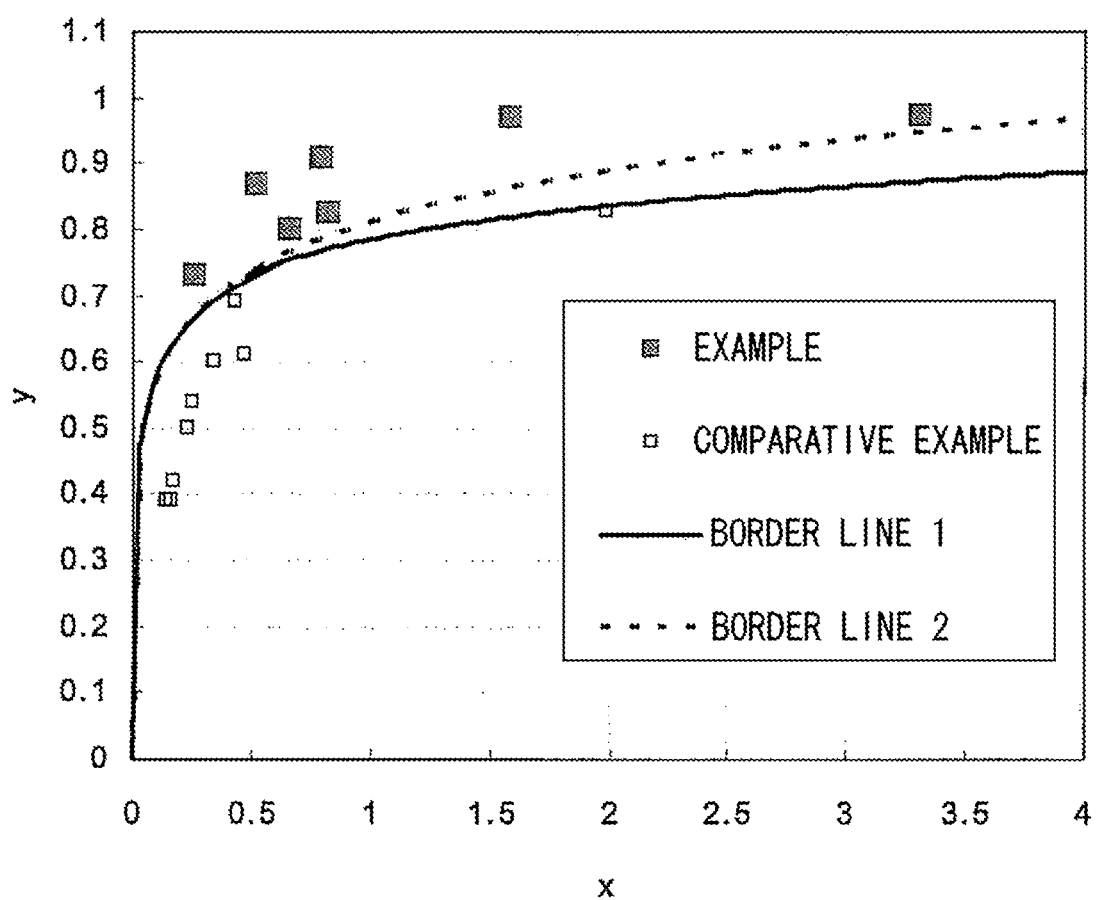
FIG. 2 is a graph showing the relationship between x and y in light emitting materials obtained in Examples 1 to 7 and Comparative Examples 1 to 9.

FIG. 2 is a view showing the relationship between x and y in light emitting materials obtained in Examples 1 to 7 and Comparative Examples 1 to 9. In FIG. 2, border line 1 shows a curve of $y = \log_{10}(5.1 \times x^{0.2}+1)$, and border line 2 shows a curve of $y = \log_{10}(5.5 \times x^{0.3}+1)$.

DESCRIPTION OF SYMBOLS 1 glass substrate
2 ITO anode
3 hole injection layer
4 hole transport layer
5 light emitting layer
6 sodium fluoride
7 aluminum
8 cathode

The invention claimed is:

1. A light emitting material, wherein the material comprises a conjugated polymer having a conjugated part and a blue light emitting compound having a blue light emitting part and satisfies the following formula (I):

[Mathematical Formula 1]

$$y \geq \log_{10}(5.1 \times x^{0.2}+1) \quad (1)$$

wherein y represents the amount of light emitted by the blue light emitting compound where the total amount of light emitted by the conjugated polymer and the blue light emitting compound in the light emitting material due to excitation caused by light having a wavelength of 370 nm is 1, and provided that the gram light absorption coefficient of the conjugated polymer and the blue light emitting compound in the light emitting material are expressed by $\epsilon_1$ and $\epsilon_2$, and further the content of the blue light emitting compound is expressed by $P_2$ (parts by mass) where the total content of the conjugated polymer and the blue light emitting compound in the light emitting material is 100 parts by mass, x is defined by the formula:

[Mathematical Formula 2]

$$x = (\epsilon_2/\epsilon_1) \times P_2.$$

2. A light emitting material, wherein the material comprises a conjugated polymer having a conjugated part and a blue light emitting part and satisfies the following formula (I):

[Mathematical Formula 3]

$$y \geq \log_{10}(5.1 \times x^{0.2}+1) \quad (1)$$

wherein y represents the amount of light emitted by the blue light emitting part where the total amount of light emitted by the conjugated part and the blue light emitting part in the light emitting material due to excitation caused by light having a wavelength of 370 nm is 1, and provided that the gram light absorption coefficient of the conjugated part and the blue light emitting part in the light emitting material are expressed by $\epsilon_1$ and $\epsilon_2$, and further the content of the blue light emitting part is expressed by $P_2$ (parts by mass) where the total content of the conjugated part and the blue light emitting part in the light emitting material is 100 parts by mass, x is defined by the formula:

[Mathematical Formula 4]

$$x=(\epsilon_2/\epsilon_1) \times P_2.$$

3. The light emitting material according to claim 1, wherein y is 0.7 or more.

4. The light emitting material according to claim 1, wherein x is 1.0 or less.

5. The light emitting material according to claim 1, wherein the conjugated part is a bivalent aromatic amine residue.

6. The light emitting material according to claim 1, wherein the conjugated part is a fluorenediyl group.

7. The light emitting material according to claim 1, wherein the blue light emitting compound has a molecular weight of 5000 or less.

8. The light emitting material according to claim 1, wherein the blue light emitting part has a fused polycyclic aromatic hydrocarbon structure.

9. The light emitting material according to claim 1, wherein the content ratio of the blue light emitting part to the total content of the conjugated part and the blue light emitting part is 0.1 to 10% by mass.

10. The light emitting material according to claim 1, wherein the relationship between the peak wavelength ($\lambda_1$) of a light emission peak at the shortest wavelength side among light emission peaks in a wavelength range of 350 nm to 500 nm of the conjugated polymer and the peak wavelength ($\lambda_2$) of a light emission peak at the shortest wavelength side among light emission peaks in a wavelength range of 350 nm to 500 nm of the blue light emitting compound meets $\lambda_2-\lambda_1 \leq 50$ nm.

11. An ink composition comprising the light emitting material according to claim 1.

12. A thin film characterized by being made of the light emitting material according to claim 1.

13. A light emitting device that is a white light emitting device in which a plurality of light emitting layers including a blue light emitting layer are laminated, wherein the device comprises as the blue light emitting layer a light emitting layer made of the thin film according to claim 12.

14. A method for manufacturing a light emitting device with an improved luminous lifetime, wherein the method comprises making a light emitting layer in the light emitting device to contain a light emitting material that comprises a conjugated polymer having a conjugated part and a blue light emitting compound having a blue light emitting part and satisfies the following formula (1):

[Mathematical Formula 5]

$$y \geq \log_{10}(5.1 \times x^{0.2}+1) \qquad (1)$$

wherein y represents the amount of light emitted by the blue light emitting compound where the total amount of light emitted by the conjugated polymer and the blue light emitting compound in the light emitting material due to excitation caused by light having a wavelength of 370 nm is 1, and provided that the gram light absorption coefficient of the conjugated polymer and the blue light emitting compound in the light emitting material are expressed by $\epsilon_1$ and $\epsilon_2$, and further the content of the blue light emitting compound is expressed by $P_2$ (parts by mass) where the total content of the conjugated polymer and the blue light emitting compound in the light emitting material is 100 parts by mass, x is defined by the formula:

[Mathematical Formula 6]

$$x=(\epsilon_2/\epsilon_1) \times P_2.$$

* * * * *